(12) United States Patent
Mohan et al.

(10) Patent No.: US 8,686,722 B2
(45) Date of Patent: Apr. 1, 2014

(54) SEMICONDUCTOR FLUXGATE MAGNETOMETER

(75) Inventors: Anuraag Mohan, Fremont, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 430 days.

(21) Appl. No.: 13/218,772

(22) Filed: Aug. 26, 2011

(65) Prior Publication Data

US 2013/0049749 A1    Feb. 28, 2013

(51) Int. Cl.
*G01R 33/04* (2006.01)

(52) U.S. Cl.
CPC ...................................... *G01R 33/04* (2013.01)
USPC ........................................................ 324/253

(58) Field of Classification Search
USPC ................................. 324/252–253
See application file for complete search history.

(56) References Cited

U.S. PATENT DOCUMENTS

| | | | |
|---|---|---|---|
| 7,015,691 B2 * | 3/2006 | Kang et al. | 324/253 |
| 7,842,544 B2 | 11/2010 | Smeys et al. | |
| 7,843,056 B2 | 11/2010 | Smeys et al. | |
| 7,898,068 B2 | 3/2011 | Smeys et al. | |
| 7,901,981 B2 | 3/2011 | Smeys et al. | |
| 7,901,984 B2 | 3/2011 | Smeys et al. | |
| 7,902,661 B2 | 3/2011 | Smeys et al. | |
| 7,936,246 B2 | 5/2011 | Hopper et al. | |
| 8,610,427 B2 * | 12/2013 | Honkura et al. | 324/244 |
| 2007/0075819 A1 * | 4/2007 | Okuzawa et al. | 336/200 |
| 2010/0182003 A1 * | 7/2010 | Sasaki et al. | 324/252 |
| 2011/0310579 A1 * | 12/2011 | Smeys et al. | 361/782 |
| 2013/0134970 A1 * | 5/2013 | Schuhl et al. | 324/252 |

OTHER PUBLICATIONS

U.S. Appl. No. 13/013,563, filed Jan. 25, 2011 to Peter Smeys et al.
Ripka, P. et al., "Micro-fluxgate sensor with closed core", Sensors and Actuators A, 91, 2001, pp. 65-69.
Chiesi, L. et al., "CMOS planar 2D micro-fluxgate sensor", Sensors and Actuators, 82, 2000, pp. 174-180.
U.S. Appl. No. 13/218,682, filed Aug. 26, 2011 to Ann Gabrys et al.

* cited by examiner

*Primary Examiner* — Jay Patidar
(74) *Attorney, Agent, or Firm* — Eugene C. Conser; Wade J. Brady, III; Frederick J. Telecky, Jr.

(57) ABSTRACT

A fluxgate magnetometer is formed in a semiconductor wafer fabrication sequence, which significantly reduces the size and cost of the fluxgate magnetometer. The semiconductor wafer fabrication sequence attaches a die, which has drive and sense circuits, to the bottom surface of a cavity formed in a larger structure, and forms drive and sense coils around a magnetic core structure on the top surface of the larger structure.

20 Claims, 60 Drawing Sheets

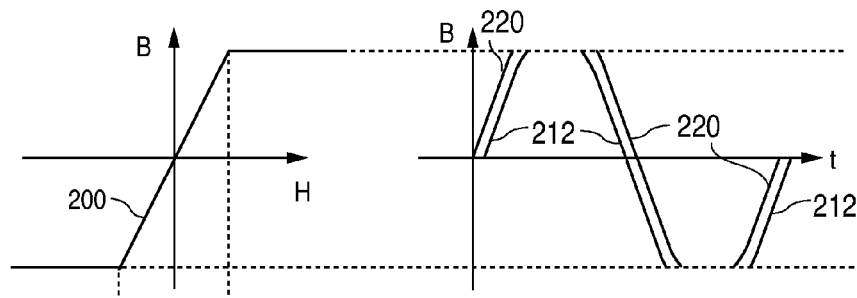
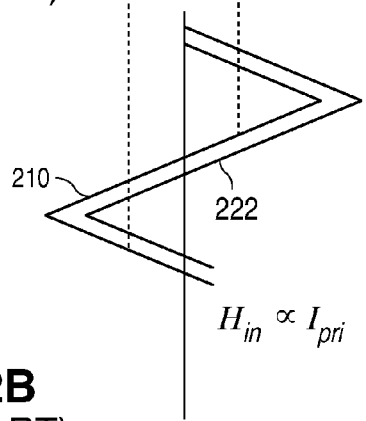
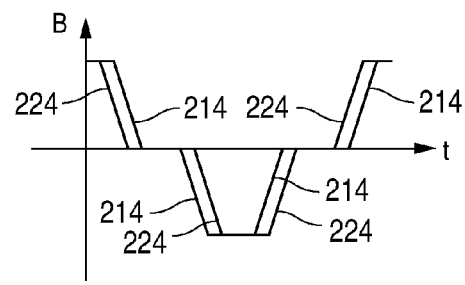
FIG. 2A
(PRIOR ART)
FIG. 2C
(PRIOR ART)
FIG. 2B
(PRIOR ART)
FIG. 2D
(PRIOR ART)
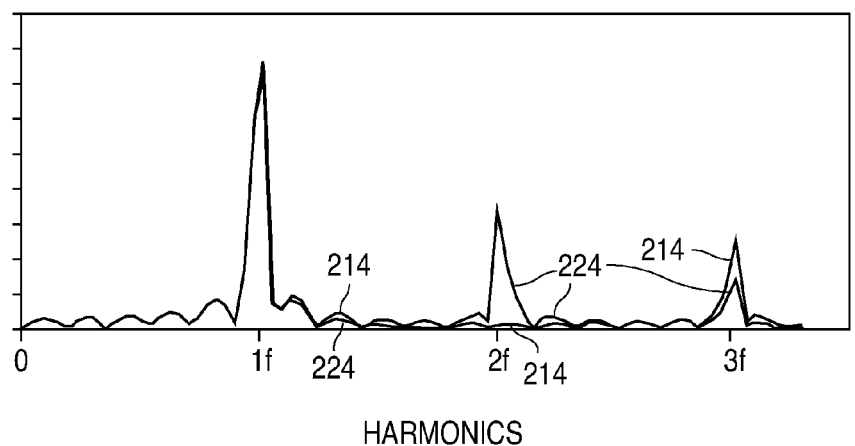
HARMONICS
FIG. 2E
(PRIOR ART)

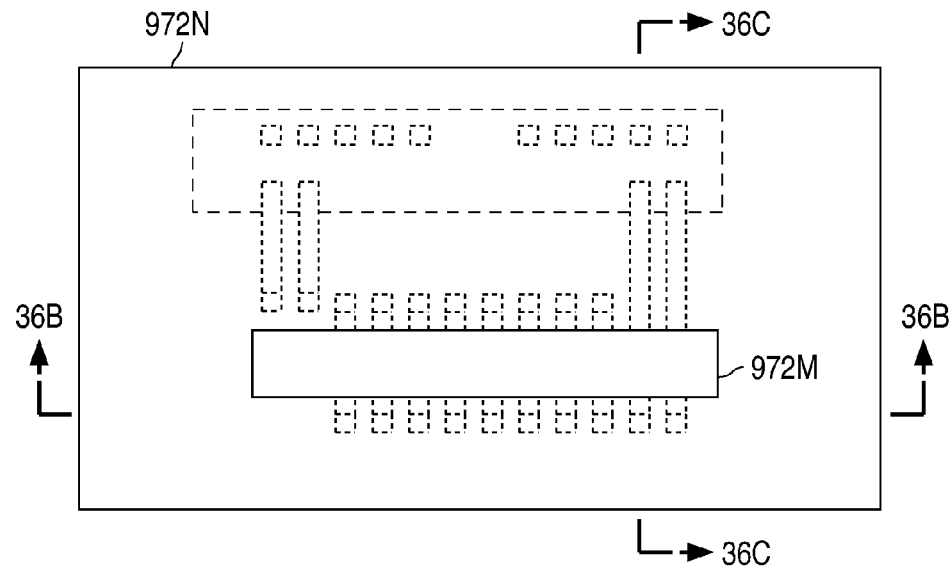
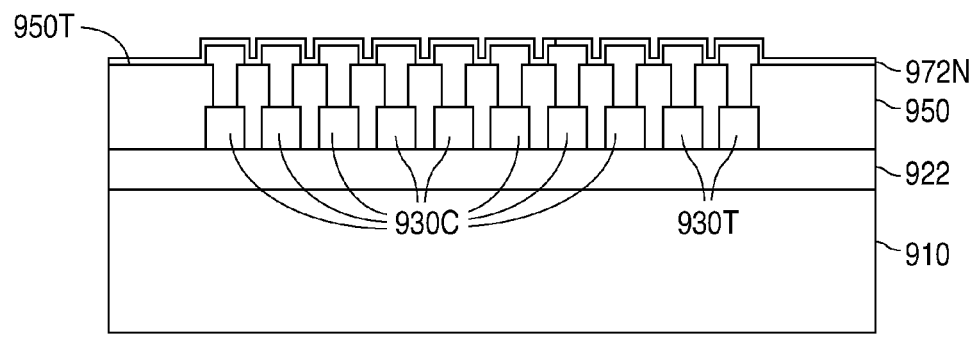
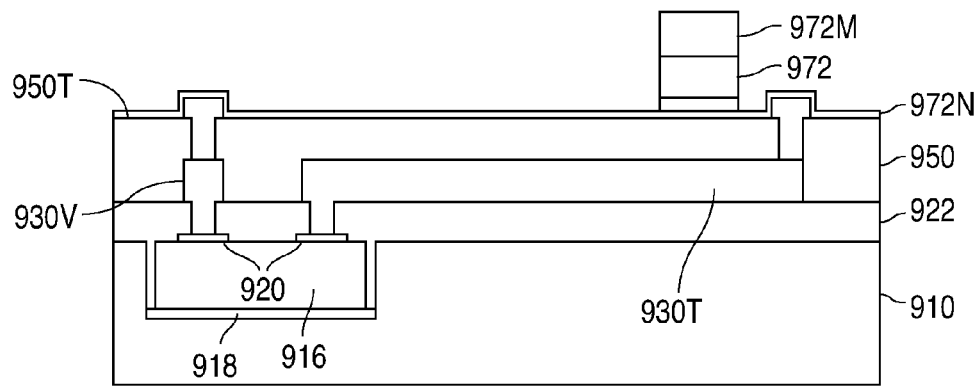

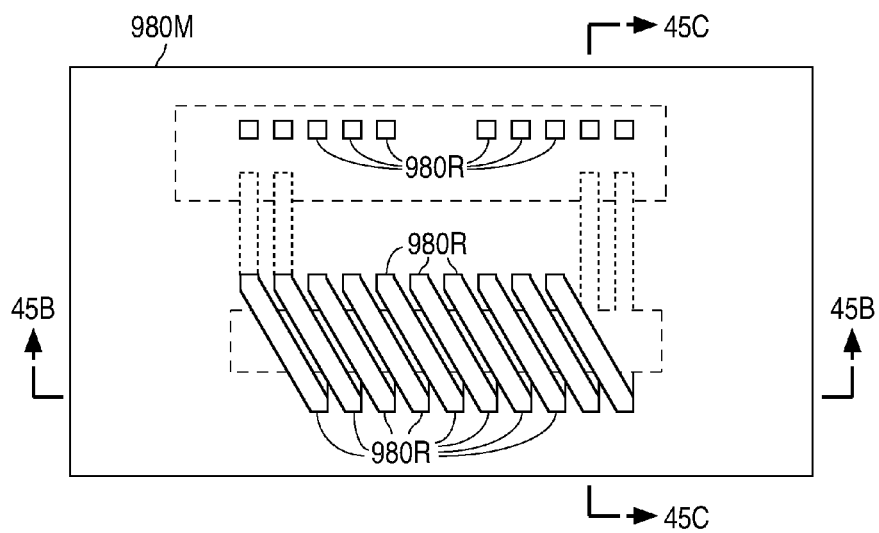
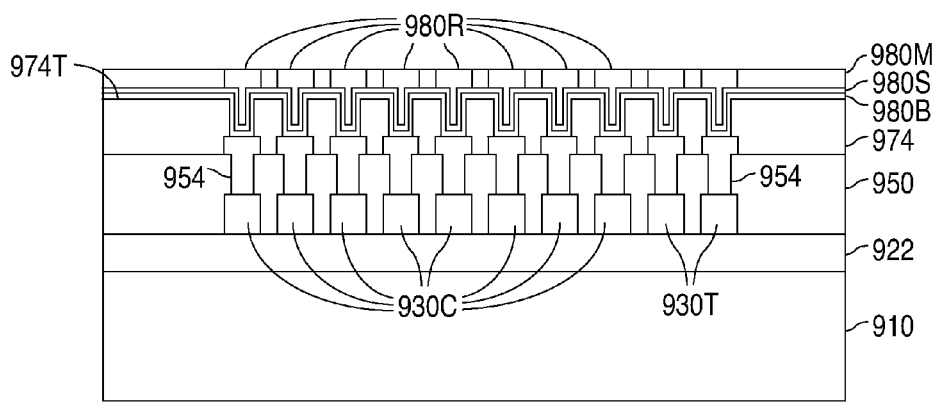
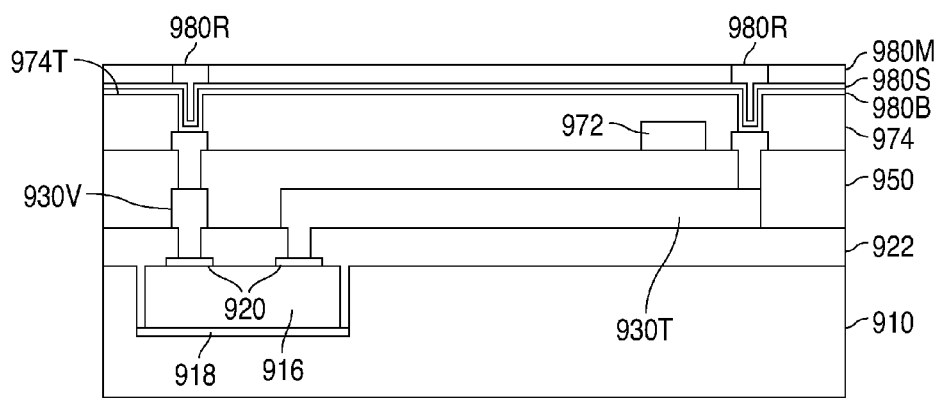

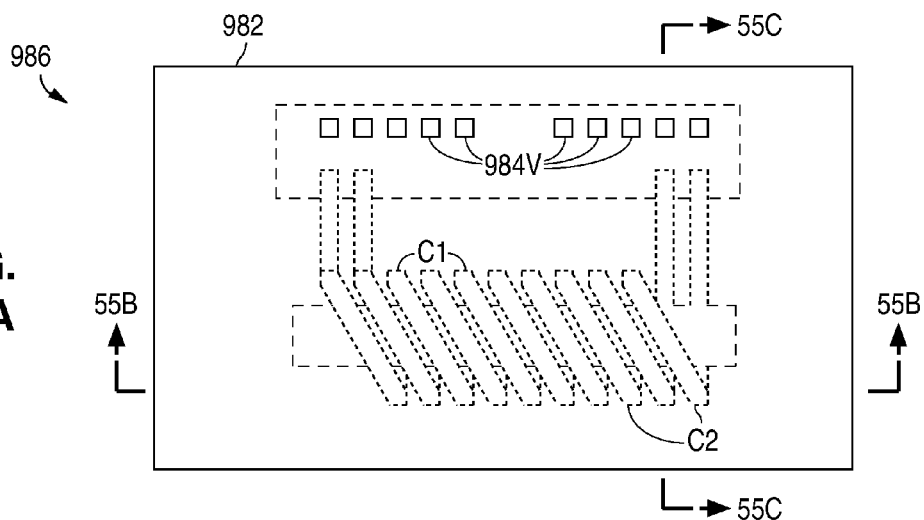
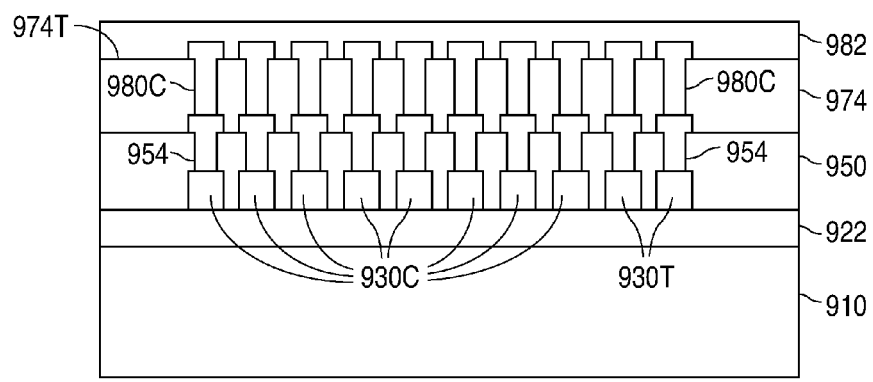
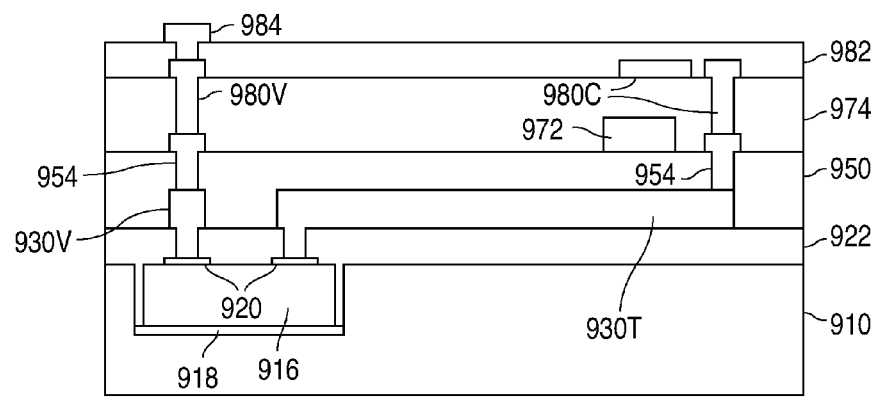

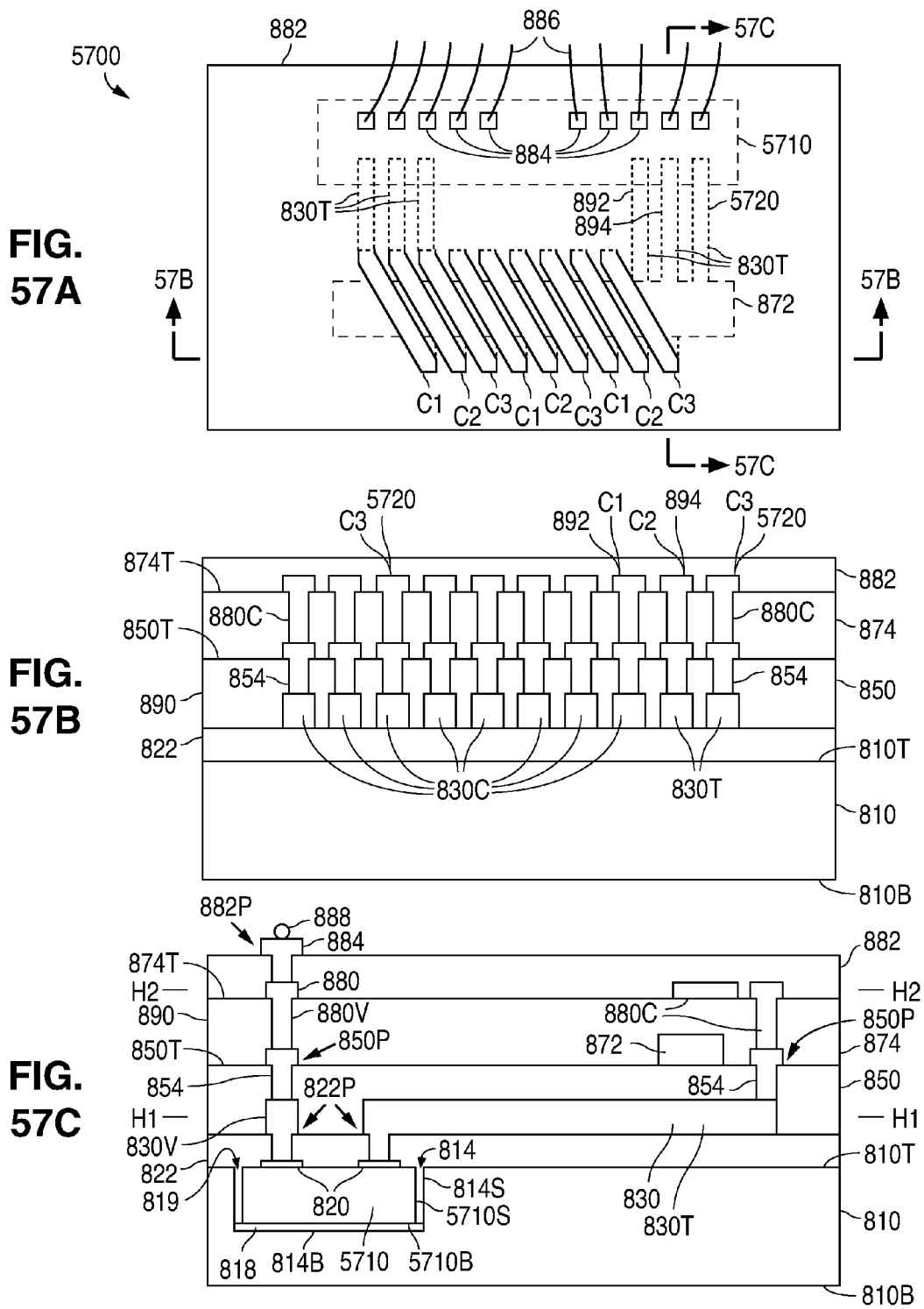

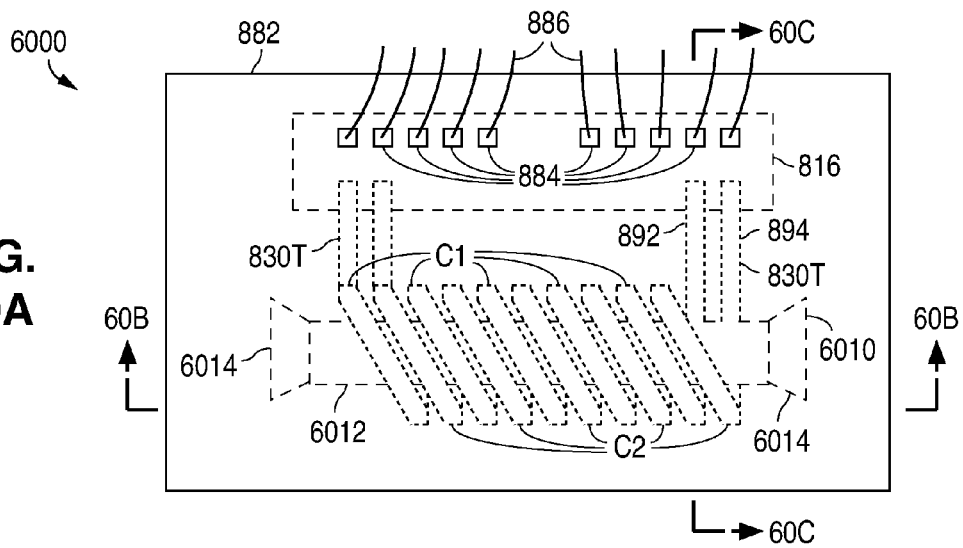
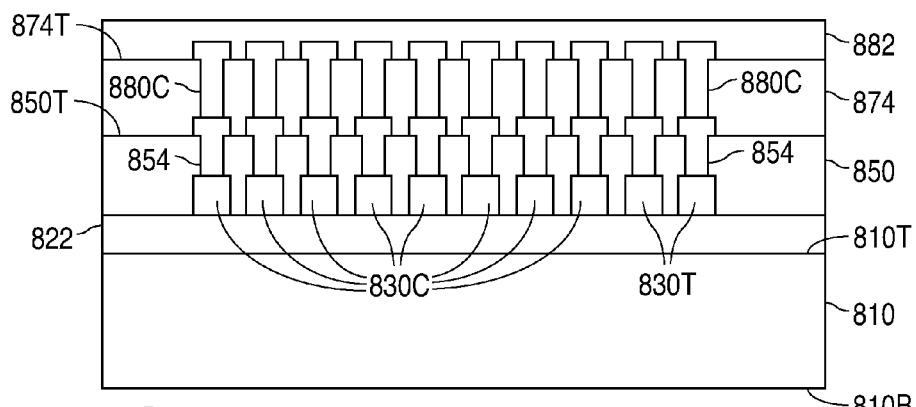
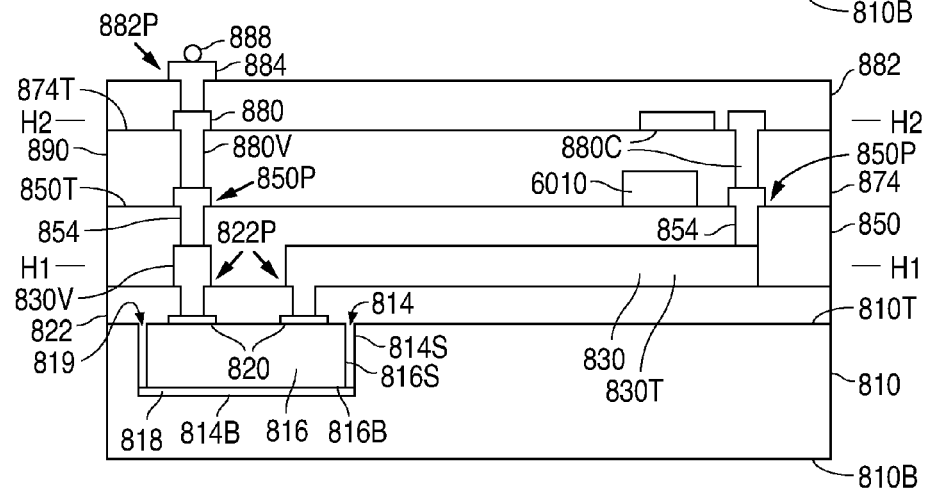

SEMICONDUCTOR FLUXGATE MAGNETOMETER

BACKGROUND OF THE INVENTION

1. Field of the Invention

The present invention relates to fluxgates and, more particularly, to a semiconductor fluxgate magnetometer.

2. Description of the Related Art

A magnetometer is a device that measures the strength of an external magnetic field. There are a number of different approaches to measuring magnetic fields, and various different types of magnetometers have been developed based on these different approaches. One type of magnetometer based on flux variations in a magnetic core is a fluxgate magnetometer.

FIG. 1 shows a block diagram that illustrates an example of a prior art fluxgate magnetometer 100. As shown in FIG. 1, fluxgate magnetometer 100 includes a drive coil 110, a sense coil 112, and a magnetic core structure 114 that lies within drive coil 110 and sense coil 112.

As further shown in FIG. 1, fluxgate magnetometer 100 also includes a drive circuit 120 that is connected to drive coil 110, and an sense circuit 122 that is connected to sense coil 112 and drive circuit 120. Sense circuit 122 generates an output voltage $V_{OUT}$ that is proportional to the magnitude of an external magnetic field.

FIGS. 2A-2E show views that illustrate the operation of fluxgate magnetometer 100. FIG. 2A shows a graph that illustrates a BH curve 200 for magnetic core structure 114, while FIG. 2B shows a graph that illustrates an alternating current input to drive coil 110, FIG. 2C shows a graph that illustrates the magnetic induction field B that results from the alternating current input to drive coil 110, FIG. 2D shows a graph that illustrates an induced voltage in sense coil 112 plotted in the time domain that results from the magnetic induction field B, and FIG. 2E shows a graph that illustrates the induced voltage in sense coil 112 plotted in the frequency domain that results from the magnetic induction field B.

As shown by BH curve 200 in FIG. 2A, when the magnitude of a magnetic field H increases, magnetic core structure 114 increases the magnitude of the magnetic induction field B until magnetic core structure 114 saturates. Once in saturation, further increases in the magnitude of the magnetic field H lead to very little increase in the magnitude of the magnetic induction field B.

As a result, saturation is commonly illustrated as in FIG. 2A as the region where increases in the magnitude of the magnetic field H lead to no additional increase in the magnitude of the magnetic induction field B. In the present example, the magnitude of the magnetic field H is increased by increasing the magnitude of the alternating current flowing through drive coil 110.

As shown in FIGS. 2A-2C, when no external magnetic field is present and an alternating current waveform 210, which has an amplitude that is sufficient to drive magnetic core structure 114 into saturation, is input to drive coil 110 from drive circuit 120, an alternating magnetic induction field B, as represented by waveform 212, is generated in response.

In other words, when alternating current waveform 210 is input to drive coil 110, magnetic core structure 114 is driven through cycles (magnetized, un-magnetized, inversely magnetized, un-magnetized, magnetized again, and so on) that generate an alternating magnetic induction field B as represented by waveform 212. In the present example, the alternating current waveform 210 is triangular, while the magnetic induction field waveform 212 has flat tops and bottoms that represent the periods of saturation.

As shown in FIG. 2D, the alternating magnetic induction field B induces an alternating voltage 214 in sense coil 112. The induced alternating voltage 214 is proportional to the change in the magnetic induction field B over time (dB/dt). In addition, the induced alternating voltage 214 is processed by sense circuit 122 to generate the output voltage $V_{OUT}$, which is proportional to the external magnetic field.

As shown in FIG. 2E, in the frequency domain, the induced alternating voltage 214 has a fundamental frequency $1f$, but only odd harmonics, such as a third harmonic $3f$, of the fundamental frequency $1f$. As a result, when no external magnetic field is present, the induced alternating voltage 214 has no second harmonic.

However, when an external magnetic field is present, the external magnetic field interacts with magnetic core structure 114 and changes the alternating magnetic induction field B. In other words, magnetic core structure 114 is more easily saturated when magnetic core structure 114 is in alignment with the external magnetic field, and less easily saturated when magnetic core structure 114 is in opposition to the external magnetic field.

In the present example, as shown by waveform 220 in FIG. 2C, alignment to the external magnetic field increases the duration of the positive magnetic induction field B and decreases the duration of the negative magnetic induction field B. As a result, as shown by waveform 222 in FIG. 2B, the external magnetic field has the effect of shifting alternating current waveform 210 to the right.

In other words, when no external magnetic field is present, each half cycle of the waveform 210 drives magnetic core structure 114 into positive and negative saturation by substantially an equal amount. However, when exposed to an external magnetic field, as illustrated by the waveform 222, the external magnetic field causes one half-cycle of the waveform 222 to drive magnetic core structure 114 more deeply into saturation, and one half-cycle of the waveform 222 to drive magnetic core structure 114 less deeply into saturation.

In addition, as shown in FIG. 2D, the change in the alternating magnetic induction field B phase shifts the induced alternating voltage 214 to generate a phase-shifted induced alternating voltage 224. Further, as shown in FIG. 2E, in the frequency domain, the phase-shifted induced alternating voltage 224 that results from the external magnetic field includes even harmonics, specifically a second harmonic $2f$.

The magnitude of the second harmonic $2f$, in turn, is proportional to the magnitude of the external magnetic field. Thus, by filtering the phase-shifted induced alternating voltage 224 to isolate the second harmonic $2f$, and then detecting the magnitude of the second harmonic $2f$, the magnitude of the external magnetic field can be determined.

FIG. 3 shows a block diagram that illustrates an example of a prior art fluxgate magnetometer 300. Fluxgate magnetometer 300 is similar to fluxgate magnetometer 100 and, as a result, utilizes the same reference numerals to designate the structures which are common to both fluxgate magnetometers.

As shown in FIG. 3, fluxgate magnetometer 300 differs from fluxgate magnetometer 100 in that fluxgate magnetometer 300 includes a feedback coil 310 that is wrapped around magnetic core structure 114 along with drive coil 110 and sense coil 112, and a feedback circuit 312 that is connected to feedback coil 310 and sense circuit 122. Feedback circuit 312 generates an output voltage $V_{CAN}$ that has an amplitude which is proportional to the magnitude of an external magnetic field.

Fluxgate magnetometer 300 operates the same as fluxgate magnetometer 100, except that feedback coil 310 and feedback circuit 312 are utilized to generate a magnetic field that opposes the external magnetic field. FIG. 2C shows that alignment to the external magnetic field increases the duration of the positive magnetic induction field B and decreases the duration of the negative magnetic induction field B.

In addition, as the strength of the external magnetic field increases, the duration of the positive magnetic induction field B increases while the duration of the negative magnetic induction field B decreases. Thus, as the strength of an external magnetic field increases, the duration of the negative induction field B decreases until the fluxgate magnetometer reaches saturation where there is substantially no negative magnetic induction field B. Once the fluxgate magnetometer saturates, further increases in the strength of the external magnetic field can not be detected by the fluxgate magnetometer.

To prevent a strong external magnetic field from saturating a fluxgate magnetometer, the alternating current input to feedback coil 310 is selected to generate a magnetic field that cancels out the external magnetic field, and effectively make the output voltage $V_{OUT}$ appear as though no external magnetic field were present.

The magnitude of the alternating current input to feedback coil 310 when the output voltage $V_{OUT}$ appears as though no external magnetic field were present can then be used to generate the output voltage $V_{CAN}$. Since the amplitude of the output voltage $V_{CAN}$ is proportional to the magnitude of the external magnetic field, the magnitude of the external magnetic field can then be determined. Thus, the advantage of fluxgate magnetometer 300 is that fluxgate magnetometer 300 can be used in very strong magnetic fields.

FIG. 4 shows a block diagram that illustrates an example of a prior art fluxgate magnetometer 400. As shown in FIG. 4, fluxgate magnetometer 400 includes a drive coil 410, a sense coil 412, and a pair of magnetic core structures 414 and 416 that lie within drive coil 410 and sense coil 412.

As further shown in FIG. 4, fluxgate magnetometer 400 also includes a drive circuit 420 that is connected to drive coil 410, and a sense circuit 422 that is connected to sense coil 412. Sense circuit 422 generates an output voltage $V_{DIF}$ that has an amplitude which is proportional to the magnitude of an external magnetic field.

In operation, drive coil 410 is wrapped around the magnetic core structures 414 and 416 so as to generate equal and opposing alternating magnetic induction fields when drive circuit 420 outputs an alternating current to drive coil 410. Thus, when no external magnetic field is present, no voltage is induced in sense coil 412 because no alternating magnetic induction field is present.

FIG. 5 shows a graph that further illustrates the operation of fluxgate magnetometer 400. As shown in FIG. 5, although no current is induced in sense coil 412 when no external magnetic field is present, the presence of an external magnetic field induces an alternating voltage in sense coil 412.

Sense circuit 422 detects the induced alternating voltage in sense coil 412 and generates in response the output voltage $V_{DIF}$, which has an amplitude that is proportional to the magnitude of the external magnetic field. Thus, by detecting the amplitude of the output voltage $V_{DIF}$, the magnitude of the external magnetic field can be determined.

One of the advantages of fluxgate magnetometer 400 over fluxgate magnetometer 100 is that fluxgate magnetometer 400 requires less support circuitry than fluxgate magnetometer 100. For example, drive circuit 120 commonly generates a second harmonic clock signal which drive circuit 410 need not generate. The second harmonic clock signal, which has a frequency that is equal to the second harmonic of the fundamental frequency of the clock signal used to input current to drive coil, is typically required by sense circuit 122.

FIG. 6 shows a block diagram that illustrates an example of a prior art fluxgate magnetometer 600. Fluxgate magnetometer 600 is similar to fluxgate magnetometer 100 and, as a result, utilizes the same reference numerals to designate the structures which are common to both fluxgate magnetometers.

As shown in FIG. 6, fluxgate magnetometer 600 differs from fluxgate magnetometer 100 in that fluxgate magnetometer 600 utilizes a magnetic core structure 610 in lieu of magnetic core structure 114. Magnetic core structure 610 differs from magnetic core structure 114 in that magnetic core structure 610 has flared ends. Fluxgate magnetometer 600 operates the same as fluxgate magnetometer 100 except that the flared ends of magnetic core structure 610 capture additional flux and channel the additional flux into the body of magnetic core structure 610, thereby functioning as a flux concentrator.

FIG. 7 shows a block diagram that illustrates an example of a prior art fluxgate magnetometer 700. Fluxgate magnetometer 700 is similar to fluxgate magnetometer 100 and, as a result, utilizes the same reference numerals to designate the structures which are common to both fluxgate magnetometers.

As shown in FIG. 7, fluxgate magnetometer 700 differs from fluxgate magnetometer 100 in that fluxgate magnetometer 700 utilizes a magnetic core structure 710 in lieu of magnetic core structure 114. Magnetic core structure 710 differs from magnetic core structure 114 in that magnetic core structure 710 has a narrow center section. In addition, fluxgate magnetometer 700 differs from fluxgate magnetometer 100 in that sense coil 112 of fluxgate magnetometer 700 is only wrapped around the narrow center section of magnetic core structure 710.

Fluxgate magnetometer 700 operates the same as fluxgate magnetometer 100 except that the narrow section of magnetic core structure 710 saturates faster than the remaining sections of magnetic core structure 710. As a result, less current is required to saturate the section of magnetic core structure 710 that is wrapped by sense coil 112.

Although the fluxgate magnetometers 100, 300, 400, 600, and 700 each measures the strength of an external magnetic field, the fluxgate magnetometers 100, 300, 400, 600, and 700 tend to be bulky and expensive to manufacture. Thus, there is a need for a smaller and less expensive fluxgate magnetometer.

BRIEF DESCRIPTION OF THE DRAWINGS

FIGS. 2A-2E are views illustrating the operation of fluxgate magnetometer 100. FIG. 2A is a graph illustrates a BH curve 200 for magnetic core structure 114. FIG. 2B is a graph illustrating an alternating current input to drive coil 110. FIG. 2C is a graph illustrating the magnetic induction field B that results from the alternating current input to drive coil 110. FIG. 2D is a graph illustrating an induced voltage in sense coil 112 plotted in the time domain that results from the magnetic induction field B. FIG. 2E is a graph illustrating an induced voltage in sense coil 112 plotted in the frequency domain that results from the magnetic induction field B.

FIG. 8A is a plan view. FIG. 8B is a cross-sectional view taken along line 8B-8B in FIG. 8A. FIG. 8C is a cross-sectional view taken along line 8C-8C in FIG. 8A.

FIGS. 9A-56A are a series of plan views. FIGS. 9B-56B are a series of cross-sectional views taken along lines 9B-56B, respectively, in FIGS. 9A-56A. FIGS. 9C-56C are a series of cross-sectional views taken along lines 9C-56C, respectively, in FIGS. 9A-56A.

FIGS. 57A-57C are views illustrating an example of a semiconductor fluxgate magnetometer 5700 in accordance with an alternate embodiment of the present invention. FIG. 57A is a plan view. FIG. 57B is a cross-sectional view taken along line 57B-57B in FIG. 57A. FIG. 57C is a cross-sectional view taken along line 57C-57C in FIG. 57A.

FIG. 58A is a plan view. FIG. 58B is a cross-sectional view taken along line 58B-58B in FIG. 58A. FIG. 58C is a cross-sectional view taken along line 58C-58C in FIG. 58A.

FIG. 59A is a plan view. FIG. 59B is a cross-sectional view taken along line 59B-59B in FIG. 59A. FIG. 59C is a cross-sectional view taken along line 59C-59C in FIG. 59A.

FIGS. 60A-60C are views that illustrate an example of a semiconductor fluxgate magnetometer 6000 in accordance with an alternate embodiment of the present invention. FIG. 60A is a plan view. FIG. 60B is a cross-sectional view taken along line 60B-60B in FIG. 60A. FIG. 60C is a cross-sectional view taken along line 60C-60C in FIG. 60A.

FIG. 61A is a plan view. FIG. 61B is a cross-sectional view taken along line 61B-61B in FIG. 61A. FIG. 61C is a cross-sectional view taken along line 61C-61C in FIG. 61A.

DETAILED DESCRIPTION OF THE INVENTION

Figure 1:
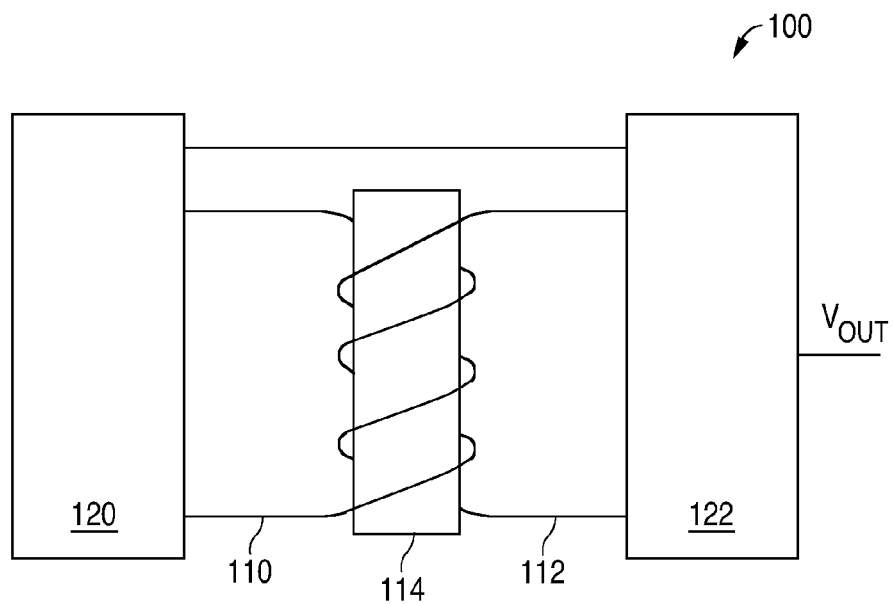
FIG. 1 is a block diagram illustrating an example of a prior art fluxgate magnetometer 100.
Figure 3:
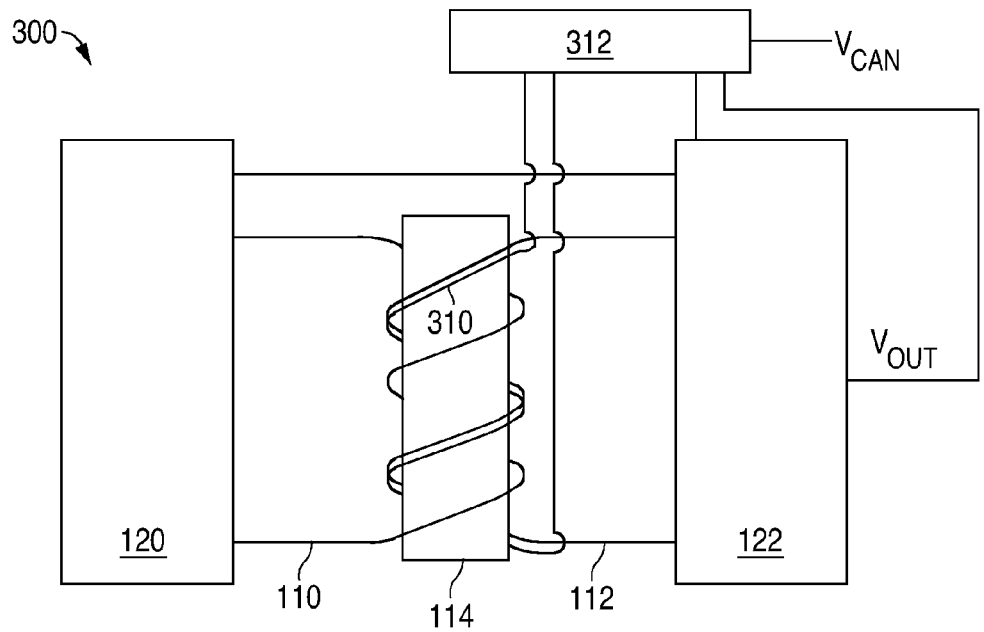
FIG. 3 is a block diagram illustrating an example of a prior art fluxgate magnetometer 300.
Figure 4:
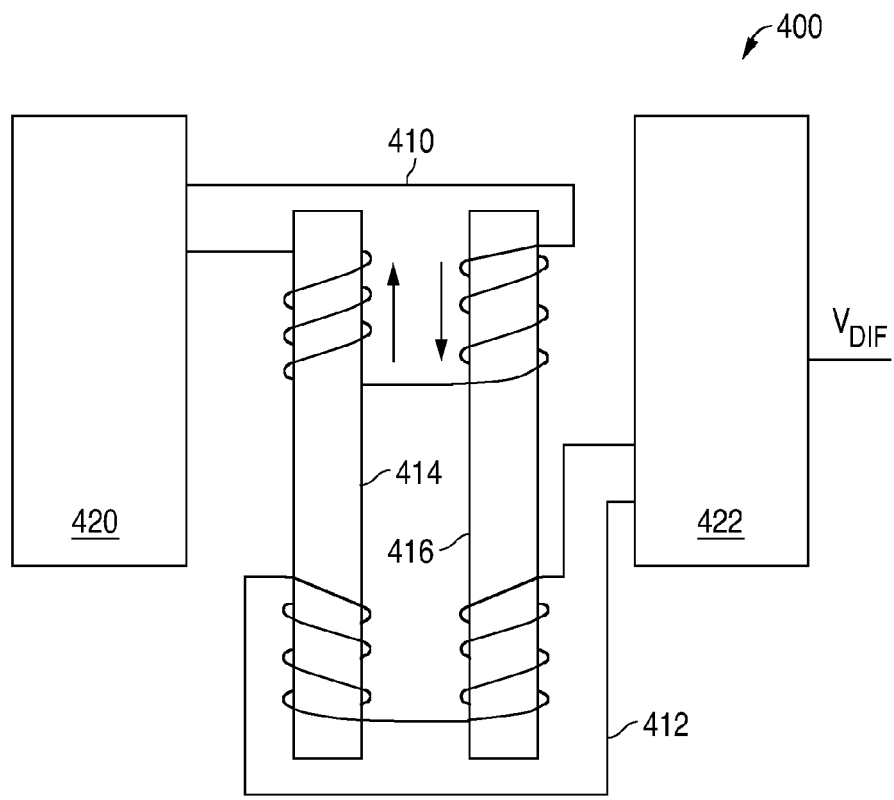
FIG. 4 is a block diagram illustrating an example of a prior art fluxgate magnetometer 400.
Figure 5:
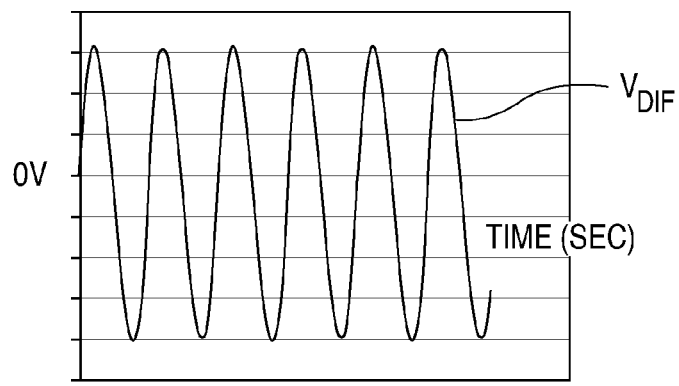
FIG. 5 is a graph further illustrating the operation of fluxgate magnetometer 400.
Figure 6:
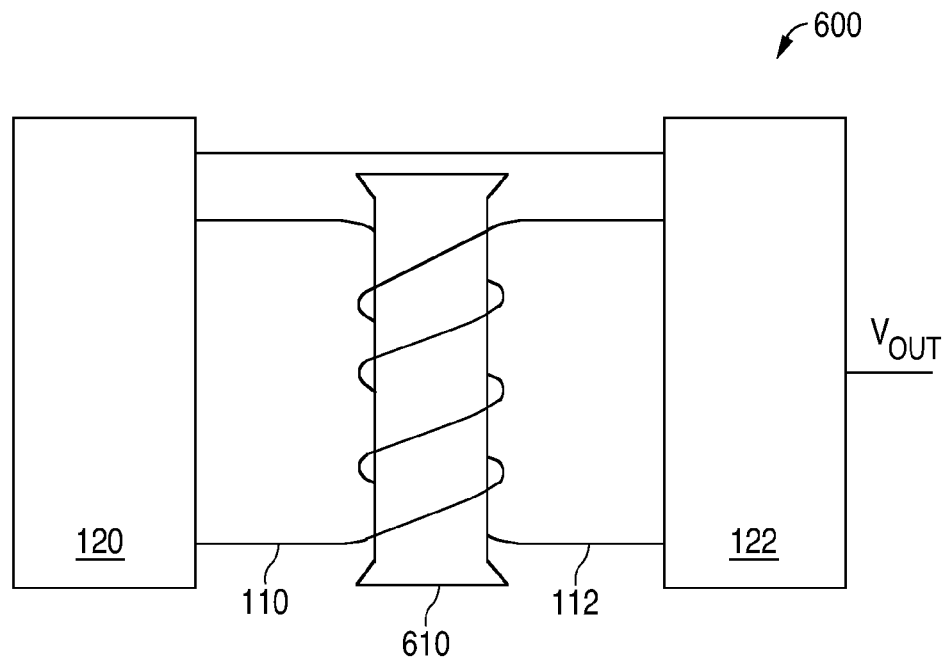
FIG. 6 is a block diagram illustrating an example of a prior art fluxgate magnetometer 600.
Figure 7:
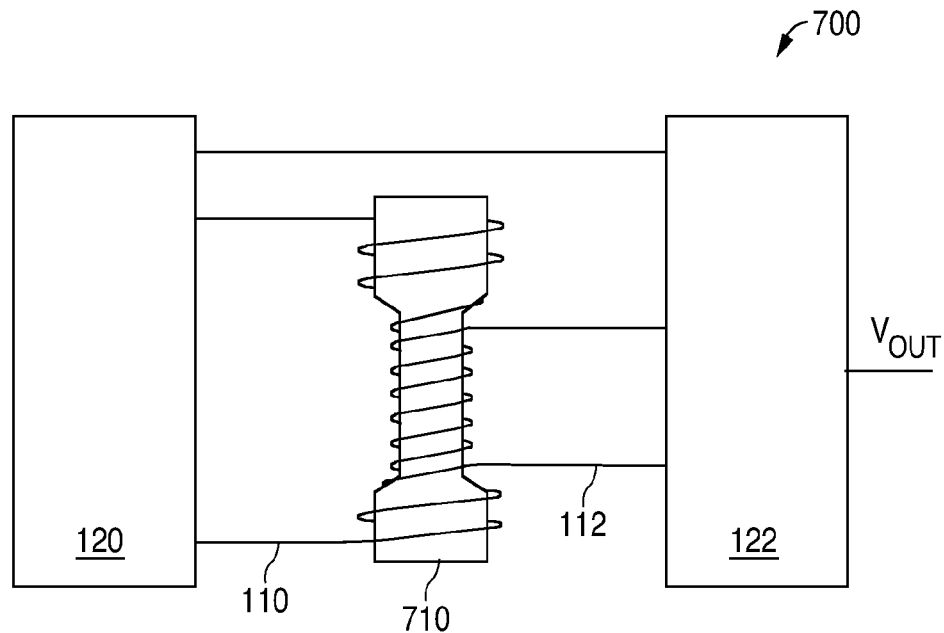
FIG. 7 is a block diagram illustrating an example of a prior art fluxgate magnetometer 700.
Figure 8A:
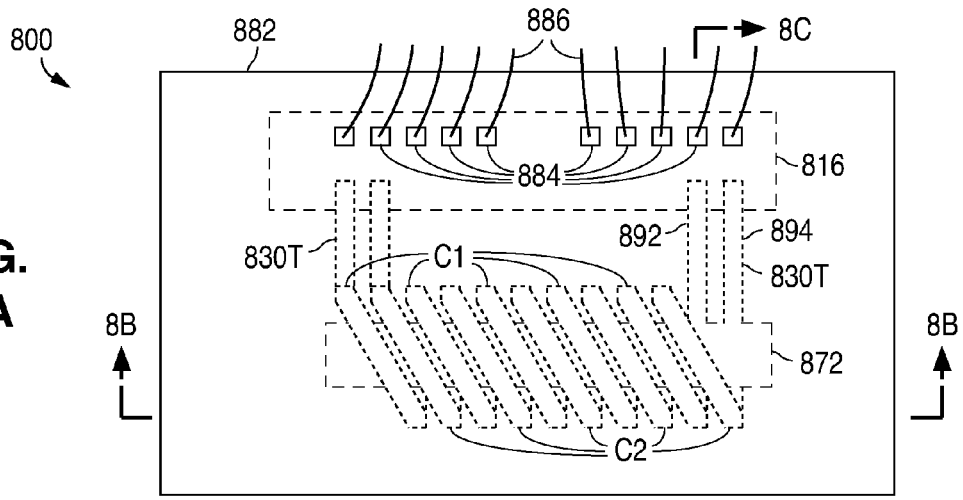
FIGS. 8A-8C are views illustrating an example of a semiconductor fluxgate magnetometer 800 in accordance with the present invention.
Figure 8B:
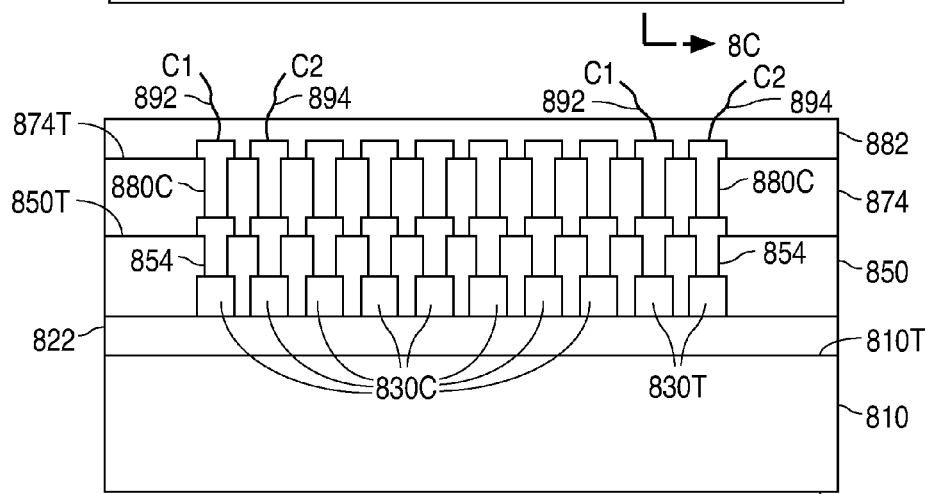
Figure 8C:
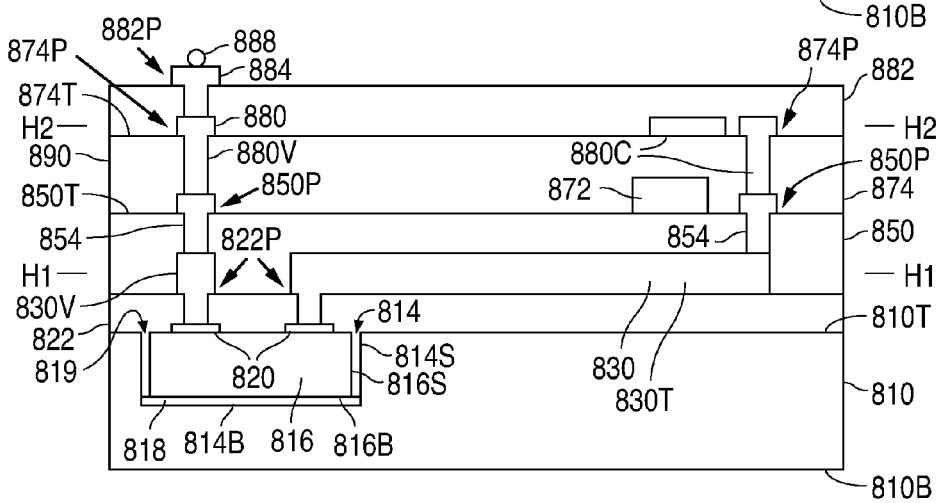

FIGS. 8A-8C show views that illustrate an example of a semiconductor fluxgate magnetometer 800 in accordance with the present invention. FIG. 8A shows a plan view, while FIG. 8B shows a cross-sectional view taken along line 8B-8B in FIG. 8A, and FIG. 8C shows a cross-sectional view taken along line 8C-8C in FIG. 8A. As described in greater detail below, the present invention provides a smaller and less expensive semiconductor fluxgate magnetometer.

As shown in FIGS. 8A-8C, semiconductor fluxgate magnetometer 800 includes a semiconductor structure 810 that has a bottom surface 810G, a top surface 810T, and a cavity 814 that extends from the top surface 810T down into semiconductor structure 810. Cavity 814, in turn, has a side wall surface 814S and a bottom surface 814B that lies above and vertically spaced apart from the bottom surface 810B of semiconductor structure 810. In addition, bottom surface 814B can be either conductive or non-conductive.

As further shown in FIGS. 8A-8C, semiconductor fluxgate magnetometer 800 includes a die 816 that lies in cavity 814, and an adhesive 818 that attaches die 816 to the bottom surface 814B of cavity 814. Die 816 has a side wall surface 816S, a bottom surface 816B that touches adhesive 818, and a number of conductive pads 820 that provide external electrical connection points for die 816. Further, a side wall space 819 lies between the side wall surface 814S of cavity 814 and the side wall surface 816S of die 816.

In addition, die 816 includes the drive and sense circuits. In the present example, the drive circuit is conventionally implemented, and includes all of the electrical components that are required to output an alternating current to a drive coil, and a clock signal to the sense circuit that is equal to second harmonic of the fundamental frequency of the alternating current that is output to the drive coil.

In addition, the sense circuit is conventionally implemented, and includes all of the electrical components that are required to detect an alternating voltage that has been induced in a sense coil, isolate the second harmonic of the induced alternating voltage, and generate an output voltage that represents the magnitude of the second harmonic of the induced alternating voltage (which is proportional to the magnitude of an external magnetic field).

Adhesive 818, in turn, can be implemented with, for example, a conductive or non-conductive epoxy or die attach film. In addition, adhesive 818, which can be, for example, 25 μm thick, can be selected based on any isolation and thermal requirements of die 816 and whether the bottom surface 814B of cavity 814 is conductive or non-conductive.

Semiconductor fluxgate magnetometer 800 also includes a non-conductive structure 822 that touches die 816 and semiconductor structure 810. Non-conductive structure 822, which fills up the remainder of cavity 814, has a number of openings 822P that expose the conductive pads 820 on die 816.

Further, semiconductor fluxgate magnetometer 800 includes a number of metal lower structures 830 that touch non-conductive structure 822. The metal lower structures 830 include a number of via structures 830V that extend through non-conductive structure 822 to touch a first group of the conductive pads 820 which represent power and input/output signal pads, a number of via trace structures 830T with via sections that extend through non-conductive structure 822 to touch a second group of the conductive pads 820 which represent input/output coil pads, and a number of lower coil structures 830C.

In addition, semiconductor fluxgate magnetometer 800 includes a non-conductive structure 850 that touches the via structures 830V, the via trace structures 830T, the lower coil structures 830C, and non-conductive structure 822. Non-conductive structure 850 has a substantially planar top surface 850T, and a number of openings 850P that expose the via structures 830V, one end of each via trace 830T, and the opposite ends of each lower coil structure 830C.

Semiconductor fluxgate magnetometer 800 also includes a number of via structures 854 that lie in the openings 850P to make electrical connections to the via structures 830V, one end of each via trace 830T, and the opposite ends of each lower coil structure 830C. Magnetometer 800 additionally include a magnetic core structure 872 that touches the top surface 850T of non-conductive structure 850. In the present example, magnetic core structure 872 is uniaxially anisotropic, and has a rectangular shape with opposing ends.

Further, semiconductor fluxgate magnetometer 800 includes a non-conductive structure 874 that touches non-conductive structure 850, the via structures 854, and magnetic core structure 872. Non-conductive structure 874 has a substantially planar top surface 874T, and a number of openings 874P that expose the via structures 854.

In addition, semiconductor fluxgate magnetometer 800 includes a number of metal upper structures 880 that touch non-conductive structure 874. The metal upper structures 880 include a number of upper via structures 880V that touch the via structures 854 which are connected to the via structures 830V, and a number of upper coil structures 880C that touch the via structures 854 which are connected to the lower coil structures 830C, and the via structures 854 which are connected to the ends of the via traces 830T.

The electrical connection of the upper coil structures 880C, the lower coil structures 830C, and the via structures 854 that are connected to the upper coil structures 880C and the lower coil structures 830C form a fluxgate magnetometer that has a drive coil C1 and a sense coil C2 which are wrapped around magnetic core structure 872.

Semiconductor fluxgate magnetometer 800 also includes a passivation layer 882 that touches the top surface 874T of non-conductive structure 874 and the metal upper structures 880. As further shown in FIGS. 8A-8C, passivation layer 882 is formed to have a number of pad openings 882P that expose portions of the top surfaces of the upper via structures 880V.

Further, semiconductor fluxgate magnetometer 800 includes metal pads 884, such as aluminum pads, that lie in the pad openings 882P to touch the upper via structures 880V. The metal pads 884 can be connected by way of bonding wires 886 to external connection structures (e.g., pins or pads) on a lead frame as illustrated in FIG. 8A, or by way of solder balls 888 to a printed circuit board as illustrated in FIG. 8C.

Thus, semiconductor fluxgate magnetometer 800 includes a non-conductive structure 890, which includes non-conductive structures 822, 850, and 874, that touches die 816 and the top surface 810T of the semiconductor structure 810. In addition, fluxgate magnetometer 800 includes a first conductor 892 and a second conductor 894 that touch non-conductive structure 890.

First conductor 892 includes the lower coil structures 830C, the upper coil structures 880C, and the via structures 854 which are connected together to form drive coil C1, along with a pair of via traces structures 830T that are electrically connected to die 816 and drive coil C1. Thus, first conductor 892, which is electrically isolated from magnetic core structure 872 by non-conductive structure 890, is wound around magnetic core structure 872 in a spiral to form drive coil C1.

Further, the lower coil structures 830C of drive coil C1 touch non-conductive structure 890, and lie in a horizontal plane H1 that lies below and vertically spaced apart from the bottom surface of magnetic core structure 872. In addition, in the present example, the horizontal plane H1 lies above and vertically spaced apart from the top surface 810T of semiconductor structure 810. In addition, the upper coil structures 880C of drive coil C1 touch non-conductive structure 890, and lie in a horizontal plane H2 that lies above and vertically spaced apart from the top surface of magnetic core structure 872.

Second conductor 894 includes the lower coil structures 830C, the upper coil structures 880C, and the via structures 854 which are connected together to form sense coil C2, along with a pair of via traces structures 830T that are electrically connected to die 816 and sense coil C2. Thus, second conductor 894, which is electrically isolated from magnetic core structure 872 by non-conductive structure 890, is wound around magnetic core structure 872 in a spiral to form sense coil C2. Further, the lower coil structures 830C of sense coil C2 touch non-conductive structure 890 and lie in horizontal plane H1, while the upper coil structures 880C of sense coil C2 touch non-conductive structure 890 and lie in horizontal plane H2.

In operation, the drive circuit of die 816 outputs an alternating current to the drive coil C1, and a clock signal to the sense circuit of die 816 that is equal to second harmonic of the fundamental frequency of the alternating current that is output to the drive coil C1. The alternating current in the drive coil C1 sets up an alternating magnetic induction field that induces an alternating voltage in sense coil C2.

The sense circuit detects the alternating voltage in sense coil C2, isolates the second harmonic of the alternating voltage in sense coil C2, identifies a magnitude of the second harmonic, and generates an output voltage with a magnitude that is proportional to the magnitude of the external magnetic field.

FIGS. 9A-9C through 56A-56C show a series of views that illustrate an example of a method of forming a semiconductor fluxgate magnetometer in accordance with the present invention. FIGS. 9A-56A show a series of plan views, while FIGS. 9B-56B show a series of cross-sectional views taken along lines 9B-56B, respectively, in FIGS. 9A-56A, and FIGS. 9C-56C show a series of cross-sectional views taken along lines 9C-56C, respectively, in FIGS. 9A-56A.

Figure 9A:
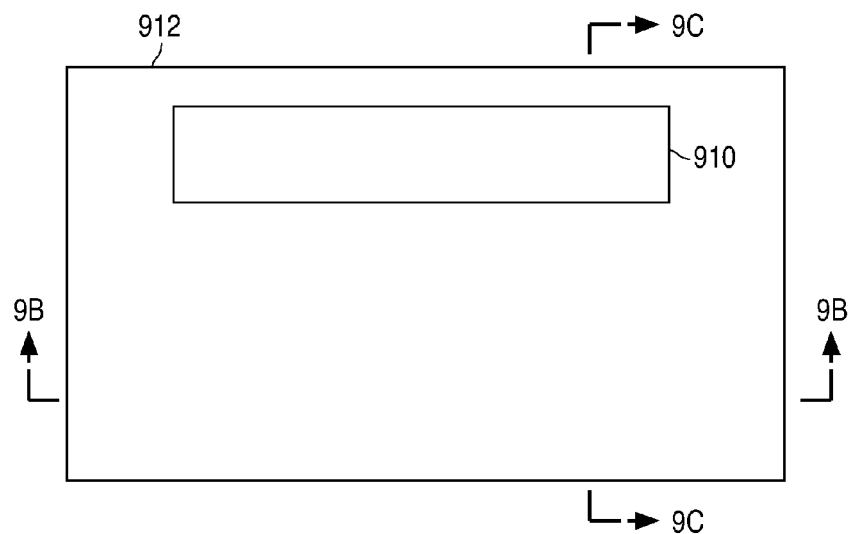
FIGS. 9A-9C through 56A-56C are a series of views illustrating an example of a method of forming a semiconductor fluxgate magnetometer in accordance with the present invention.
Figure 9B:
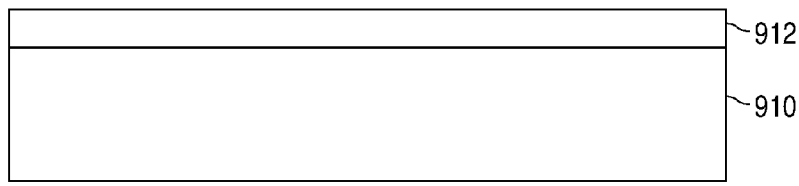
Figure 9C:
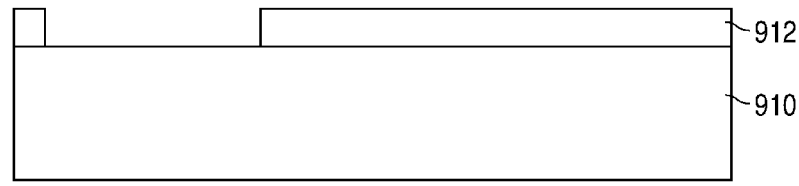

As shown in the FIGS. 9A-9C, the method of forming a semiconductor fluxgate magnetometer utilizes a conventionally-formed semiconductor wafer 910. Wafer 910, in turn, can be implemented with a conducting material, such as silicon, or a non-conducting material such as quartz or G10-FR4 glass epoxy laminates. As further shown in FIGS. 9A-9C, the method begins by forming a patterned photoresist layer 912 on the top surface of wafer 910.

Patterned photoresist layer 912 is formed in a conventional manner, which includes depositing a layer of photoresist, projecting a light through a patterned black/clear glass plate known as a mask to form a patterned image on the layer of photoresist that softens the photoresist regions exposed by the light, and removing the softened photoresist regions.

Figure 10A:
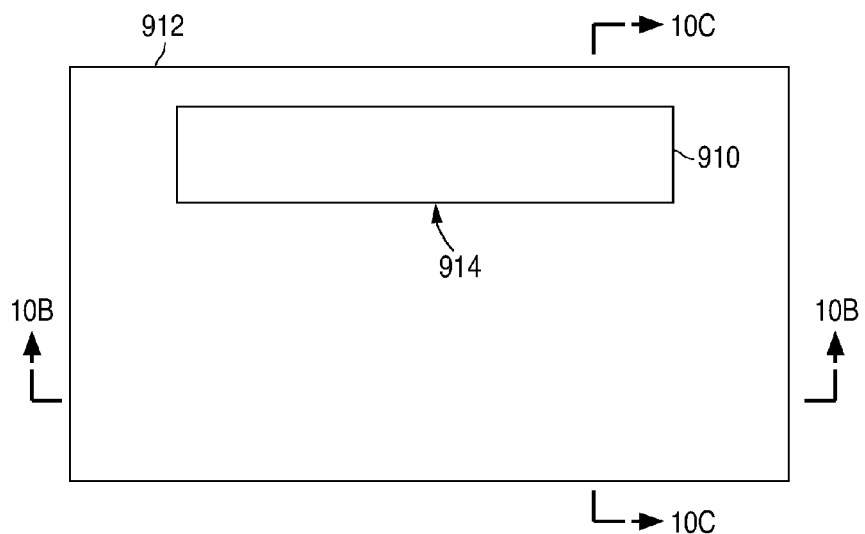
Figure 10B:
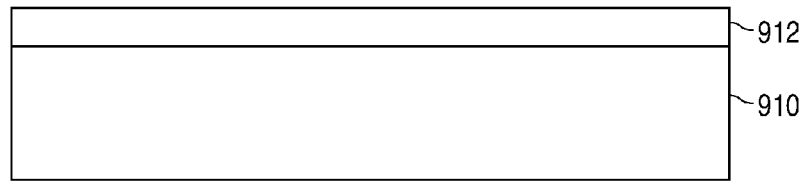
Figure 10C:
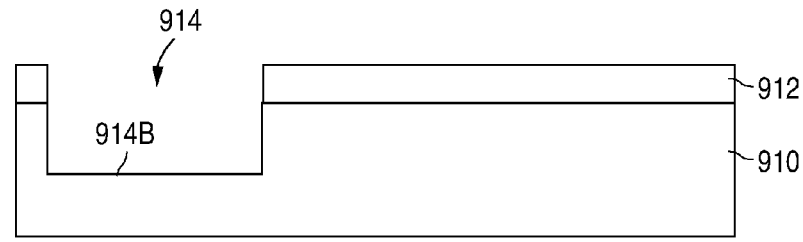

As shown in FIGS. 10A-10C, after patterned photoresist layer 912 has been formed, the exposed region of wafer 910 is etched in a conventional manner to form a large number of cavities 914, which each has a bottom surface 914B, in wafer 910. (Only one cavity 914 is shown for simplicity.) Wafer 910 can be etched using a dry etch such as reactive ion etching, or a timed wet etch.

After the etch, the resulting structure is rinsed, and patterned photoresist layer 912 is then removed in a conventional manner, such as with acetone. Once patterned photoresist layer 912 has been removed, the resulting structure is conventionally cleaned to remove organics, such as with a Piranha etch (e.g., using a solution of $50H_2SO_4:1H_2O_2$ @ 120° C. removes approximately 240 nm/minute). If wafer 910 is conductive, a conformal non-conducting material, such as oxide or nitride, can be optionally formed on wafer 910 to line cavity 914 so that the bottom surface 914B of cavity 914 is non-conductive.

Figure 11A:
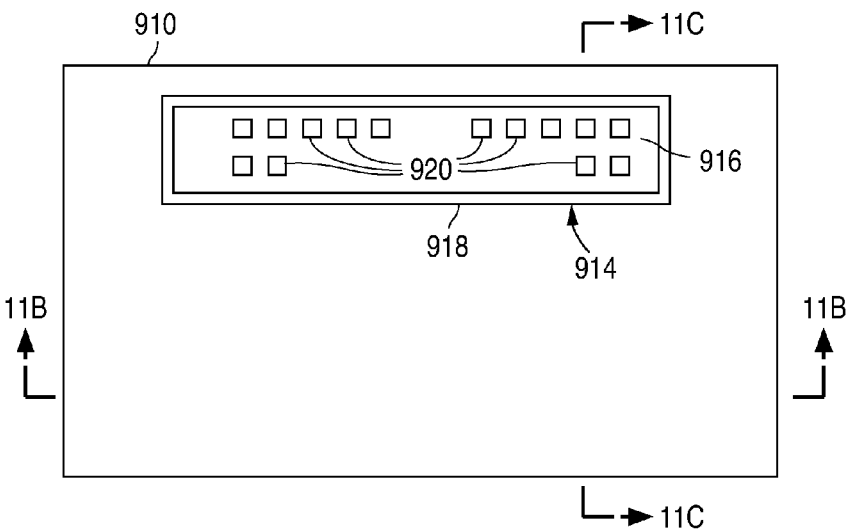
Figure 11B:
Figure 11C:

Next, as shown in FIGS. 11A-11C, a die 916 is placed in each cavity 914 and attached to the bottom surface 914B of the cavity 914 using an adhesive 918 such as, for example, a conductive or non-conductive epoxy or die attach film. Adhesive 918, which can be, for example, 25 μm thick, can be selected based on any isolation and thermal requirements of die 916 and whether the bottom surface 914B of cavity 914 is conductive or non-conductive. Die 916, which includes the drive and sense electronics and a number of conductive pads 920, can be placed in and attached to the bottom surface 914B of cavity 914 using a conventional pick and place machine.

Figure 12A:
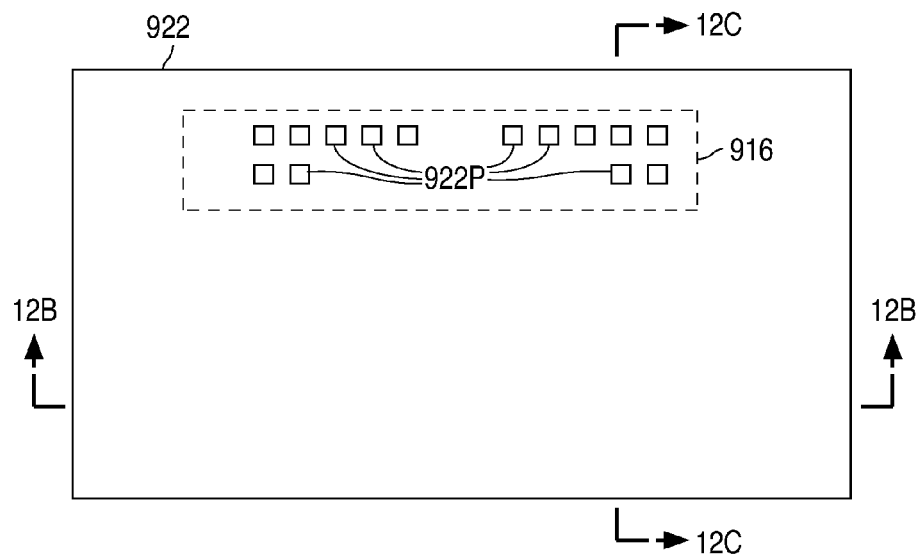
Figure 12B:
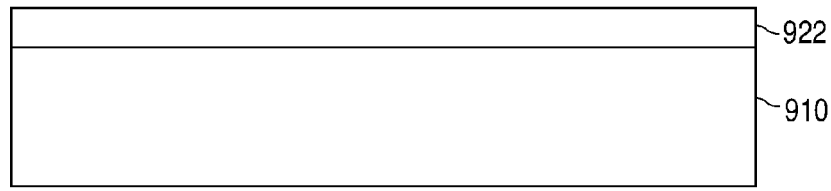
Figure 12C:
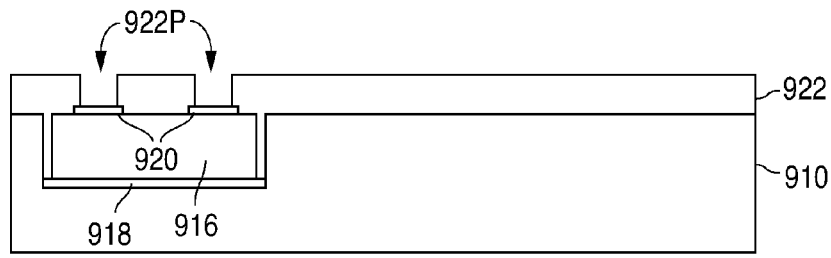

As shown in FIGS. 12A-12C, after die 916 has been attached to the bottom surface 914B of cavity 914, a non-conductive structure 922 is formed to touch die 916 and wafer 910. Non-conductive structure 922, which fills up the remainder of cavity 914, has a number of openings 922P that expose the conductive pads 920 on die 916.

Figure 13A:
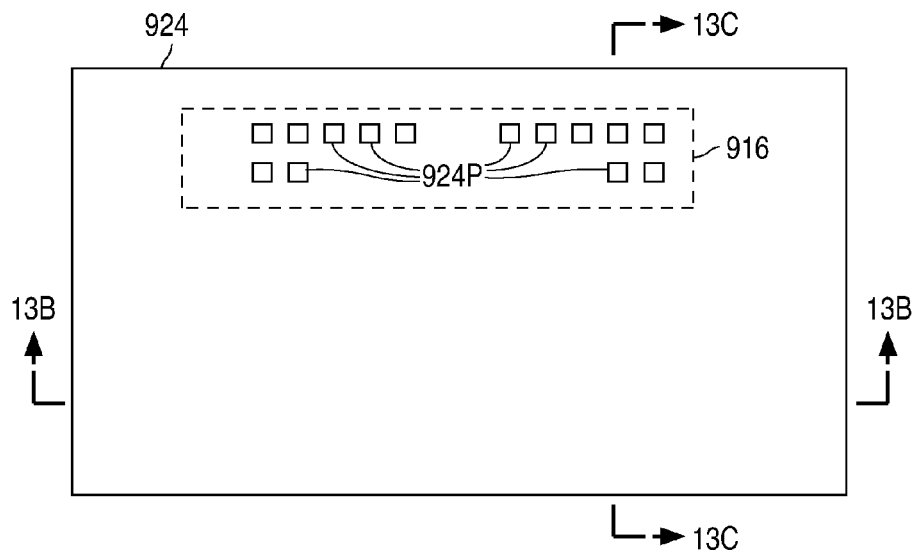
Figure 13B:
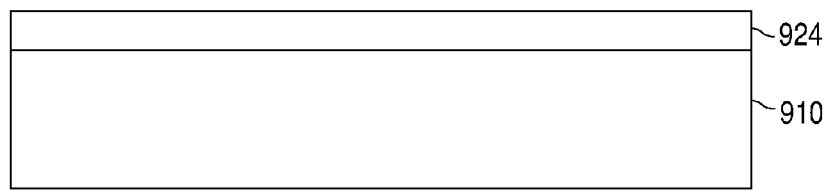
Figure 13C:
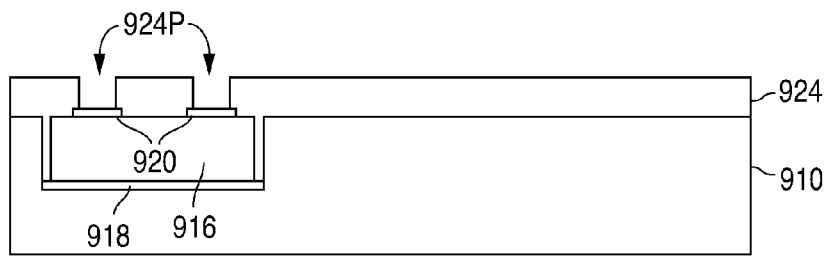

In the present example, as shown in FIGS. 13A-13C, non-conductive structure 922 is formed by depositing a layer of photoimageable epoxy or polymer 924, such as SU-8, benzocyclobutene (BCB), or polybenzoxazole (PBO), which are substantially self planarizing. Once the photoimageable epoxy or polymer has been deposited, a number of openings 924P are formed in photoimageable epoxy or polymer layer 924 by projecting a light through a mask to form a patterned image on layer 924 that softens the regions of layer 924 that are exposed by the light, and then removing the softened regions of layer 924.

Figure 14A:
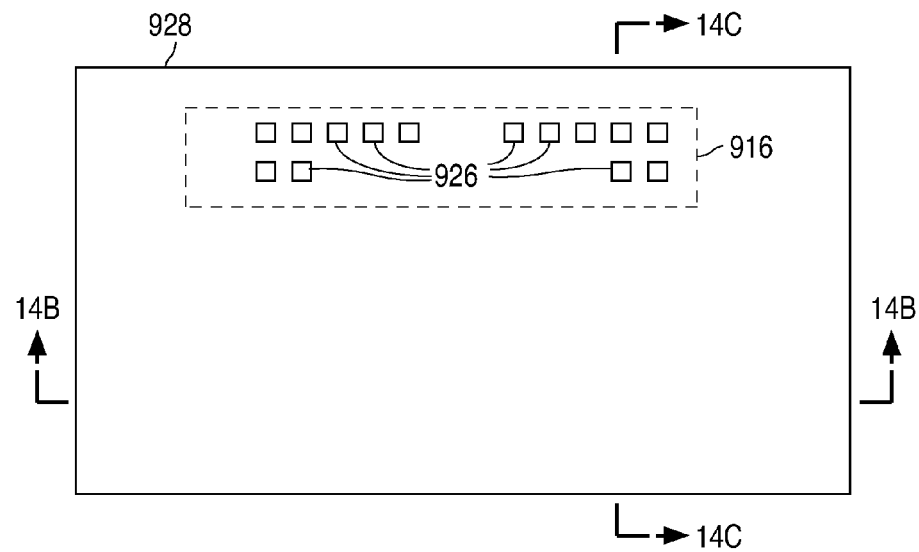
Figure 14B:
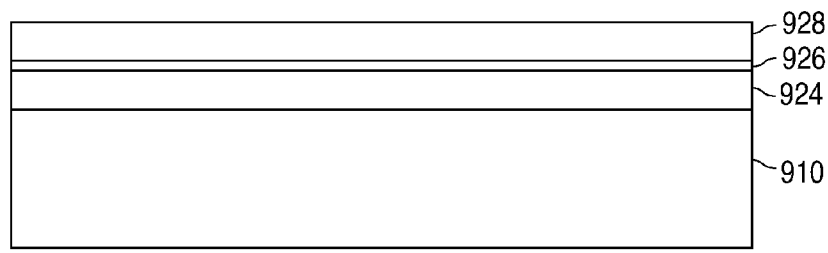
Figure 14C:
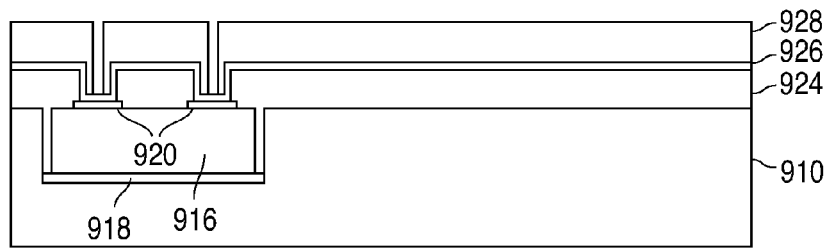

After the openings 924P have been formed, as shown in FIGS. 14A-14C, a layer of nitride 926 approximately 0.6 µm thick is conventionally formed on photoimageable epoxy or polymer layer 924 to line the openings 924P using, for example, plasma-enhanced chemical vapor deposition (PECVD).

Following this, a patterned photoresist layer 928 is conventionally formed on nitride layer 926. The exposed regions of nitride layer 926 are then etched to expose the conductive pads 920 on die 916. Patterned photoresist layer 928 is then removed in a conventional manner to complete the formation of non-conductive structure 922. (The formation and etch of nitride layer 926 are optional and can be omitted.)

Figure 15A:
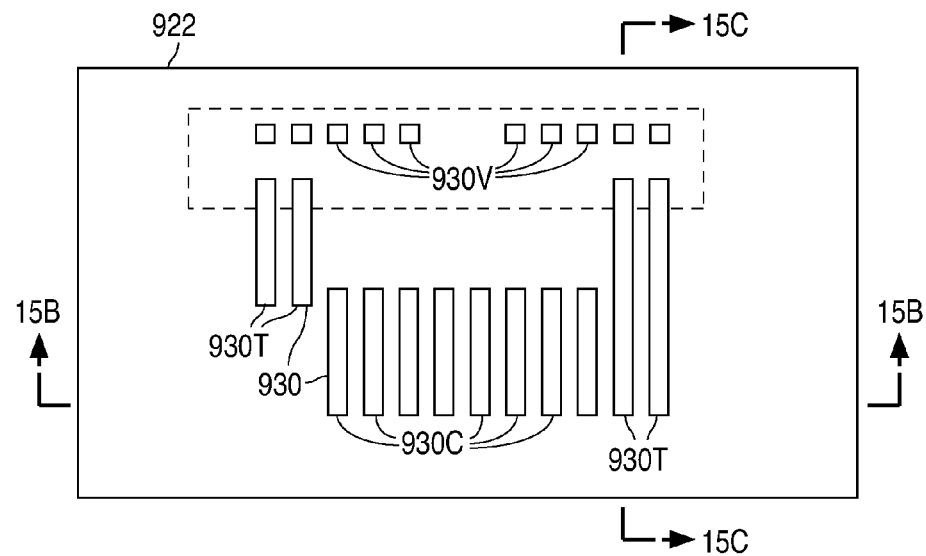
Figure 15B:
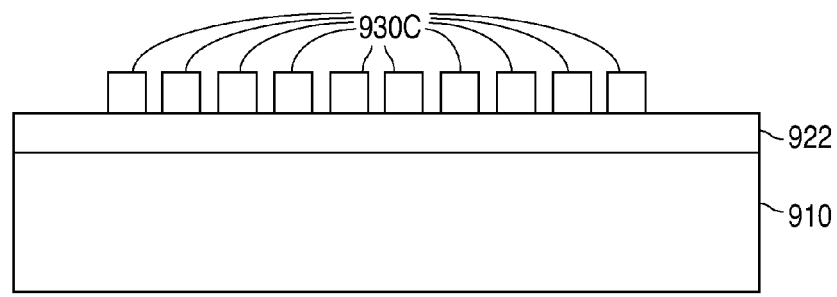
Figure 15C:
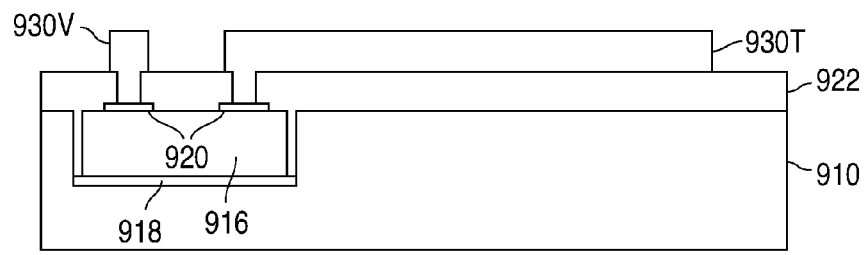

As shown in FIGS. 15A-15C, after non-conductive structure 922 has been formed, a number of metal lower structures 930 are formed to touch non-conductive structure 922. The metal lower structures 930 include a number of via structures 930V that also touch a first group of the conductive pads 920, a number of via trace structures 930T that also touch a second group of the conductive pads 920, and a number of lower coil structures 930C. The metal lower structures 930 can be formed in a number of different ways.

Figure 16A:
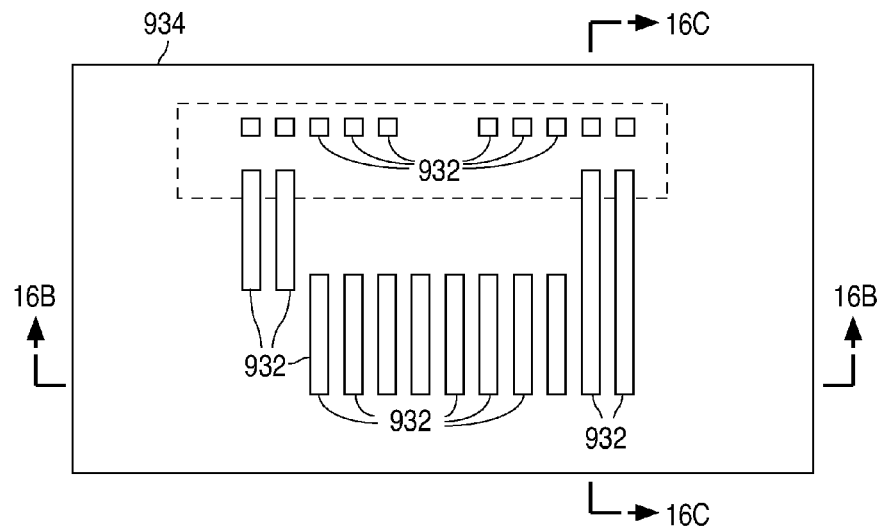
Figure 16B:
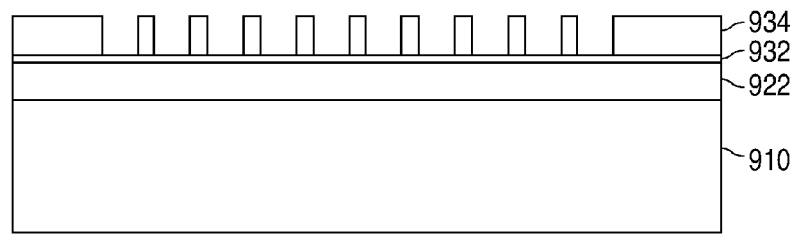
Figure 16C:
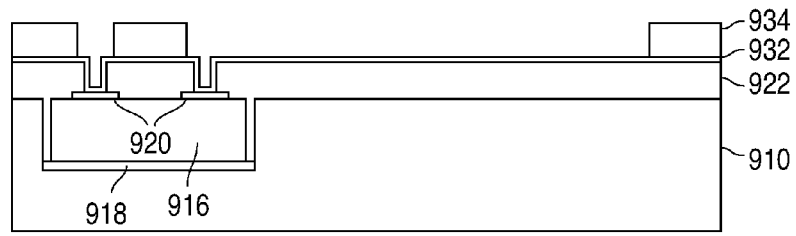

As shown in FIGS. 16A-16C, in a first embodiment, the metal lower structures 930 can be formed by depositing a seed layer 932 to touch non-conductive structure 922 and the conductive pads 920. For example, seed layer 932 can be implemented with a layer of aluminum copper. Seed layer 932 can alternately be formed by depositing 300 Å of titanium, 3000 Å of copper, and 300 Å of titanium. After seed layer 932 has been formed, a plating mold 934 is formed on the top surface of seed layer 932.

Figure 17A:
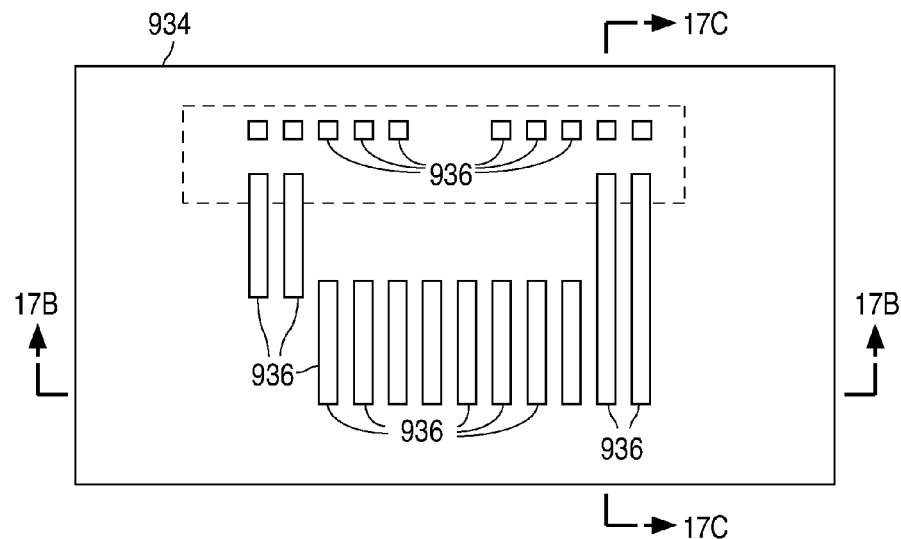
Figure 17B:
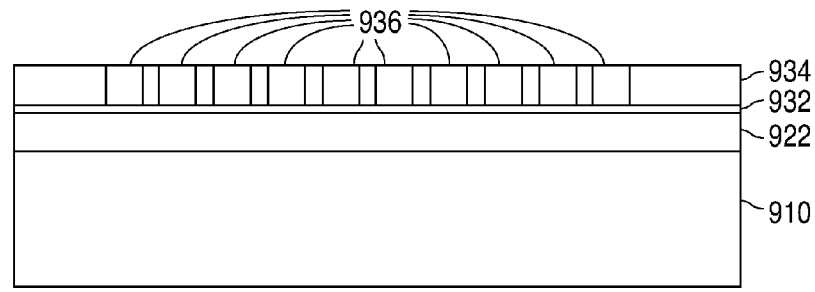
Figure 17C:
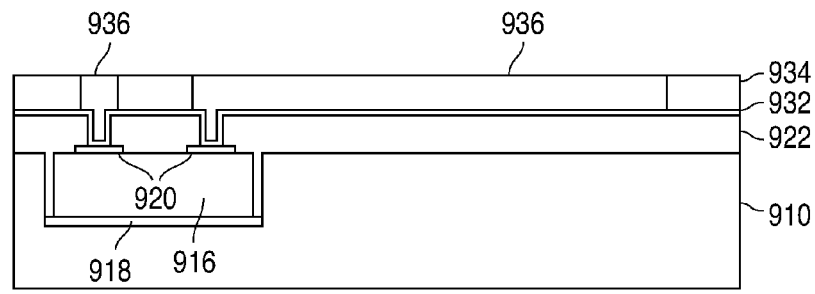
Figure 18A:
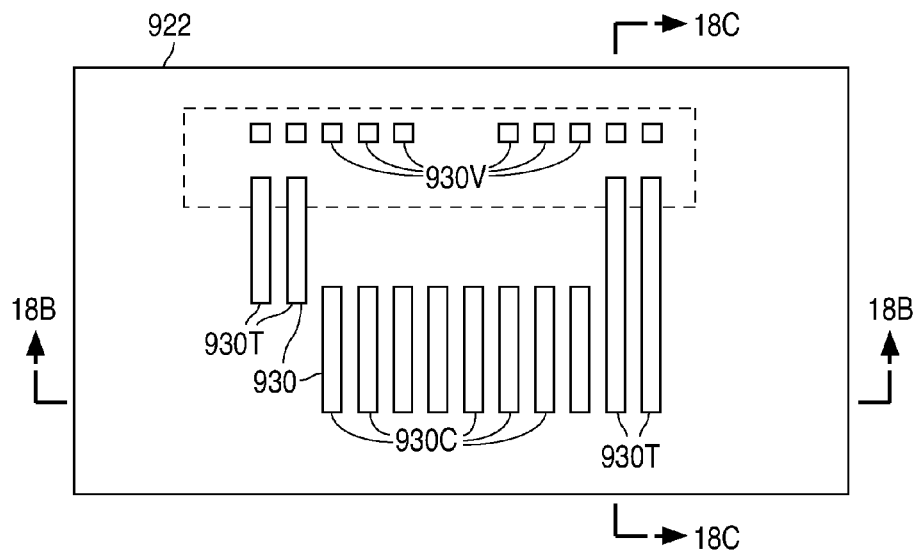
Figure 18B:
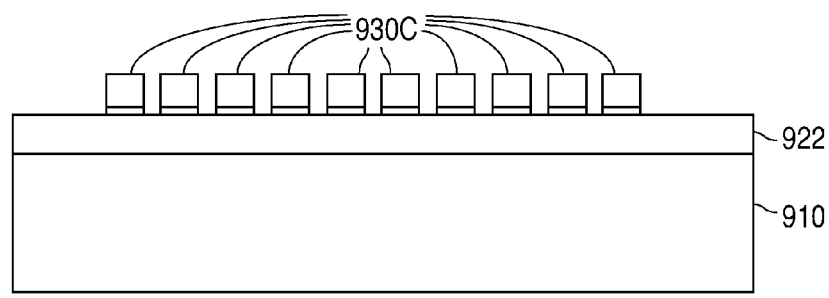
Figure 18C:
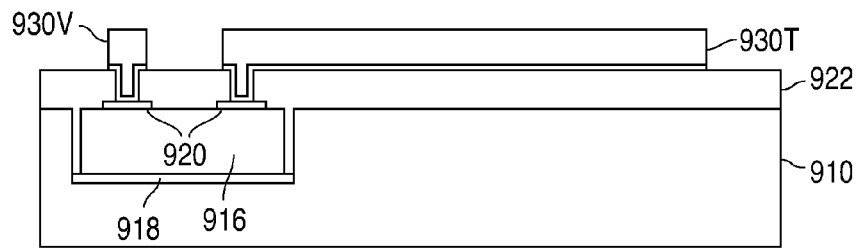

As shown in FIGS. 17A-17C, following the formation of plating mold 934, copper is electroplated in a conventional manner to form a number of copper regions 936 approximately 5 µm thick. After the electroplating, as shown in FIGS. 18A-18C, plating mold 934 and the underlying regions of seed layer 932 are removed to form the via structures 930V, the via trace structures 930T, and the lower coil structures 930C.

Figure 19A:
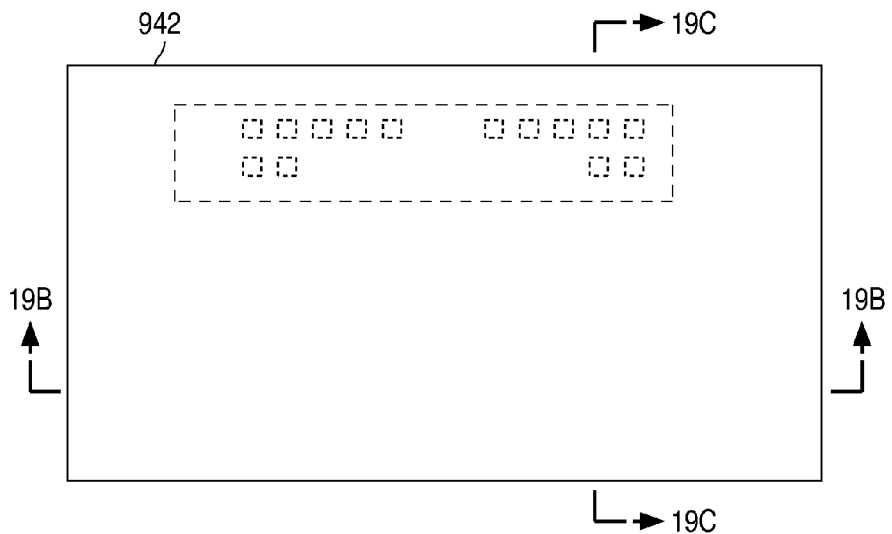
Figure 19B:
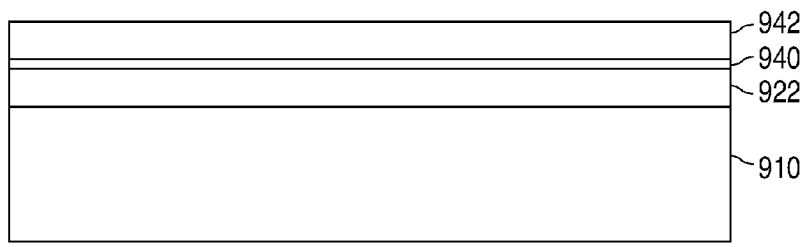
Figure 19C:
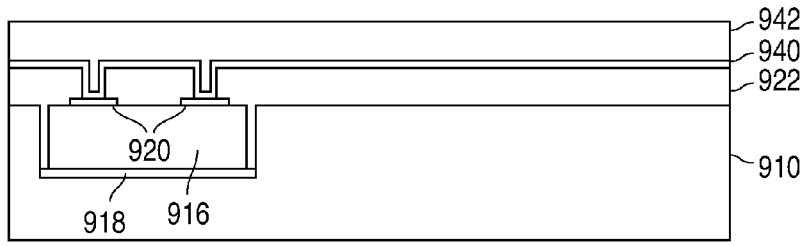

Alternately, in a second embodiment, as shown in FIGS. 19A-19C, the metal lower structures 930 can be formed by first depositing a liner layer 940 on non-conductive structure 922 to line the openings 922P. Liner layer 940 can be implemented with, for example, titanium/titanium nitride. After liner layer 940 has been formed, a metal layer 942, such as tungsten, is conventionally deposited on liner layer 940 to fill up the openings 922P.

Figure 20A:
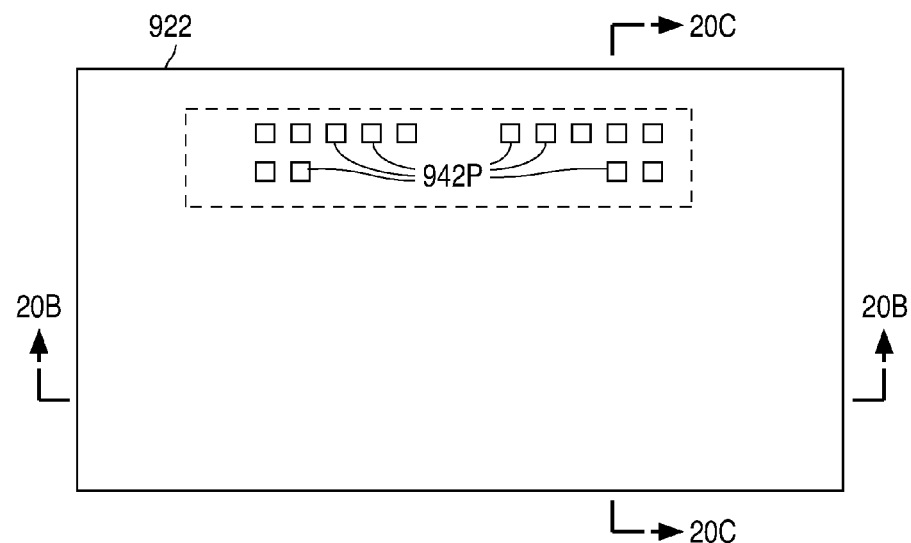
Figure 20B:
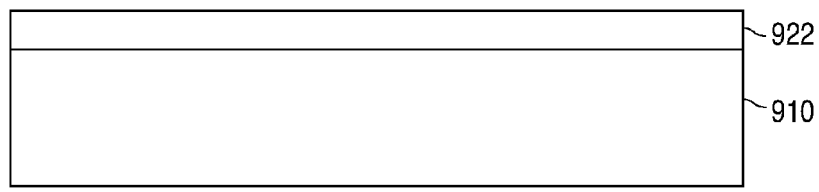
Figure 20C:
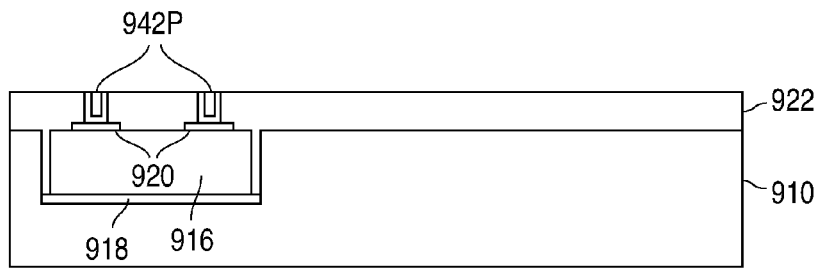

Following this, as shown in FIGS. 20A-20C, metal layer 942 is planarized, such as with chemical-mechanical polishing, to expose the top surface of non-conductive structure 922, and form via plug structures 942P in the openings 922P that make electrical connections to the conductive pads 920 of die 916.

Figure 21A:
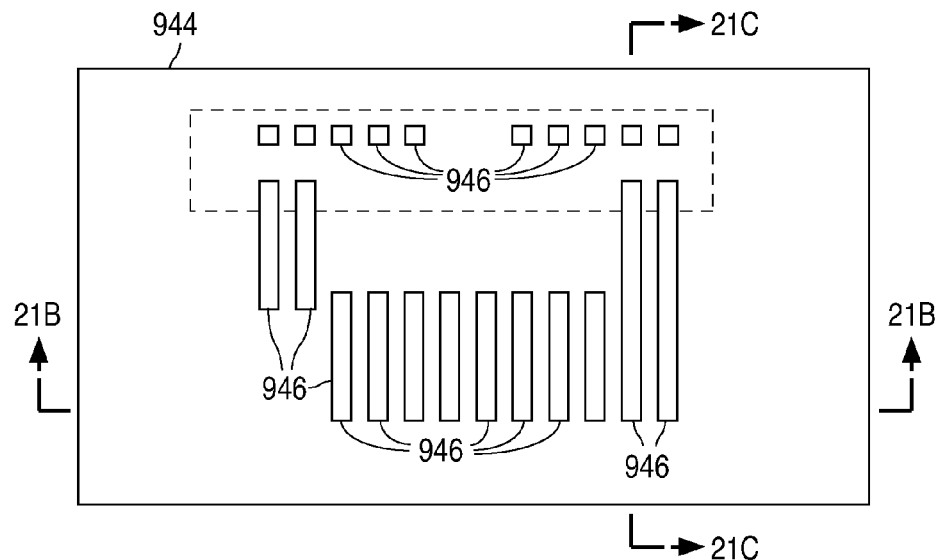
Figure 21B:
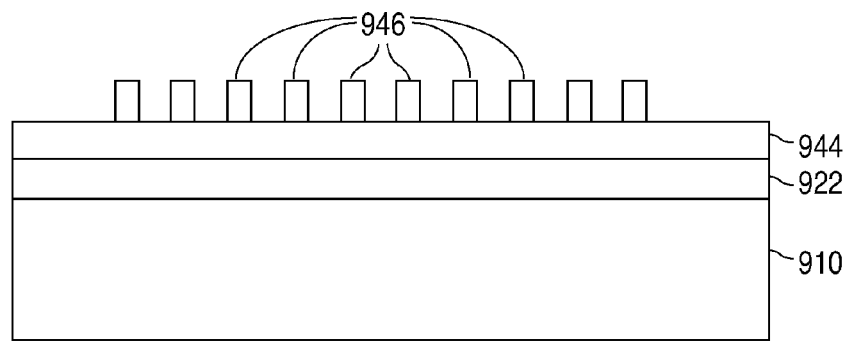
Figure 21C:
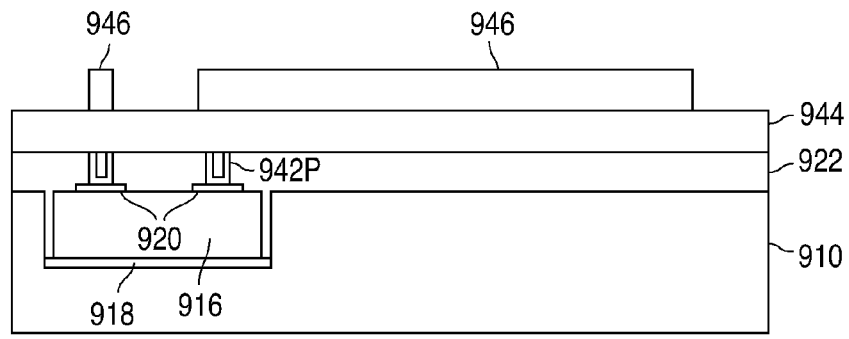

As shown in FIGS. 21A-21C, after the via plug structures 942P have been formed, a metal layer 944, such as aluminum, is sputter deposited onto non-conductive structure 922 to a depth of approximately 5 µm. Alternately, metal layer 944 can include multiple layers of metal such as, for example, a layer of titanium, a layer of titanium nitride, a layer of aluminum copper, a layer of titanium, and a layer of titanium nitride.

Once metal layer 944 has been formed, a patterned photoresist layer 946 approximately 1.0 µm thick is formed on the top surface of metal layer 944 in a conventional manner. Following the formation of patterned photoresist layer 946, metal layer 944 is etched to remove the exposed regions of metal layer 944 and form the metal lower structures 930.

Metal layer 944 can be etched using a dry etch such as reactive ion etching, or a timed wet etch. For example, aluminum can be wet etched in a 10:1 hydrogen fluoride solution for the necessary period of time. After the etch, the resulting structure is rinsed, and patterned photoresist layer 946 is then removed in a conventional manner, such as with acetone. Once patterned photoresist layer 946 has been removed, the resulting structure is conventionally cleaned to remove organics, such as with a Piranha etch.

Figure 22A:
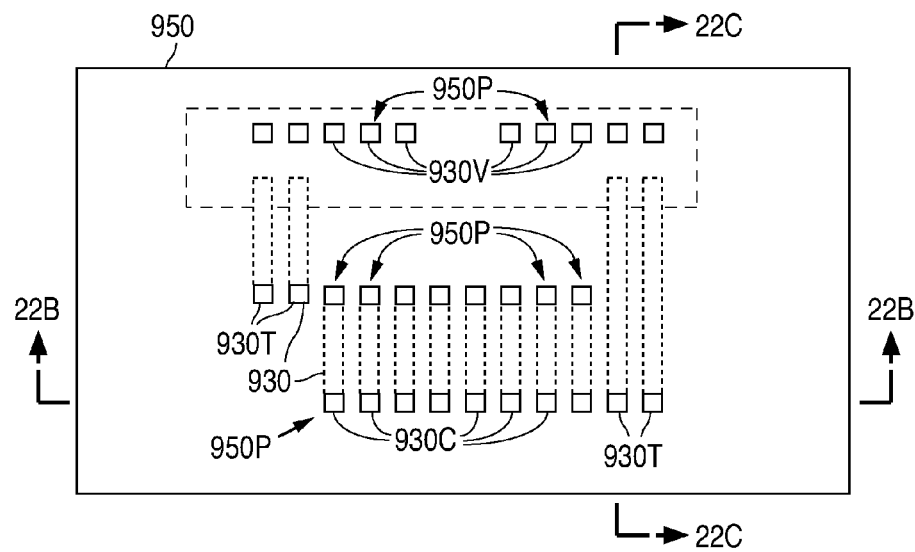
Figure 22B:
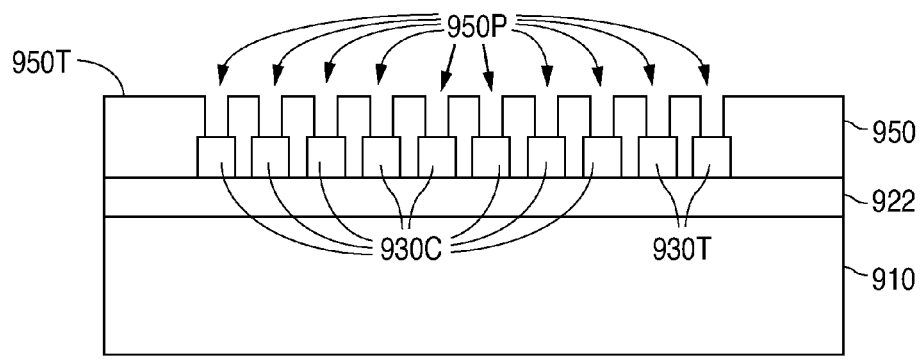
Figure 22C:
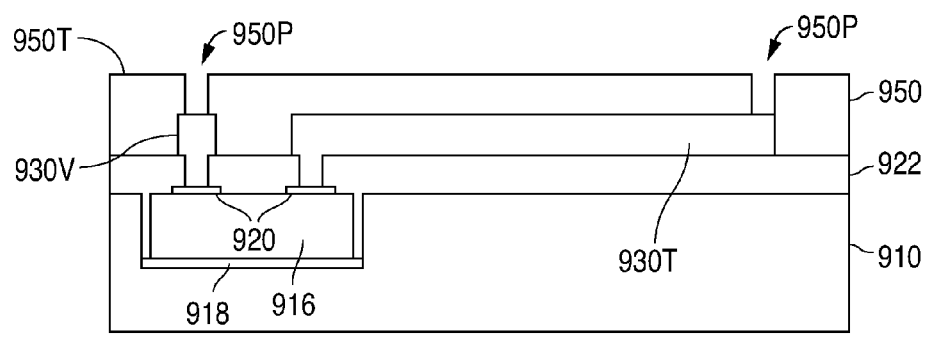

As shown in FIGS. 22A-22C, after the via structures 930V, the via trace structures 930T, and the lower coil structures 930C have been formed, a non-conductive structure 950 is formed on the via structures 930V, the via trace structures 930T, the lower coil structures 930C, and non-conductive structure 922. Non-conductive structure 950 has a substantially planar top surface 950T, and a number of openings 950P that expose the via structures 930V, one end of each via trace 930T, and the opposite ends of each lower coil structure 930C. Dielectric structure 950 can be formed in a number of different ways.

Figure 23A:
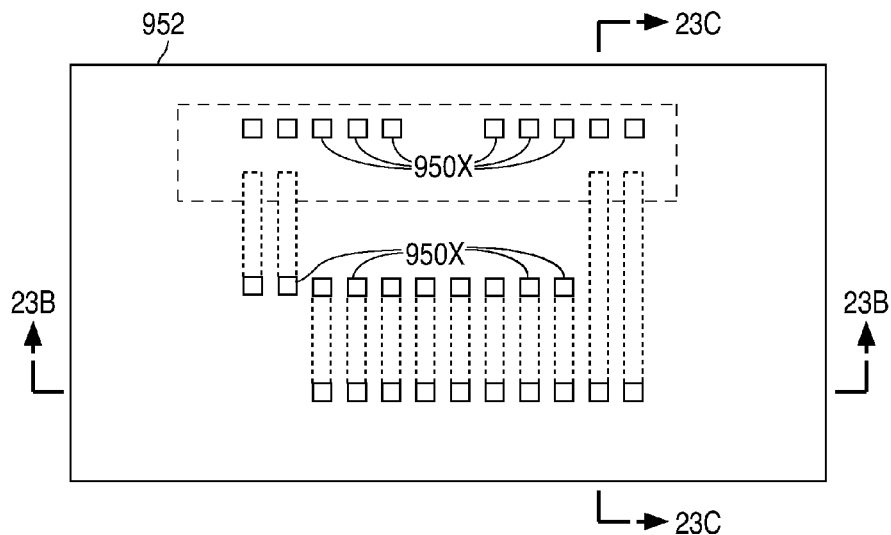
Figure 23B:
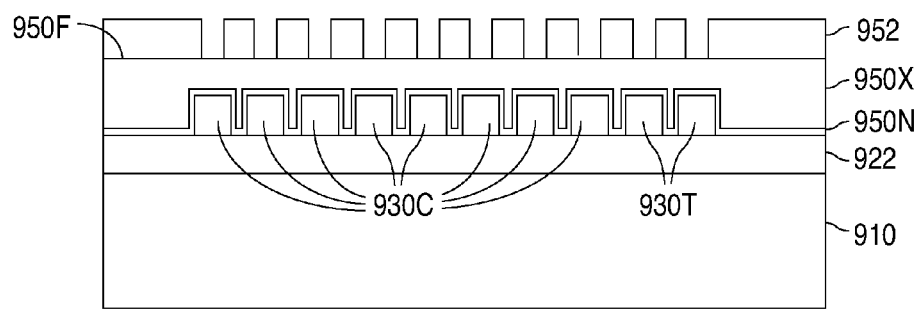
Figure 23C:
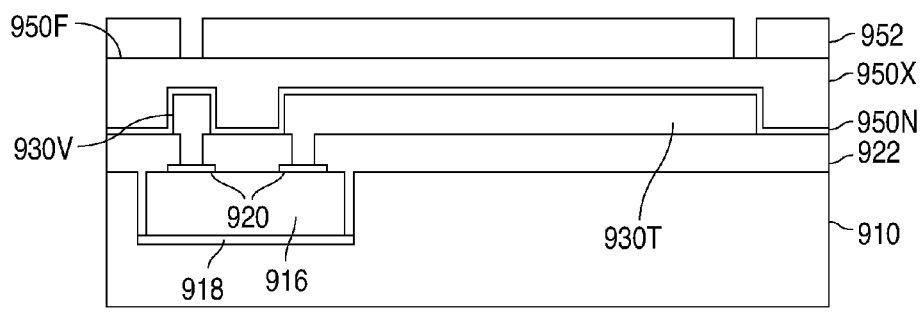

For example, as shown in FIGS. 23A-23C, in a first embodiment, non-conductive structure 950 can be formed by conventionally depositing a silicon nitride layer 950N approximately 0.6 µm thick on non-conductive structure 922 and the metal lower structures 930. After this, a layer of silicon dioxide 950X is conventionally formed on the top surface of silicon nitride layer 950N.

Following the formation of oxide layer 950X, oxide layer 950X is planarized in a conventional manner, such as with chemical-mechanical polishing, until oxide layer 950X has a substantially planar top surface 950F. Once oxide layer 950X has been planarized, a hard mask 952 is formed on substantially planar top surface 950F of oxide layer 950X.

Figure 24A:
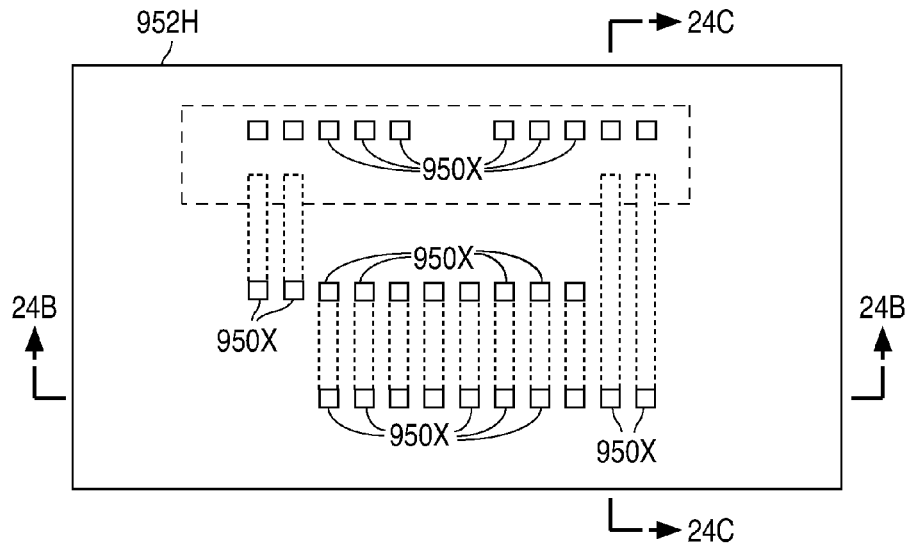
Figure 24B:
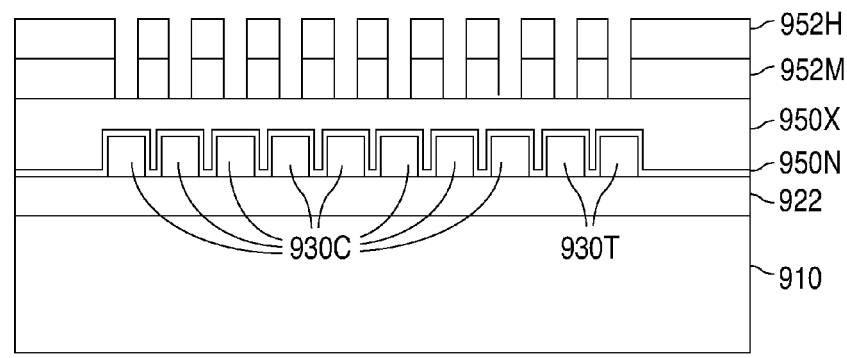
Figure 24C:
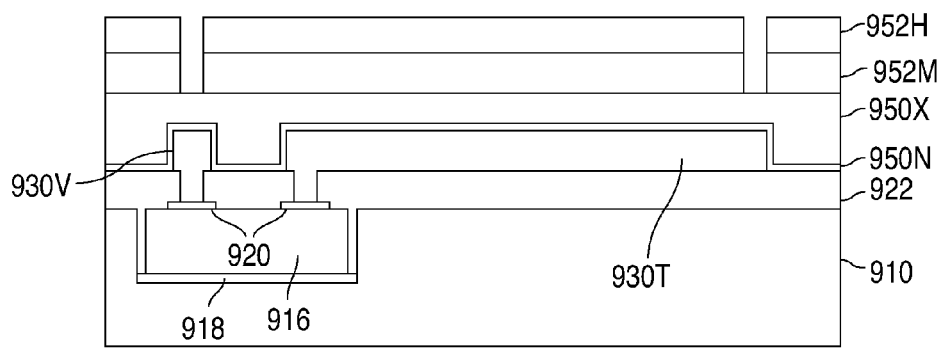

As shown in FIGS. 24A-24C, hard mask 952 can be formed by conventionally depositing a layer of masking material 952M, such as a layer of aluminum, or a layer of oxide with an overlying layer of nitride, followed by the conventional formation of a patterned photoresist layer 952H. After this, the exposed regions of masking material 952M are etched to form the openings in hard mask 952. Patterned photoresist layer 952H is then removed in a conventional manner to complete the formation of hard mask 952.

Figure 25A:
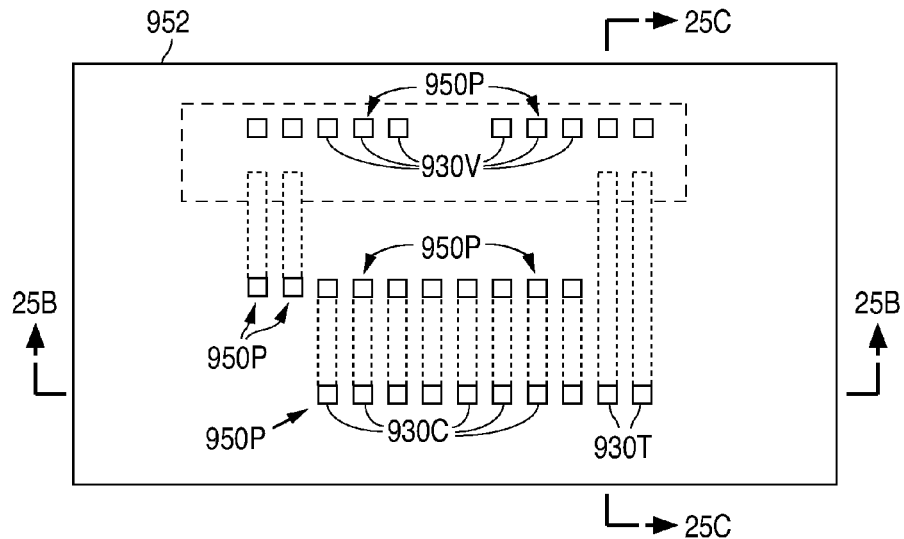
Figure 25B:
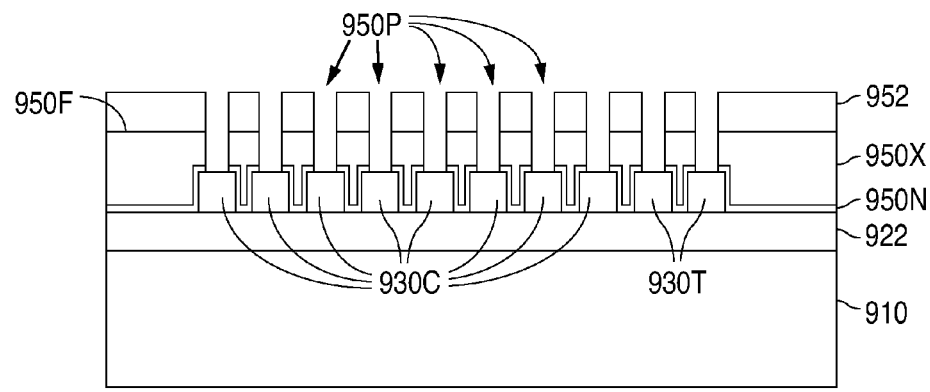
Figure 25C:
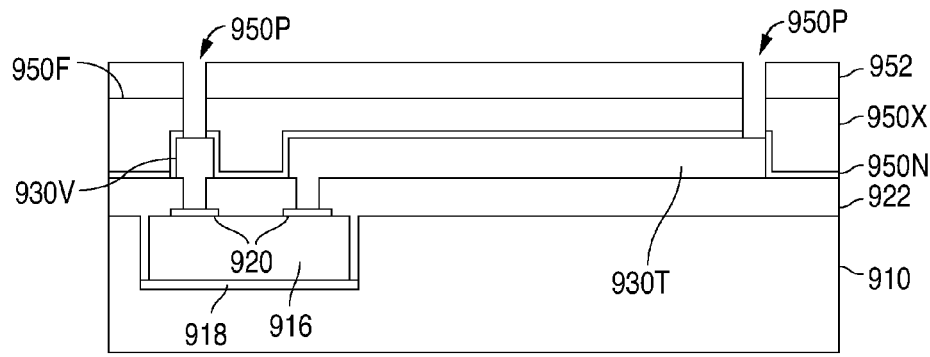

After hard mask 952 has been formed, as shown in FIGS. 25A-25C, the exposed regions of oxide layer 950X and nitride layer 950N are etched away to form the openings 950P that exposes the via structures 930V, one end of each via trace 930T, and the opposite ends of each lower coil structure 930C. After the via structures 930V, one end of each via trace 930T, and the opposite ends of each lower coil structure 930C have been exposed, hard mask 952 is removed in a conventional manner to form non-conductive structure 950. Alternately, depending on the thickness of the dielectric to be etched, a thick patterned photoresist layer can be used in lieu of hard mask 952.

When the metal lower structures 930 are formed as in the first embodiment (electroplated), nitride layer 926 of non-conductive structure 922 and nitride layer 950N of non-conductive structure 950 surround the copper structures and prevent copper diffusion. Alternately, when the metal lower structures 930 are formed as in the second embodiment (metal deposition, mask, and etch), silicon nitride layers 926 and 950N can be omitted when a copper diffusion barrier is not required.

Figure 26A:
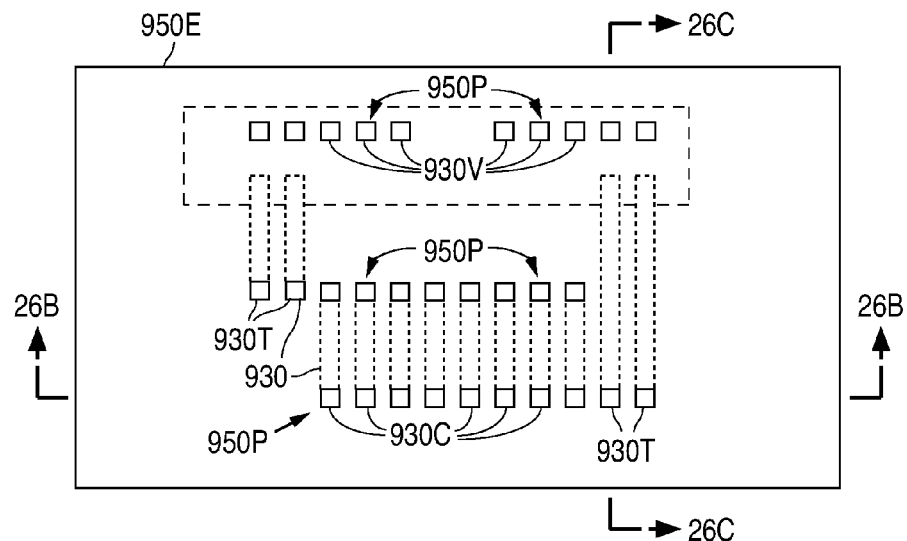
Figure 26B:
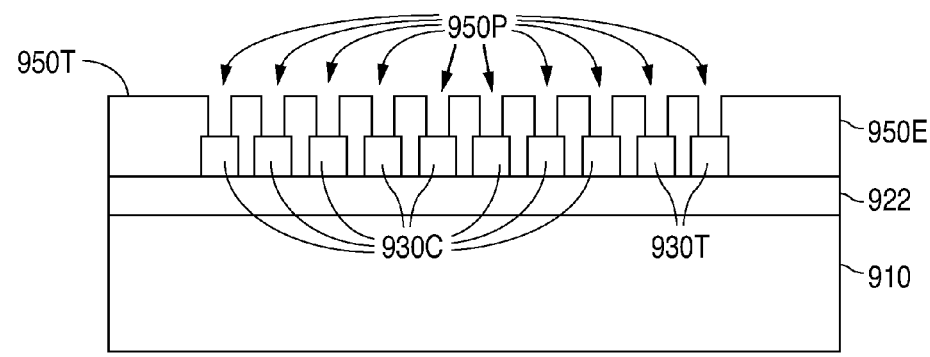
Figure 26C:
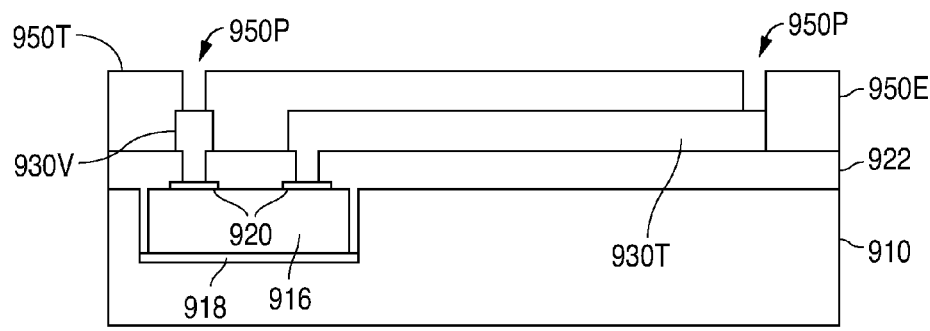

Alternately, as shown in FIGS. 26A-26C, non-conductive structure 950 can be formed by depositing a layer of photoimageable epoxy or polymer 950E on non-conductive structure 922. The photoimageable epoxy or polymer layer 950E can be implemented with, for example, SU-8, benzocyclobutene (BCB), or polybenzoxazole (PBO), which are substantially self planarizing.

Once photoimageable epoxy or polymer layer 950E has been deposited, the openings 950P are formed in photoimageable epoxy or polymer layer 950E by projecting a light through a mask to form a patterned image on layer 950E that softens the regions of layer 950E that are exposed by the light, and then removing the softened regions of layer 950E.

Figure 27A:
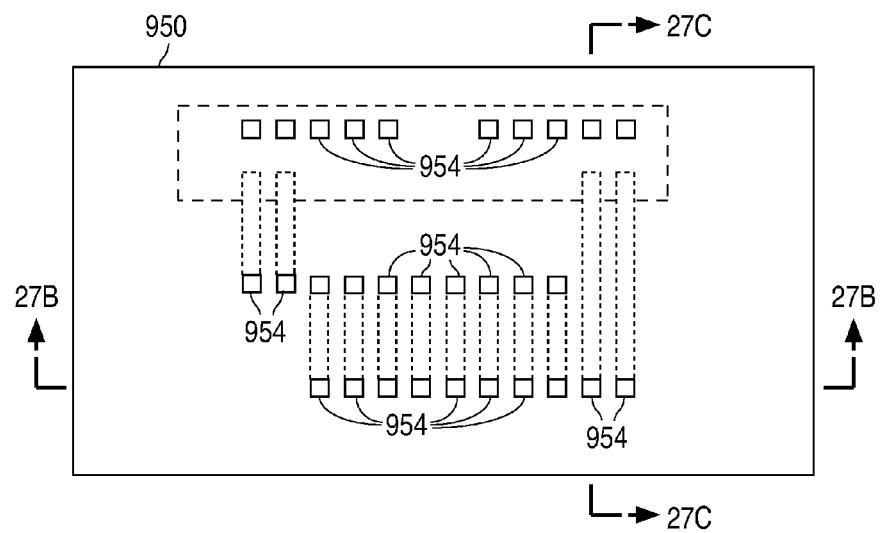
Figure 27B:
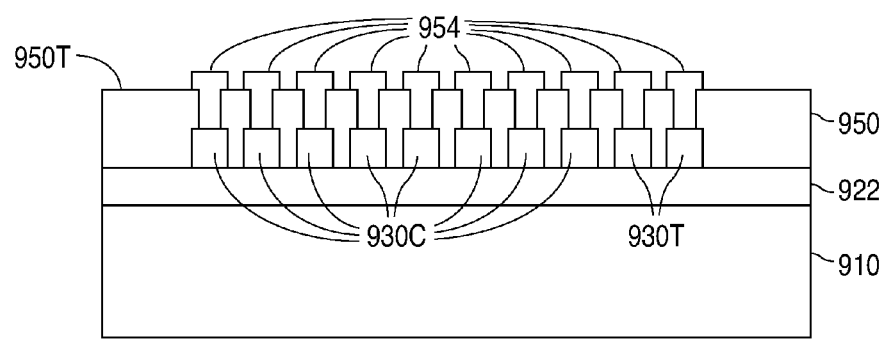
Figure 27C:
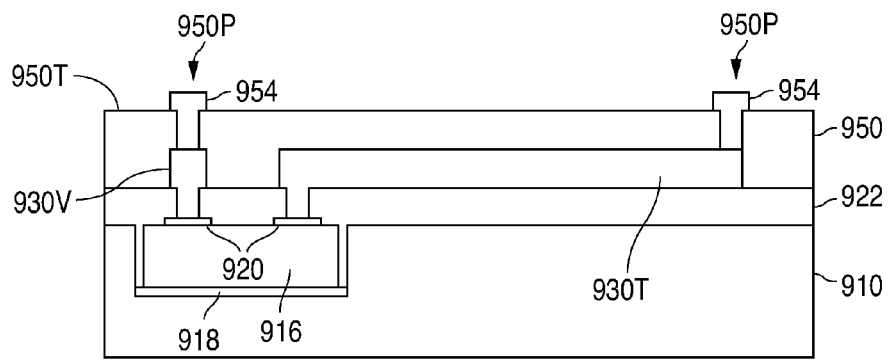

As shown in FIGS. 27A-27C, after non-conductive structure 950 has been formed, a number of via structures 954 are formed in the openings 950P to make electrical connections to the via structures 930V, one end of each via trace 930T, and the opposite ends of each lower coil structure 930C. The via structures 954 can be formed in a number of different ways.

Figure 28A:
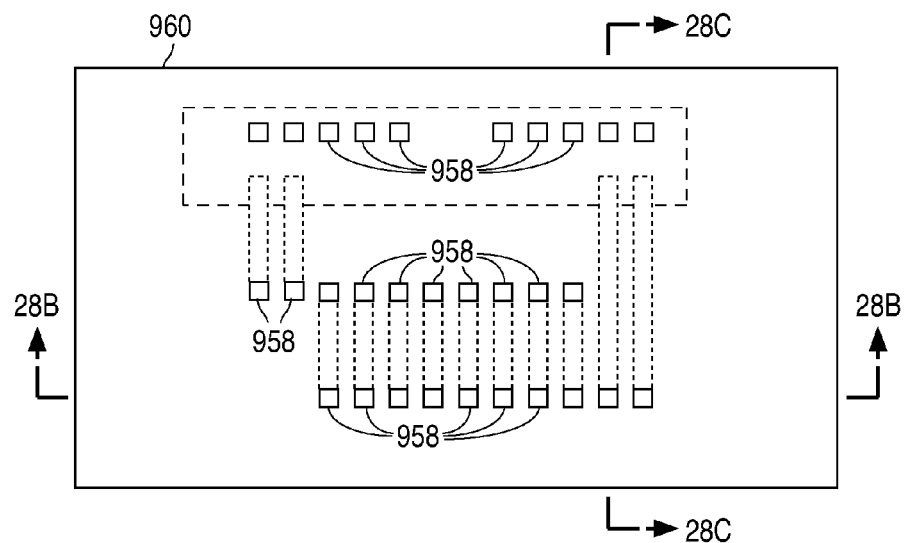
Figure 28B:
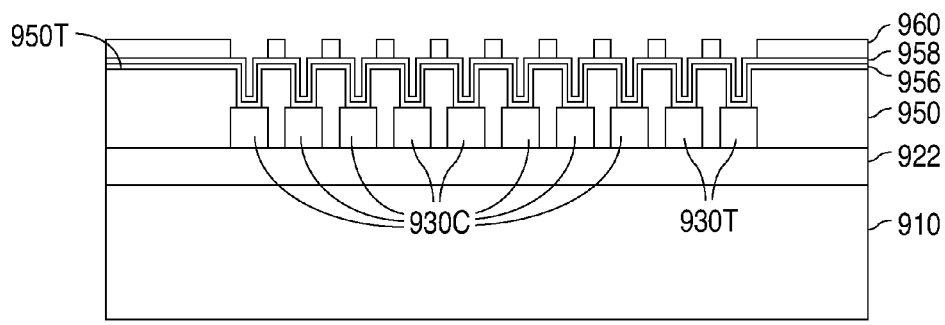
Figure 28C:
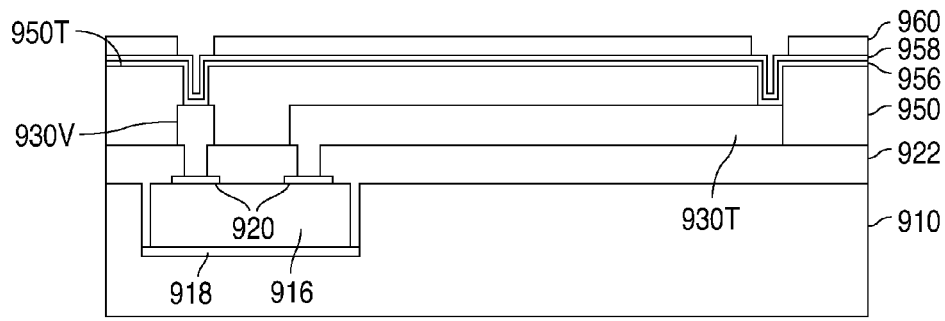

In a first embodiment, as shown in FIGS. 28A-28C, the via structures 954 are formed by first depositing a copper diffusion barrier layer 956 on non-conductive structure 950 to line the openings 950P. Barrier layer 956 can be implemented with, for example, nitride, titanium nitride, titanium, or tantalum.

If barrier layer 956 is non-conductive, then a patterned photoresist layer is formed on barrier layer 956, followed by an etch to remove a portion of barrier layer 956. The portion of barrier layer 956 removed by the etch exposes the top surfaces of the via structures 930V, one end of each via trace 930T, and the opposite ends of each lower coil structure 930C.

After barrier layer 956, which is illustrated as a conductive barrier layer, has been formed, a seed layer 958 is conventionally formed on barrier layer 956 (and the exposed top surfaces of the via structures 930V, one end of each via trace 930T, and the opposite ends of each lower coil structure 930C when a non-conductive barrier layer is used). For example, seed layer 958 can be implemented with a layer of aluminum copper. Seed layer 958 can alternately be formed by depositing 300 Å of titanium, 3000 Å of copper, and 300 Å of titanium. After seed layer 958 has been formed, a plating mold 960 is formed on the top surface of seed layer 958.

Figure 29A:
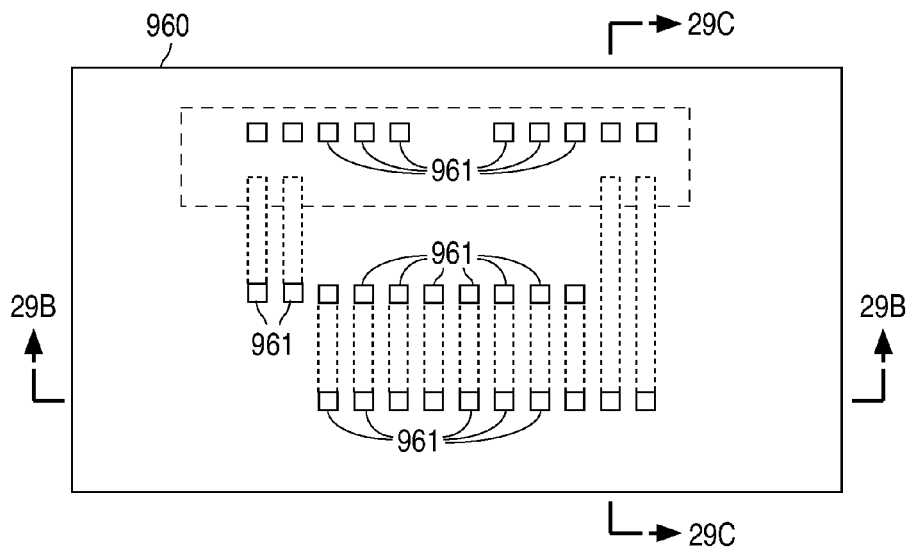
Figure 29B:
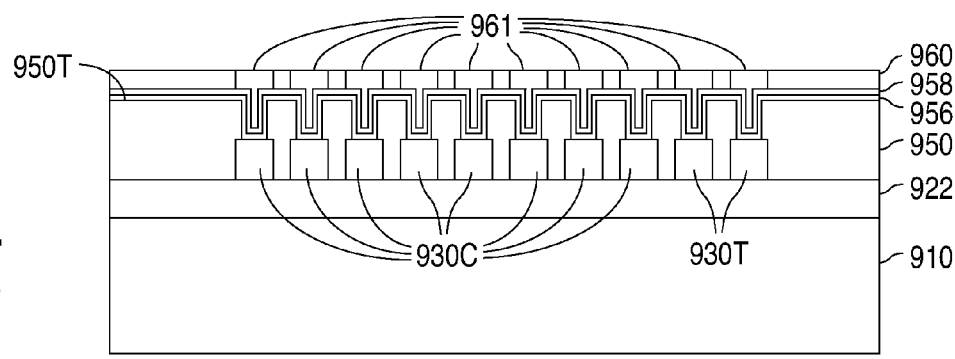
Figure 29C:
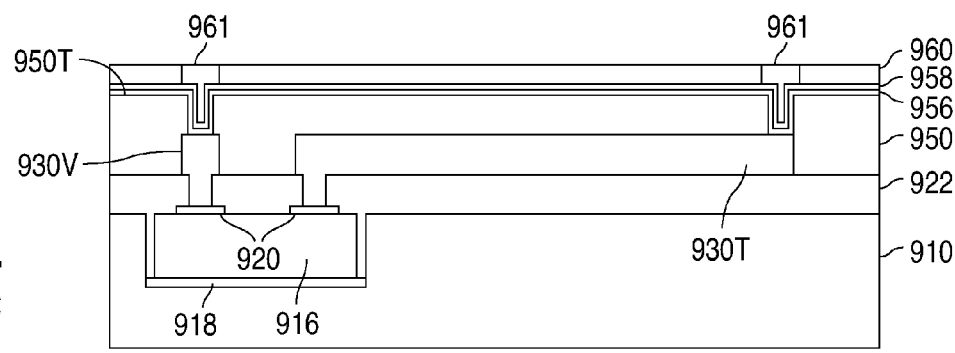
Figure 30A:
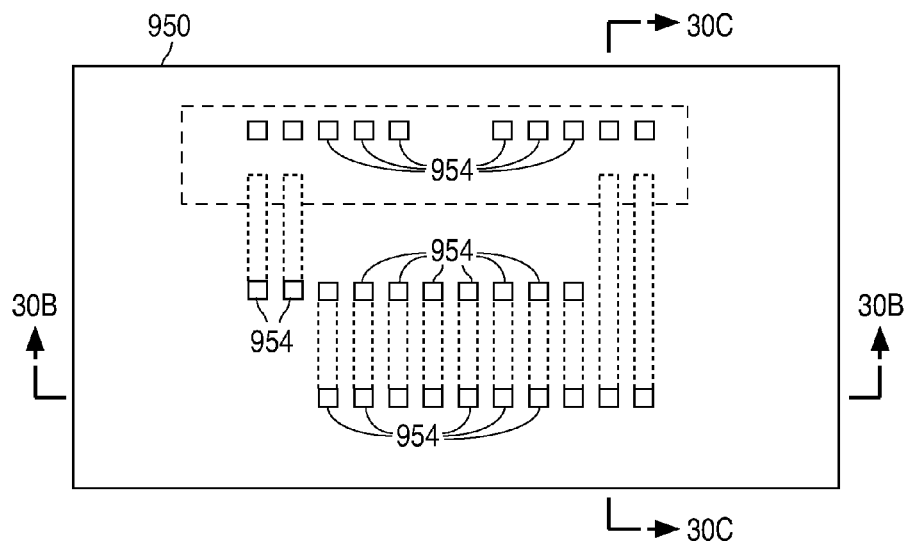
Figure 30B:
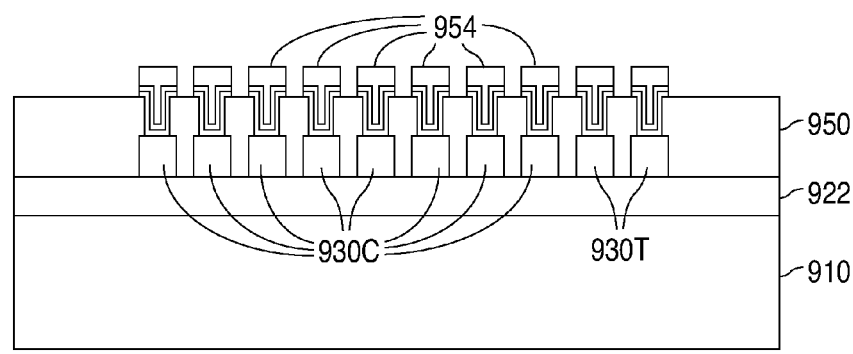
Figure 30C:
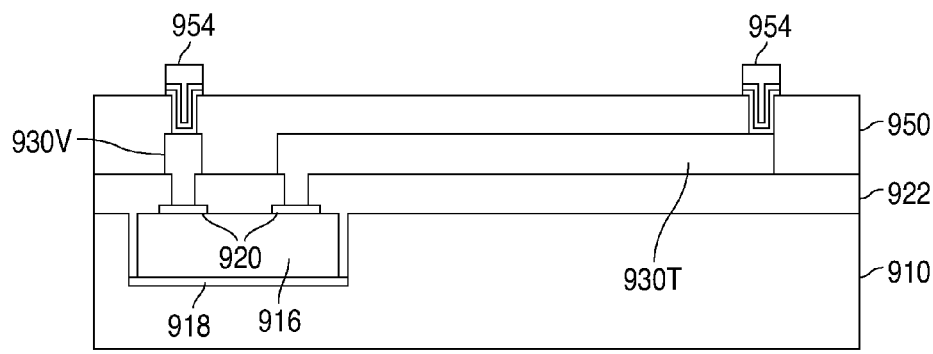

As shown in FIGS. 29A-29C, following the formation of plating mold 960, copper is electroplated in a conventional manner approximately 5 μm thick to form copper structures 961 in the openings 950P. After this, as shown in FIGS. 30A-30C, plating mold 960 and the exposed regions of seed layer 958 and barrier layer 956 are removed in a conventional manner to complete the formation of the via structures 954.

Figure 31A:
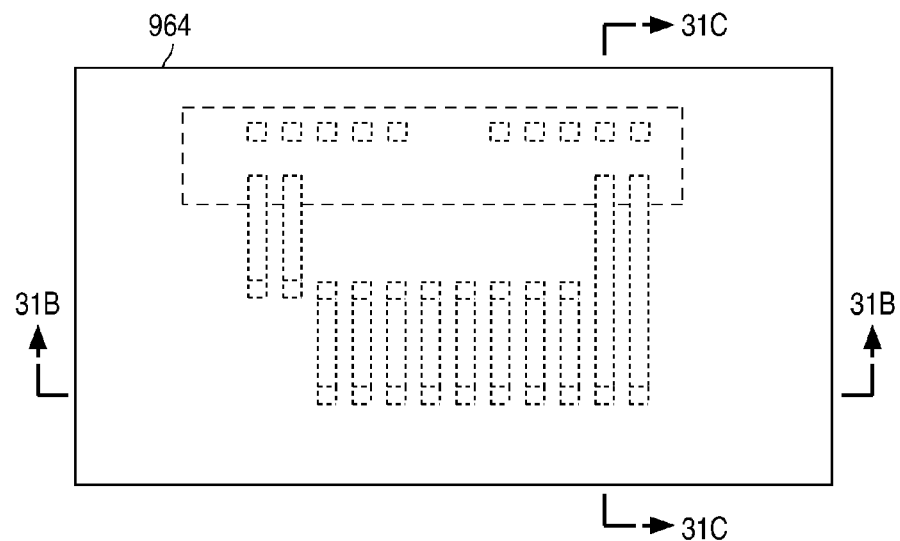
Figure 31B:
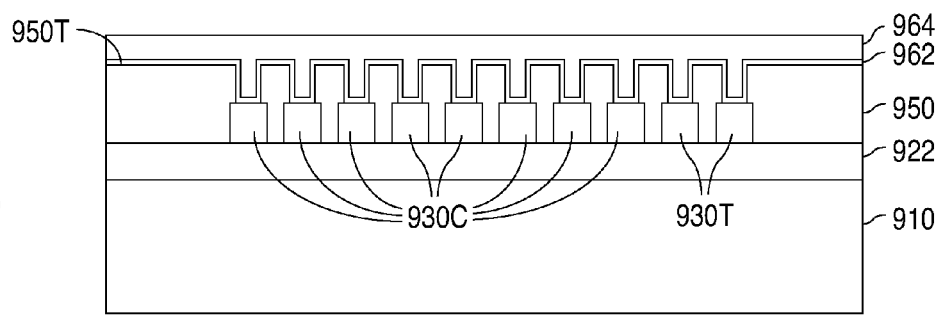
Figure 31C:
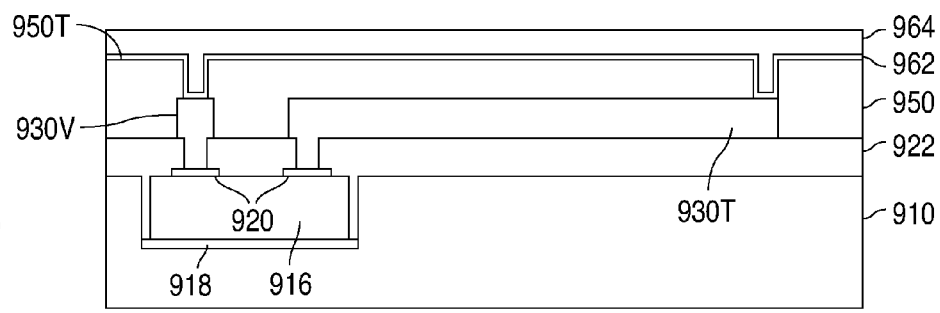

In a second embodiment, as shown in FIGS. 31A-31C, the via structures 954 are formed by first depositing a liner layer 962 on non-conductive structure 950 to line the openings 950P. Liner layer 962 can be implemented with, for example, titanium/titanium nitride. After liner layer 962 has been formed, a metal layer 964, such as tungsten, is conventionally deposited on liner layer 962 to fill up the openings 950P.

Figure 32A:
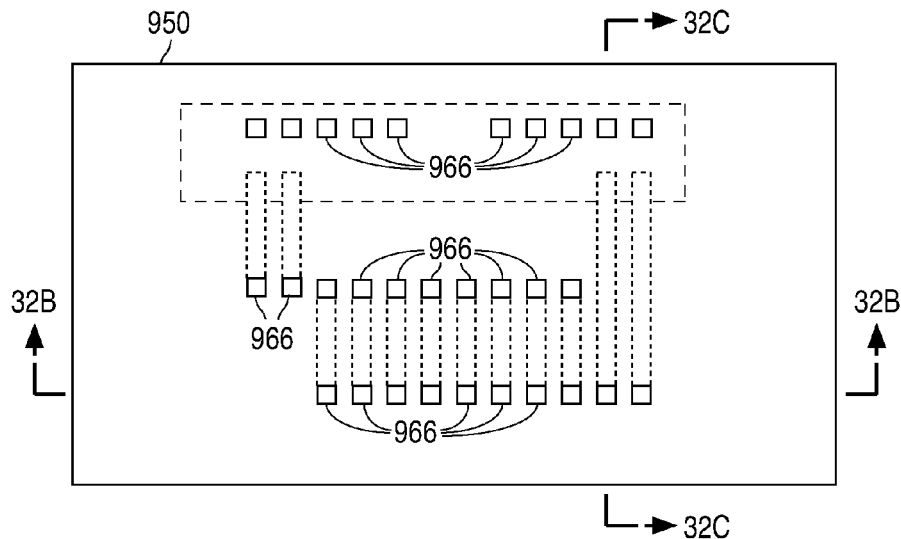
Figure 32B:
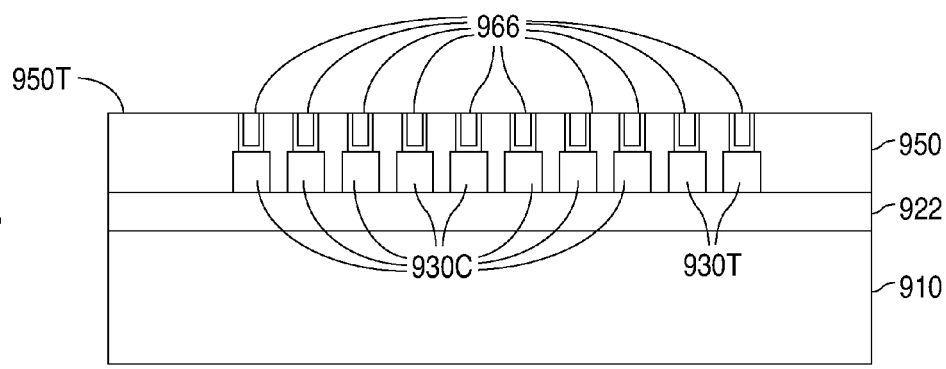
Figure 32C:
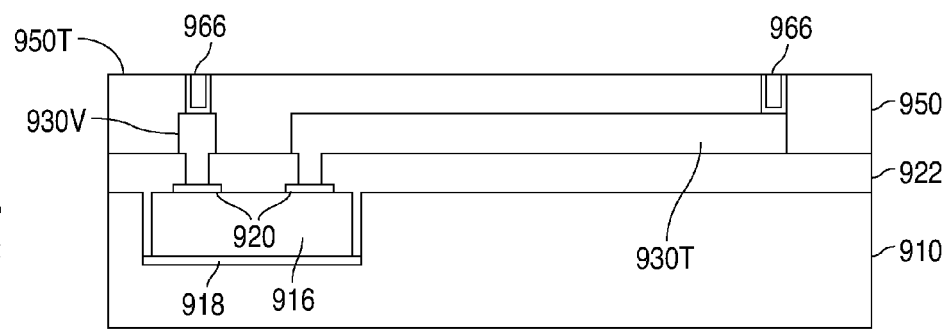

Following this, as shown in FIGS. 32A-32C, metal layer 964 is planarized, such as with chemical-mechanical polishing, to expose the top surface of non-conductive structure 950, and form via plug structures 966 in the openings 950P that make electrical connections to the via structures 930V, one end of each via trace 930T, and the opposite ends of each lower coil structure 930C.

Figure 33A:
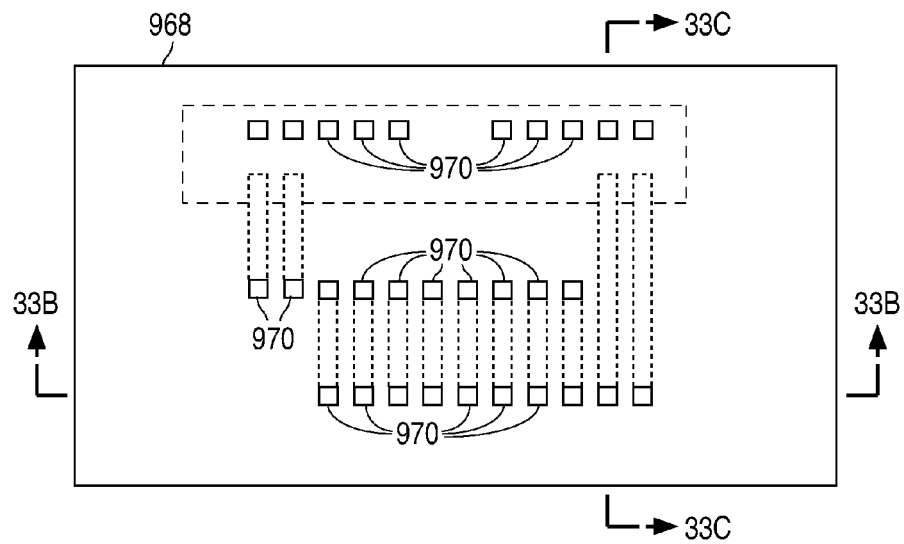
Figure 33B:
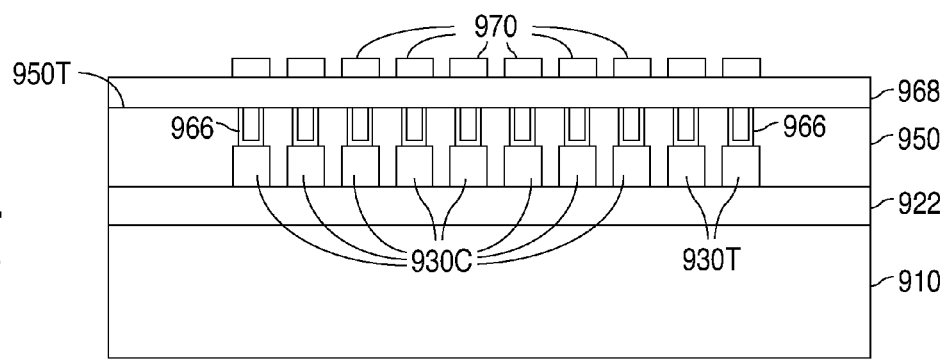
Figure 33C:
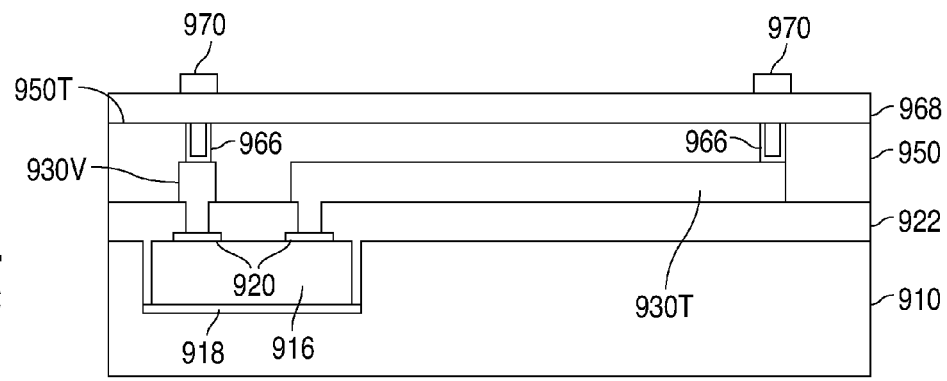

As shown in FIGS. 33A-33C, after the via plug structures 966 have been formed, a metal layer 968, such as aluminum, is sputter deposited onto the non-conductive top surface 950T of non-conductive structure 950 to a depth of approximately 5 μm. Alternately, metal layer 968 can include multiple layers of metal such as, for example, a layer of titanium, a layer of titanium nitride, a layer of aluminum copper, a layer of titanium nitride, and a layer of titanium nitride.

Once metal layer 968 has been formed, a patterned photoresist layer 970 approximately 1.0 μm thick is formed on the top surface of metal layer 968 in a conventional manner. Following the formation of patterned photoresist layer 970, metal layer 968 is etched to remove the exposed regions of metal layer 968 and form the via structures 954 in the openings 950P that make electrical connections to the via structures 930V, one end of each via trace 930T, and the opposite ends of each lower coil structure 930C.

Metal layer 968 can be etched using a dry etch such as reactive ion etching, or a timed wet etch. For example, aluminum can be wet etched in a 10:1 hydrogen fluoride solution for the necessary period of time. After the etch, the resulting structure is rinsed, and patterned photoresist layer 970 is then removed in a conventional manner, such as with acetone. Once patterned photoresist layer 970 has been removed, the resulting structure is conventionally cleaned to remove organics, such as with a Piranha etch.

Figure 34A:
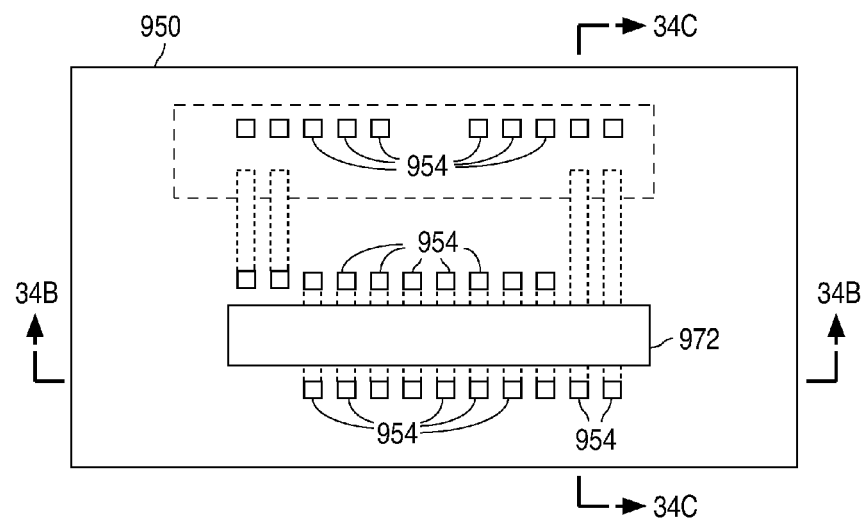
Figure 34B:
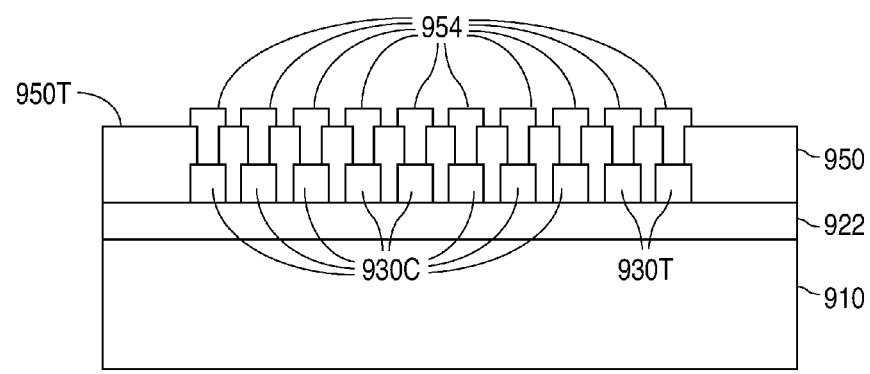
Figure 34C:
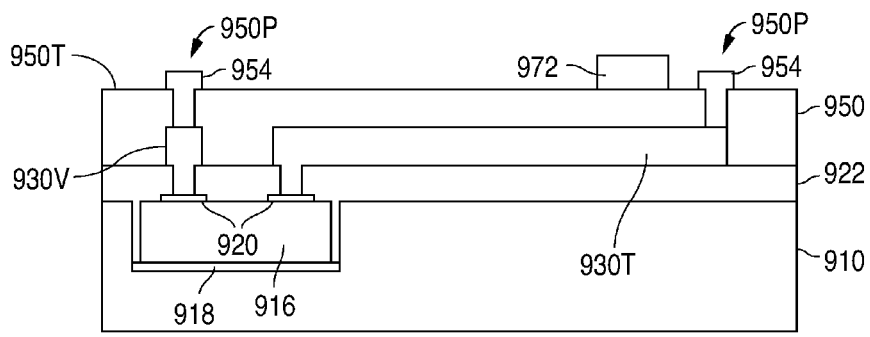

As shown in FIGS. 34A-34C, after the via structures 954 have been formed, a magnetic core structure 972 is formed on the top surface 950T of non-conductive structure 950. Magnetic core structure 972, in turn, can be formed in a number of ways.

Figure 35A:
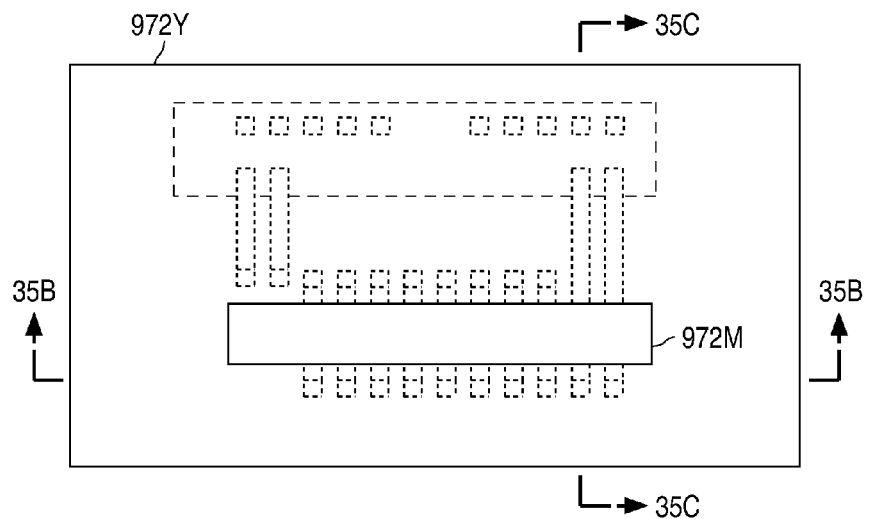
Figure 35B:
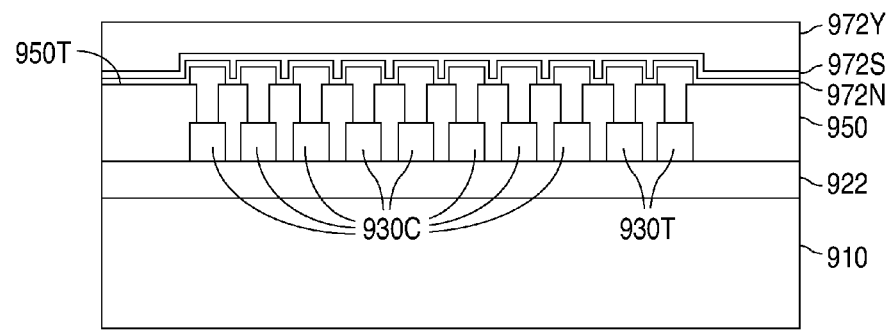
Figure 35C:
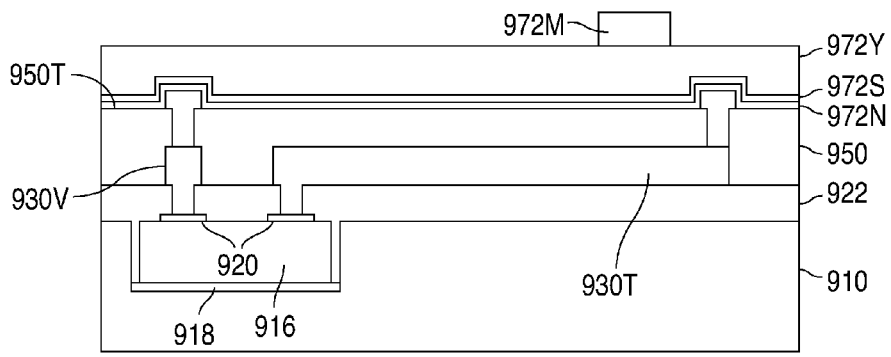

In a first embodiment, as shown in FIGS. 35A-35C, a layer of silicon nitride 972N approximately 0.6 μm thick is deposited on the top surface of non-conductive structure 950 and the via structures 954, followed by the deposition of a seed layer 972S on the top surface of nitride layer 972N. For example, seed layer 972S can be implemented with a layer of aluminum copper. Seed layer 972S can alternately be formed by depositing 300 Å of titanium, 3000 Å of copper, and 300 Å of titanium.

After seed layer 972S has been formed, a magnetic material with a high permeability and a low resistance, such as an alloy of nickel and iron like permalloy, is electroplated to a thickness of, for example, 5 μm to form a magnetic material layer 972Y. Following this, a patterned photoresist mask 972M is formed on magnetic material layer 972Y.

Next, as illustrated in FIGS. 36A-36C, the exposed regions of magnetic material layer 972Y and seed layer 972S are etched and removed to form magnetic core structure 972. In this example, nitride layer 972N is left in place, but the exposed regions of nitride layer 972N could alternately be removed. Patterned photoresist layer 972M is then removed in a conventional manner, such as with acetone. Once patterned photoresist layer 972M has been removed, the resulting structure is conventionally cleaned to remove organics. In addition, a plating mold can alternately be used to define the regions where the magnetic material is to be electroplated.

Figure 37A:
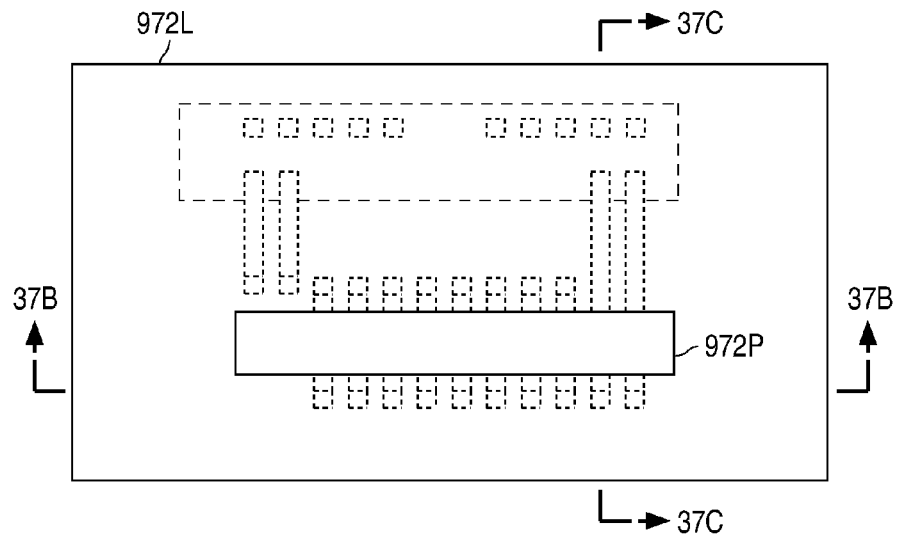
Figure 37B:
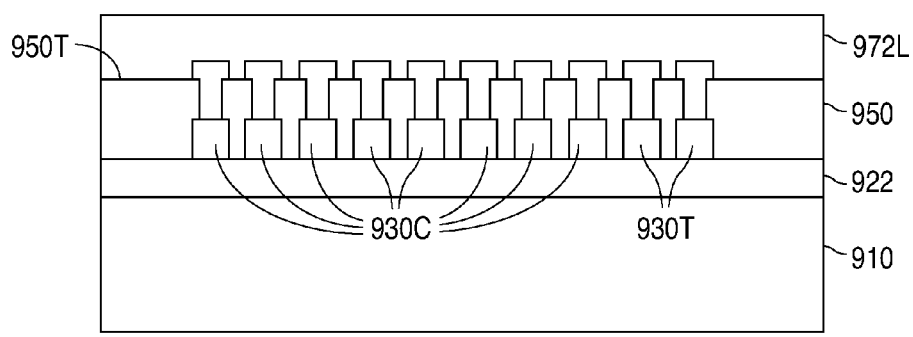
Figure 37C:
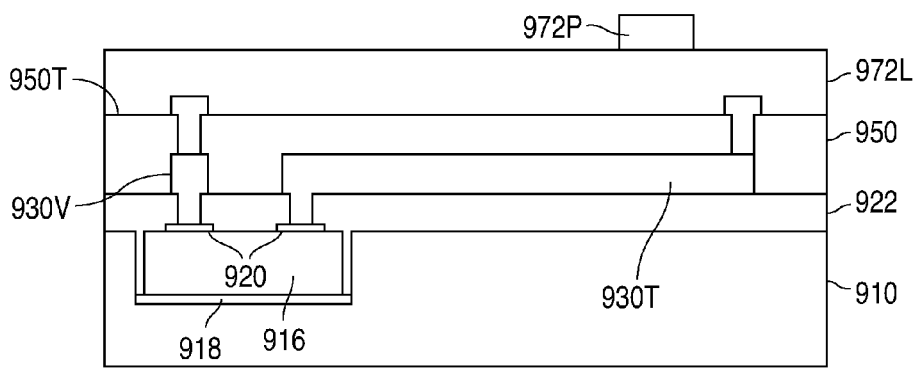

In a second embodiment, as shown in FIGS. 37A-37C, a magnetic material layer 972L is sputter deposited on the top surface 950T of non-conductive structure 950 and the via structures 954. Magnetic material layer 972L can be implemented with, for example, cobalt tantalum zirconium (CoTaZr) or permalloy, materials which have a high permeability and a low resistance.

Following this, a patterned photoresist layer 972P is formed on magnetic material layer 972L. After patterned photoresist layer 972P has been formed, the exposed regions of magnetic material layer 972L are etched and removed to form magnetic core structure 972. Patterned photoresist layer 972P is then removed in a conventional manner, such as with acetone. Once patterned photoresist layer 972L has been removed, the resulting structure is conventionally cleaned to remove organics.

In the present example, the magnetic materials 972Y and 972L are subjected to the presence of a strong magnetic field that so that the magnetic materials 972Y and 972L are uniaxially anisotropic. The strong magnetic field can be applied during the plating or deposition of the magnetic material. Alternately, the strong magnetic field can be applied during an anneal at elevated temperatures after the plating or deposition of the magnetic material.

Figure 38A:
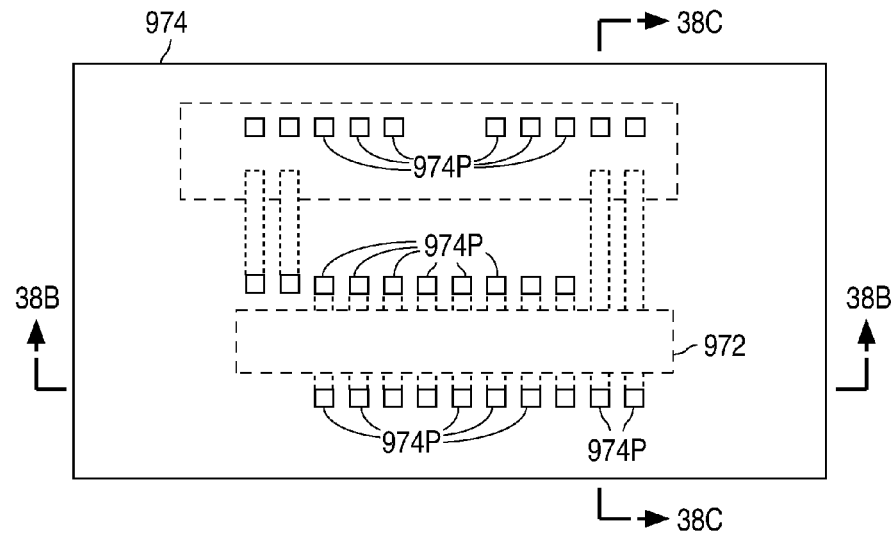
Figure 38B:
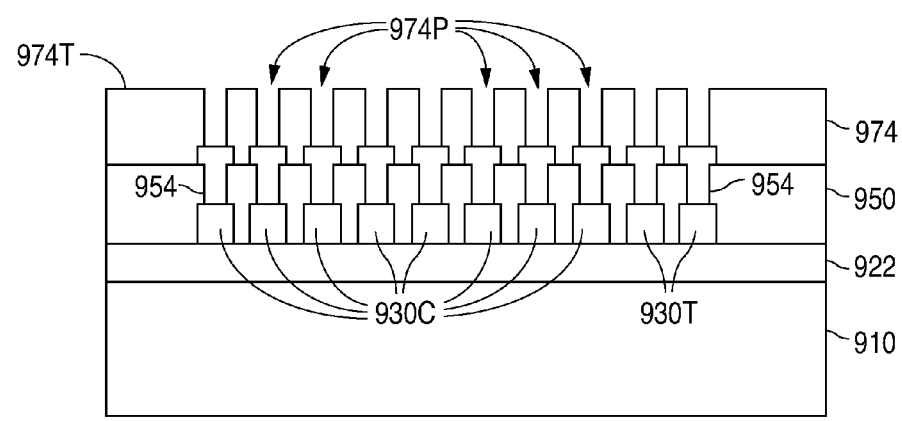
Figure 38C:
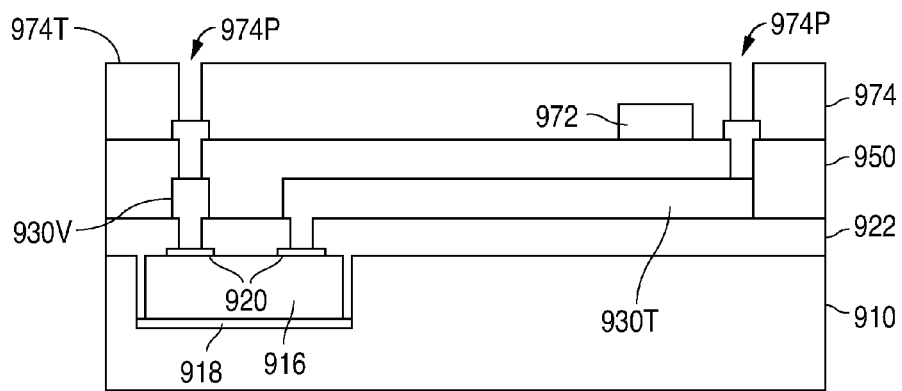

Following the formation of magnetic core structure 972, as shown in FIGS. 38A-38C, a non-conductive structure 974 is formed on non-conductive structure 950, the via structures 954, and magnetic core structure 972. Non-conductive structure 974 has a substantially planar top surface 974T, and a number of openings 974P that expose the via structures 954. Dielectric structure 974 can be formed in a number of different ways.

Figure 39A:
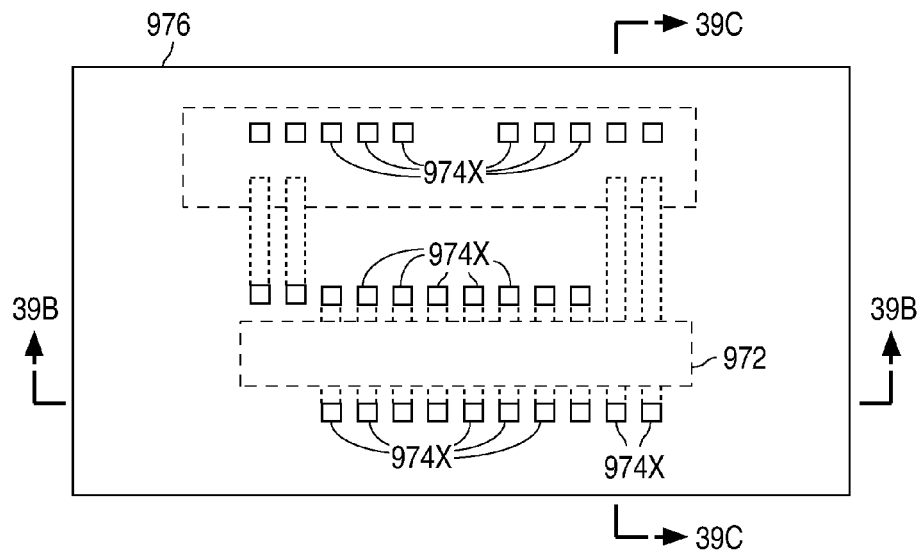
Figure 39B:
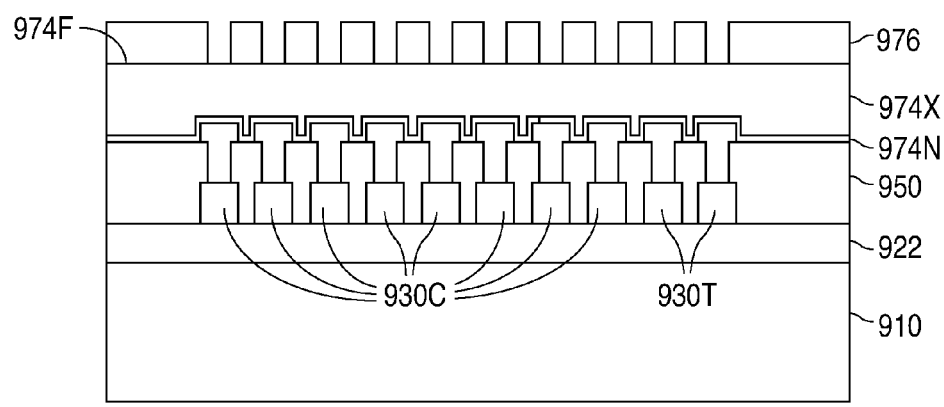
Figure 39C:
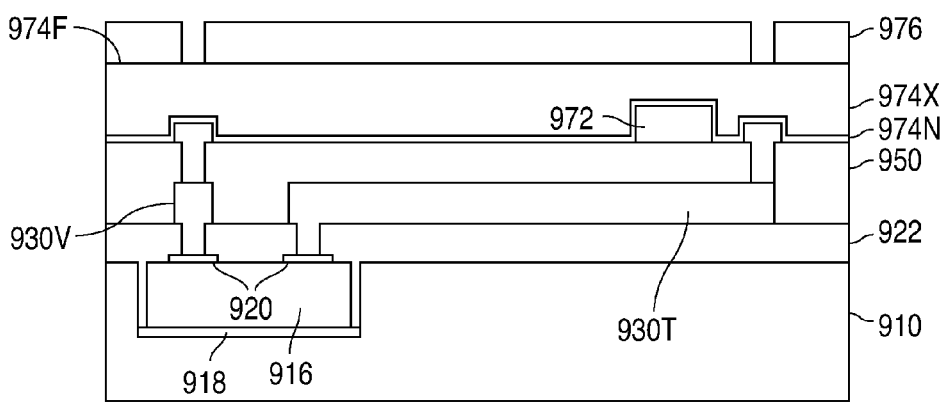

For example, as shown in FIGS. 39A-39C, in a first embodiment, non-conductive structure 974 can be formed by conventionally depositing a silicon nitride layer 974N approximately 0.6 µm thick on non-conductive structure 950, the via structures 954, and magnetic core structure 972. After this, a layer of silicon dioxide 974X is conventionally formed on the top surface of silicon nitride layer 974N.

Following the formation of oxide layer 974X, oxide layer 974X is planarized in a conventional manner, such as with chemical-mechanical polishing, until oxide layer 974X has a substantially planar top surface 974F. Once oxide layer 974X has been planarized, a hard mask 976 is formed on substantially planar top surface 974F of oxide layer 974X.

Figure 40A:
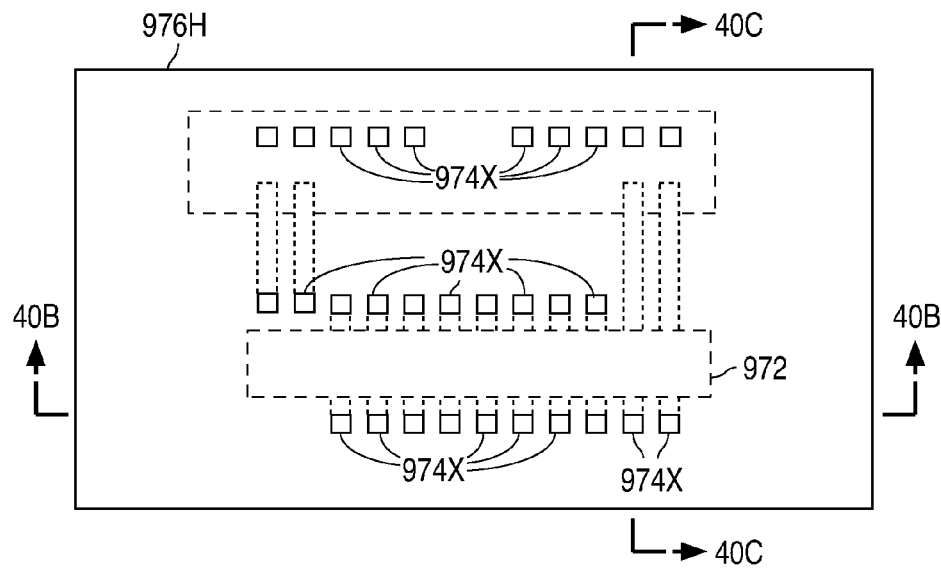
Figure 40B:
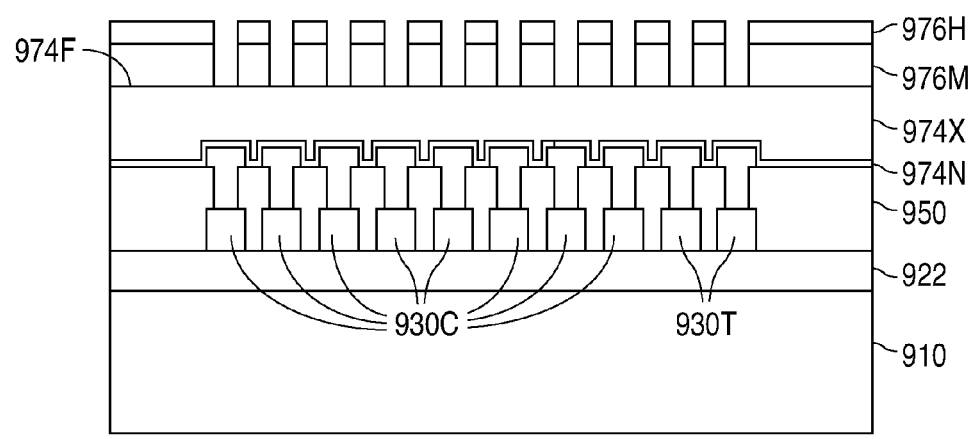
Figure 40C:
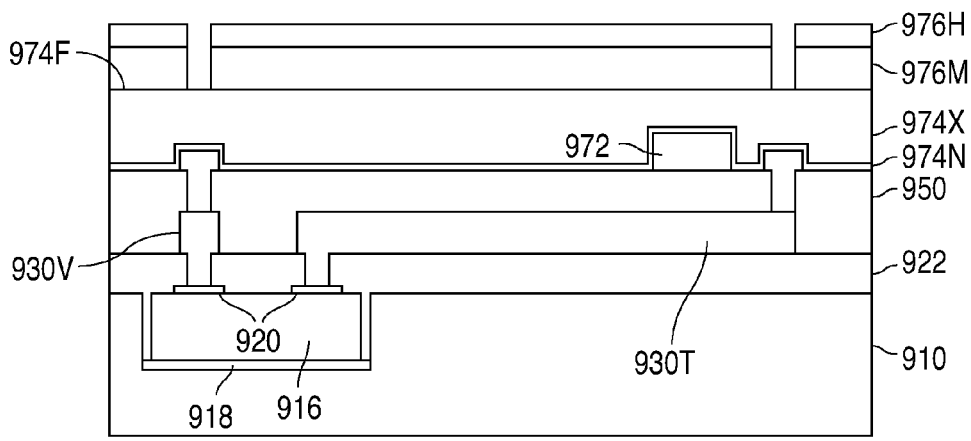

As shown in FIGS. 40A-40C, hard mask 976 can be formed by conventionally depositing a layer of masking material 976M, such as a layer of aluminum, or a layer of oxide with an overlying layer of nitride, followed by the conventional formation of a patterned photoresist layer 976H. Following this, the exposed regions of masking material 976M are etched to form the openings in hard mask 976. Patterned photoresist layer 976H is then removed in a conventional manner to complete the formation of hard mask 976.

Figure 41A:
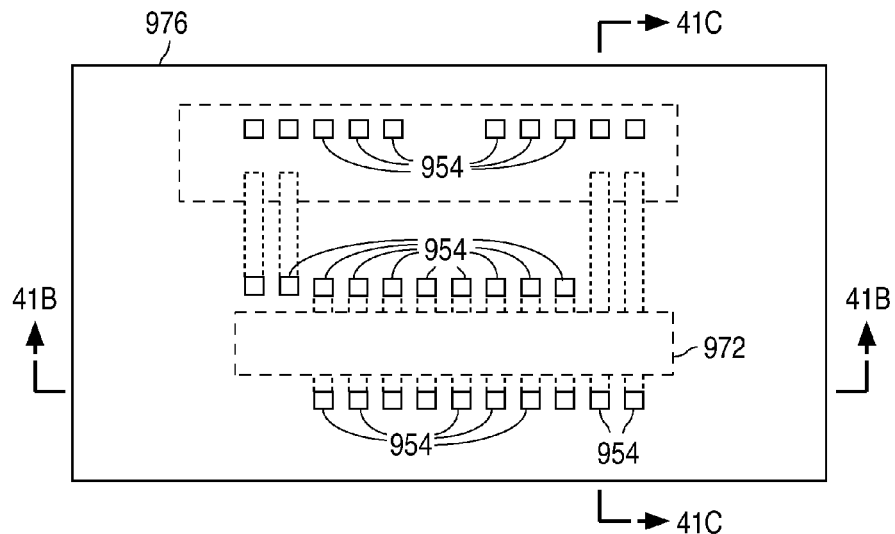
Figure 41B:
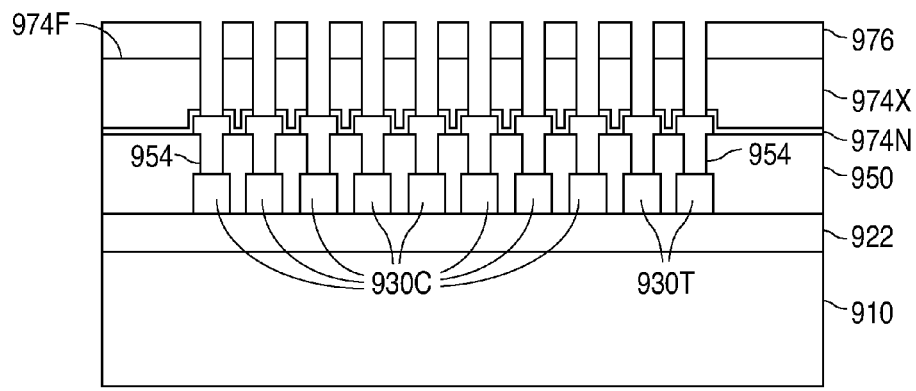
Figure 41C:
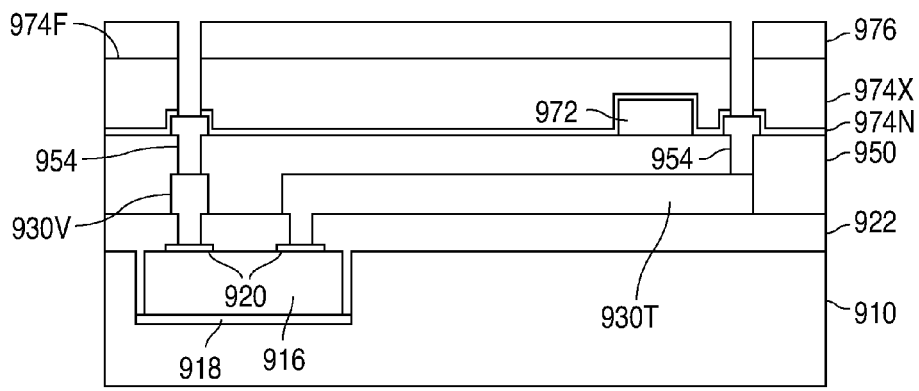

After hard mask 976 has been formed, as shown in FIGS. 41A-41C, the exposed regions of oxide layer 974X and nitride layer 974N are etched away to form the openings 974P that expose the via structures 954. After the via structures 954 have been exposed, hard mask 976 is removed in a conventional manner to form non-conductive structure 974. Alternately, depending on the thickness of the dielectric to be etched, a thick patterned photoresist layer can be used in lieu of hard mask 976.

When the via structures 954 are formed as in the first embodiment (electroplated), nitride layer 950N of non-conductive layer 950, barrier layer 956, and nitride layer 974N surround the copper structures and prevent copper diffusion. Nitride layers 972N and 974N also surround magnetic core structure 972. Alternately, when the via structures 954 are formed as in the second embodiment (metal deposition, planarization, metal deposition, mask, and etch), silicon nitride layers 950N and 974N can be omitted when a copper diffusion barrier is not required.

Figure 42A:
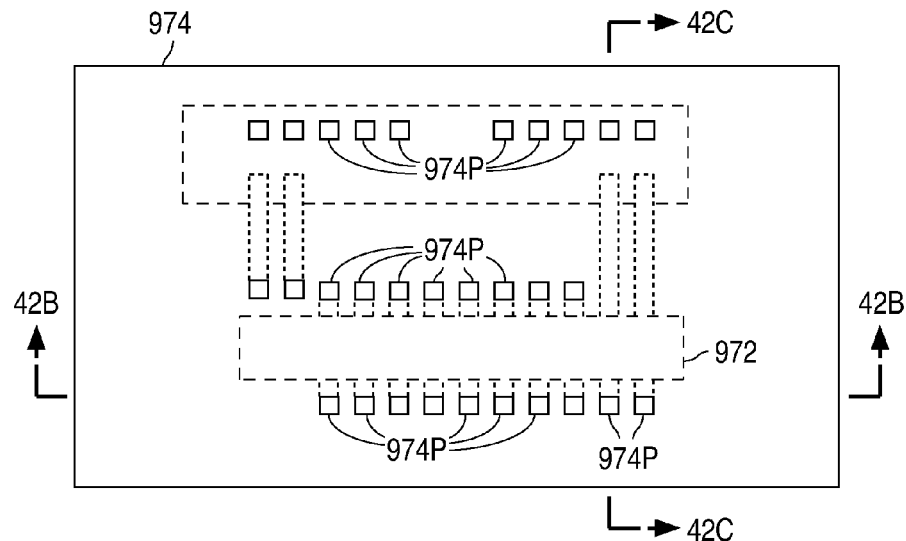
Figure 42B:
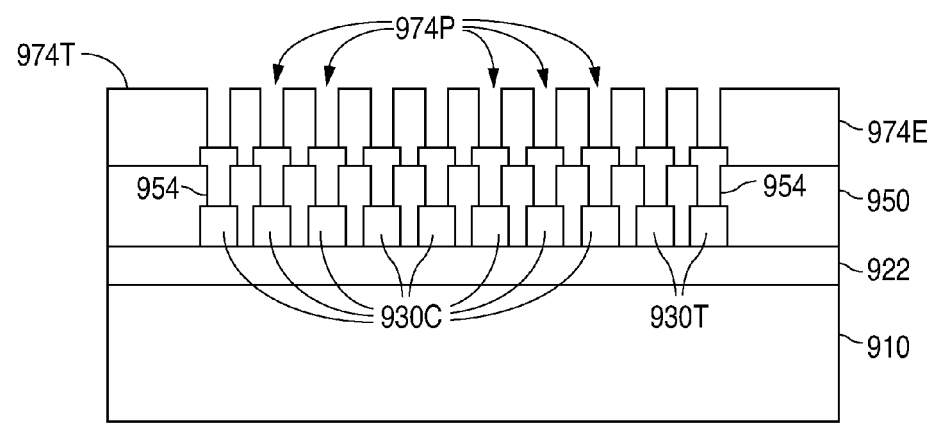
Figure 42C:
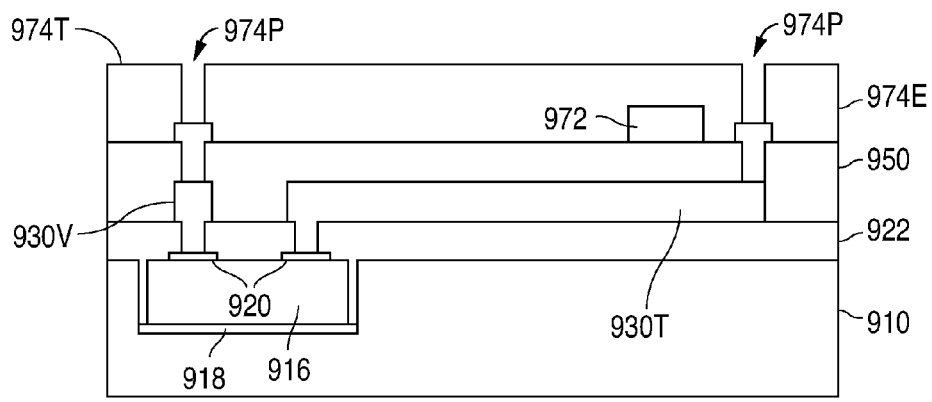

Alternately, as shown in FIGS. 42A-42C, non-conductive structure 974 can be formed by depositing a layer of photoimageable epoxy or polymer 974E on non-conductive structure 950. The photoimageable epoxy or polymer layer 974E can be implemented with, for example, SU-8, benzocyclobutene (BCB), or polybenzoxazole (PBO), which are substantially self planarizing.

Once photoimageable epoxy or polymer layer 974E has been deposited, the openings 974P are formed in photoimageable epoxy or polymer layer 974E by projecting a light through a mask to form a patterned image on layer 974E that softens the regions of layer 974E that are exposed by the light, and then removing the softened regions of layer 974E.

Figure 43A:
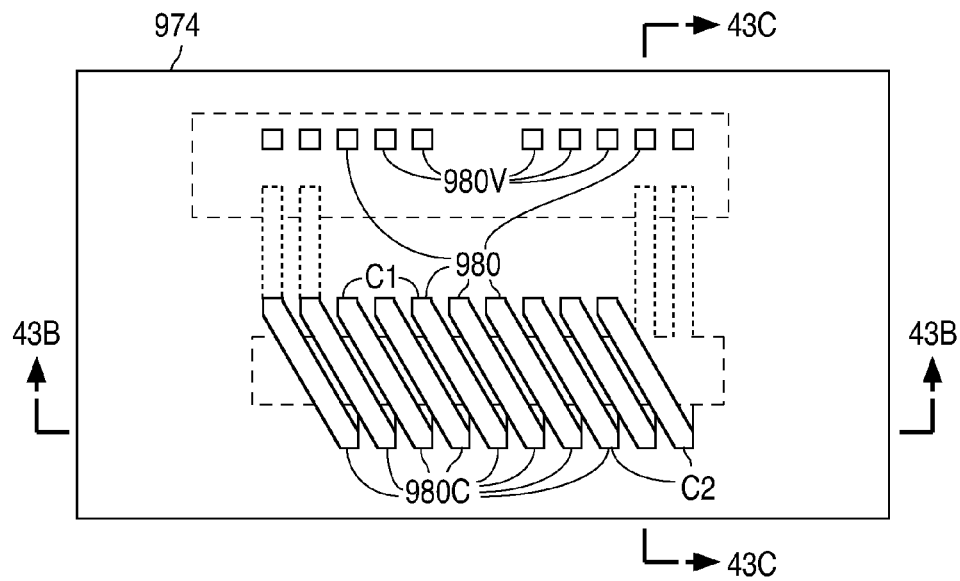
Figure 43B:
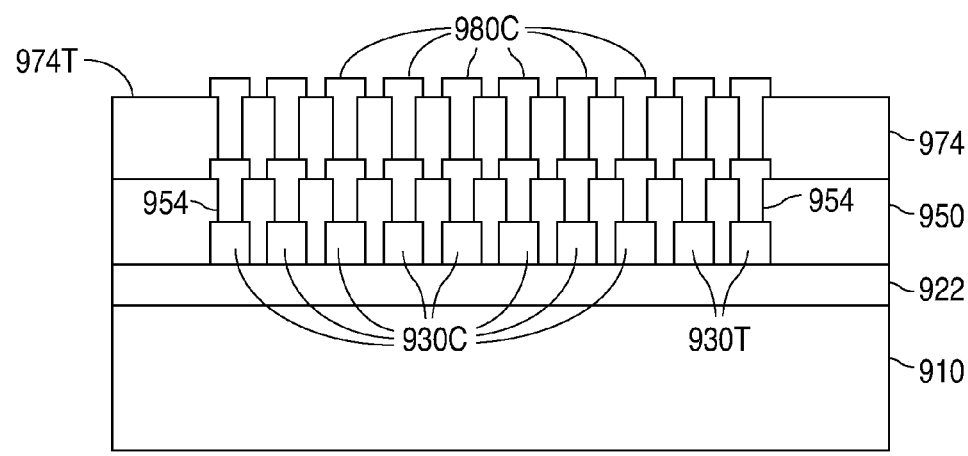
Figure 43C:
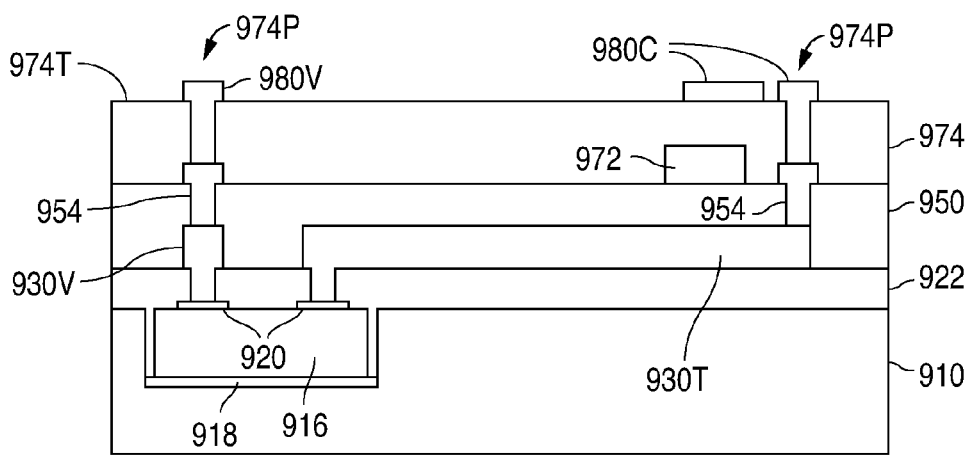

As shown in FIGS. 43A-43C, after non-conductive structure 974 has been formed, a number of metal upper structures 980 are formed to touch non-conductive structure 974. The metal upper structures 980 include a number of upper via structures 980V that are connected to the via structures 954 which are connected to the via structures 930V, and a number of upper coil structures 980C that are connected to the via structures 954 which are connected to the lower coil structures 930C, and the via structures 954 which are connected to the ends of the via traces 930T.

The electrical connection of the upper coil structures 980C, the lower coil structures 930C, and the via structures 954 that are connected to the upper coil structures 980C and the lower coil structures 930C form a fluxgate magnetometer that has a drive coil C1 and a sense coil C2 which are wrapped around magnetic core structure 972. The metal upper structures 980 can be formed in a number of different ways.

Figure 44A:
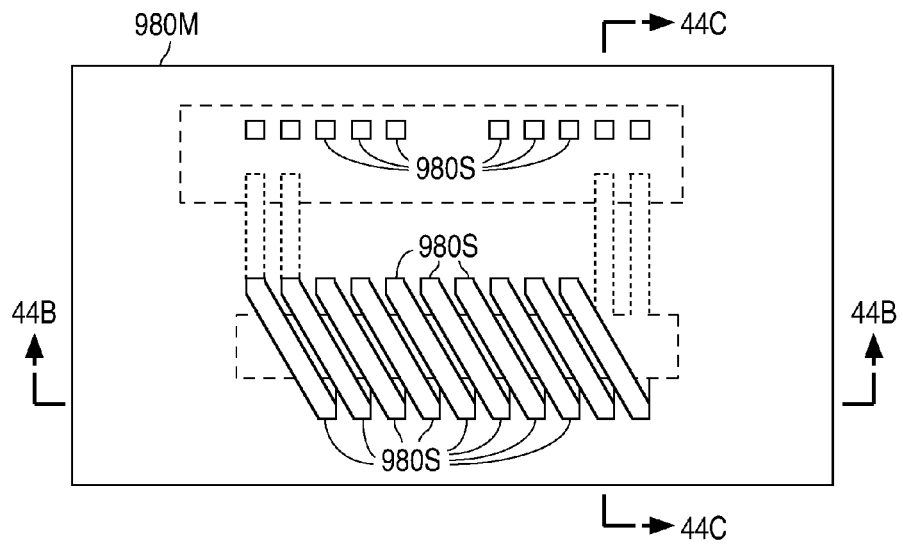
Figure 44B:
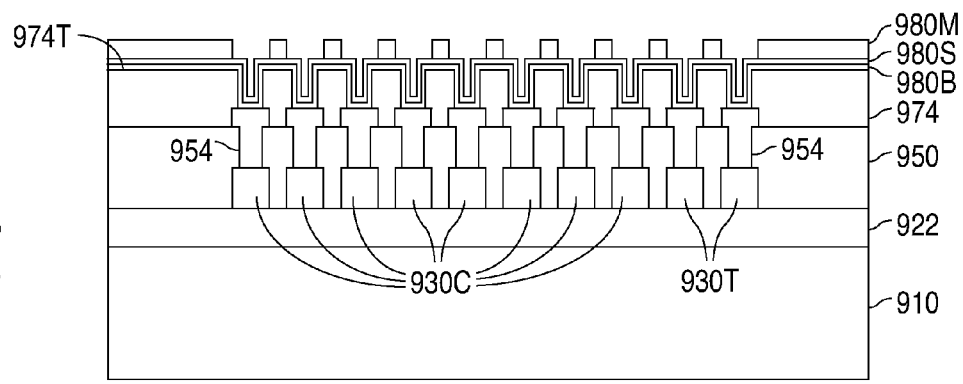
Figure 44C:
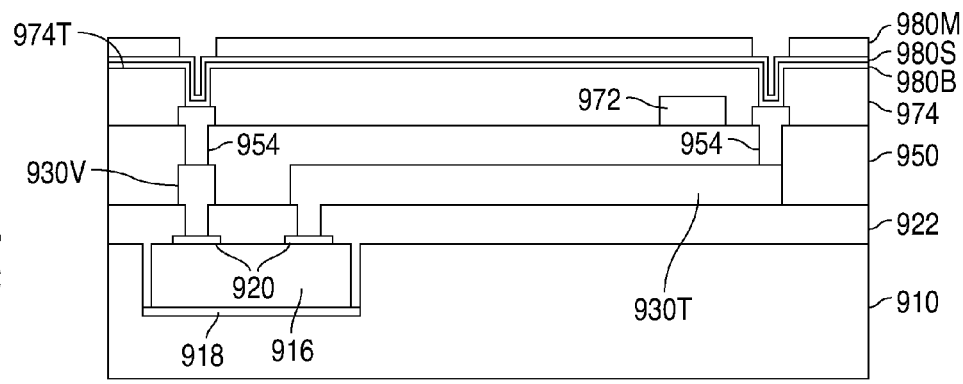

In a first embodiment, as shown in FIGS. 44A-44C, the metal upper structures 980 are formed by first depositing a copper diffusion barrier layer 980B on non-conductive structure 974 to line the openings 974P. Barrier layer 980B can be implemented with, for example, nitride, titanium nitride, titanium, or tantalum.

If barrier layer 980B is non-conductive, then a patterned photoresist layer is formed on barrier layer 980B, followed by an etch to remove a portion of barrier layer 980B. The portion removed by the etch exposes the top surfaces of the via structures 954. After barrier layer 980B, which is illustrated as a conductive barrier layer, has been formed, a seed layer 980S is conventionally formed on barrier layer 980B (and the top surfaces of the via structures 954 when a non-conductive barrier layer is used).

For example, seed layer 980S can be implemented with a layer of aluminum copper. Seed layer 980S can alternately be formed by depositing 300 Å of titanium, 3000 Å of copper, and 300 Å of titanium. After seed layer 980S has been formed, a plating mold 980M is formed on the top surface of seed layer 980S.

Figure 46A:
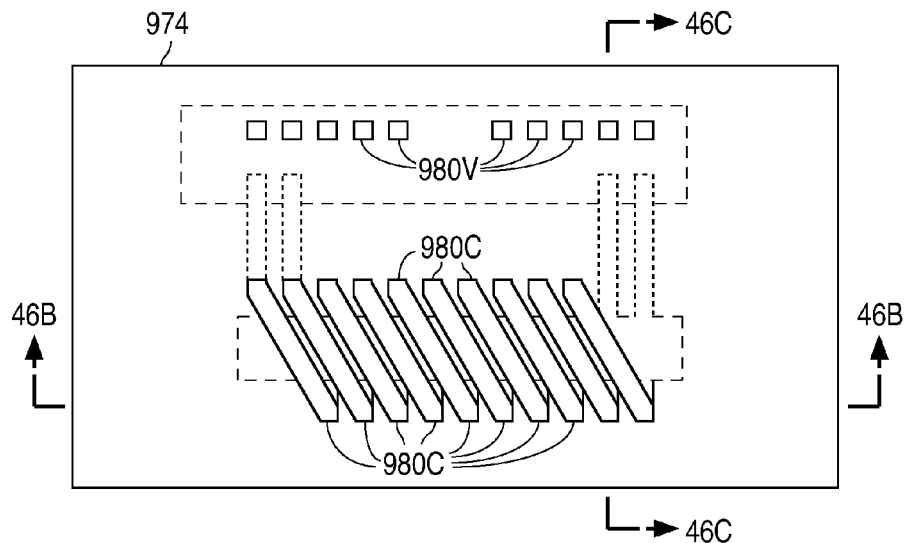
Figure 46B:
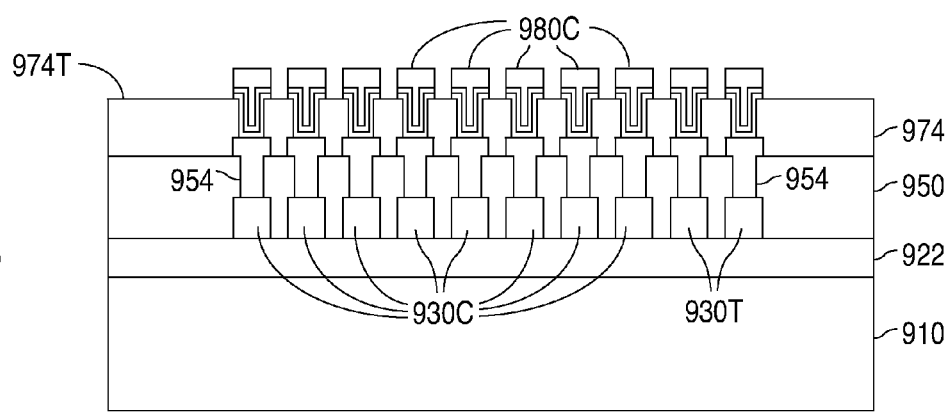
Figure 46C:
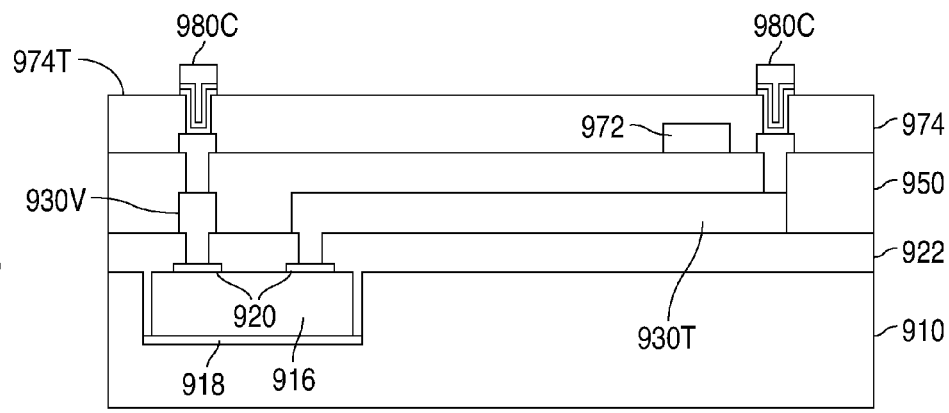

As shown in FIGS. 45A-45C, following the formation of plating mold 980M, copper is electroplated in a conventional manner to form a number of copper regions 980R approximately 5 µm thick. After the electroplating, as shown in FIGS. 46A-46C, plating mold 980M and the underlying regions of seed layer 980S and barrier layer 980B are removed to form the upper via structures 980V and the upper coil structures 980C. (If non-conductive, barrier layer 980B can optionally remain.)

Figure 47A:
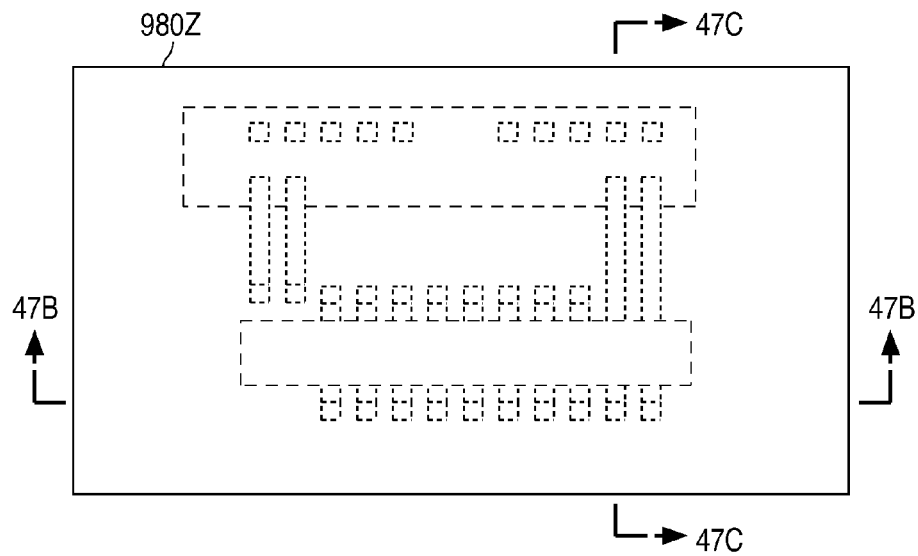
Figure 47B:
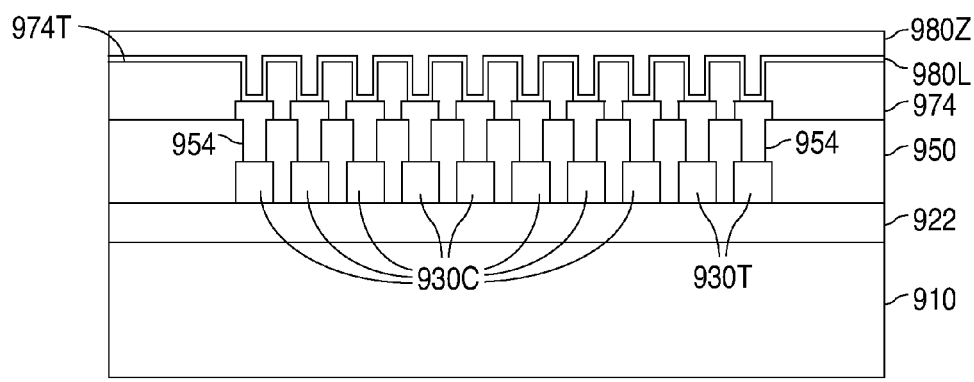
Figure 47C:
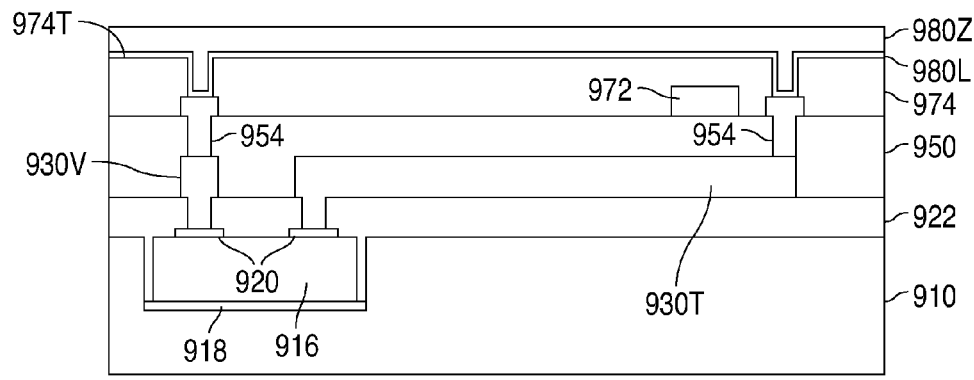

In a second embodiment, as shown in FIGS. 47A-47C, the metal upper structures 980 are formed by first depositing a liner layer 980L on non-conductive structure 974 to line the openings 974P. Liner layer 980L can be implemented with, for example, titanium/titanium nitride. After liner layer 980L has been formed, a metal layer 980Z, such as tungsten, is conventionally deposited on liner layer 980L to fill up the openings 974P.

Figure 48A:
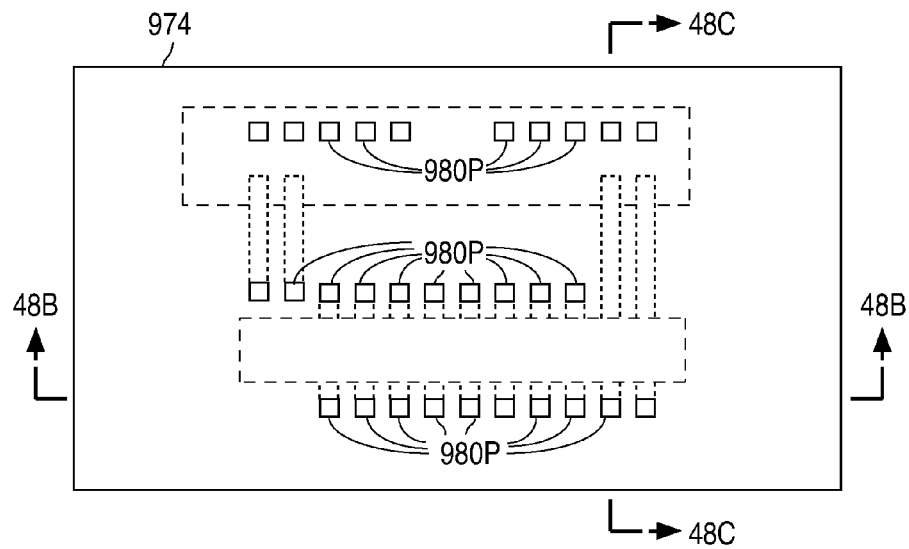
Figure 48B:
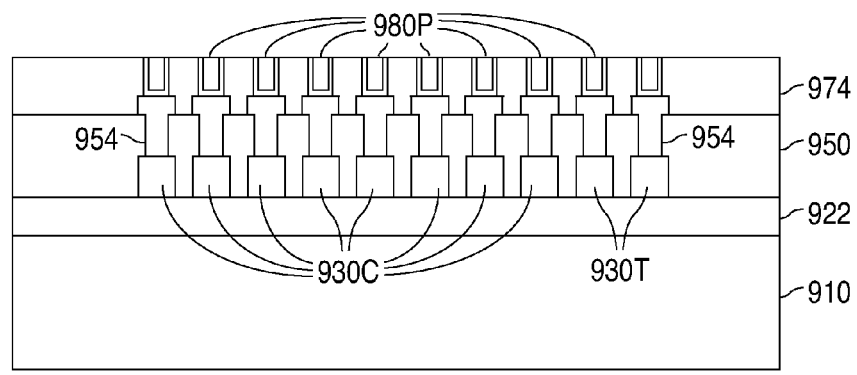
Figure 48C:
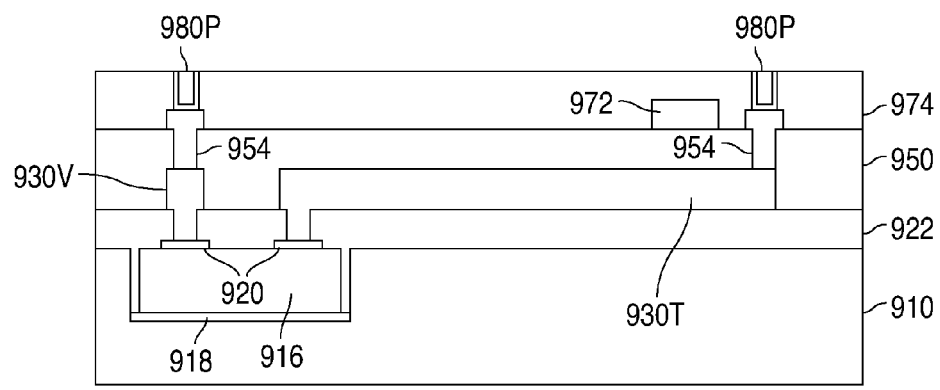

Following this, as shown in FIGS. 48A-48C, metal layer 980Z is planarized, such as with chemical-mechanical polishing, to expose the top surface of non-conductive structure 974, and form via plug structures 980P in the openings 974P that make electrical connections to the via structures 954.

Figure 49A:
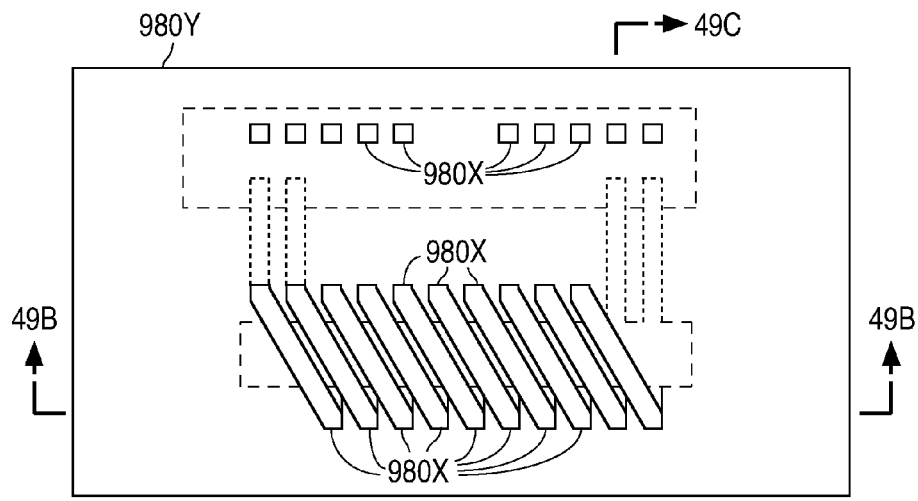
Figure 49B:
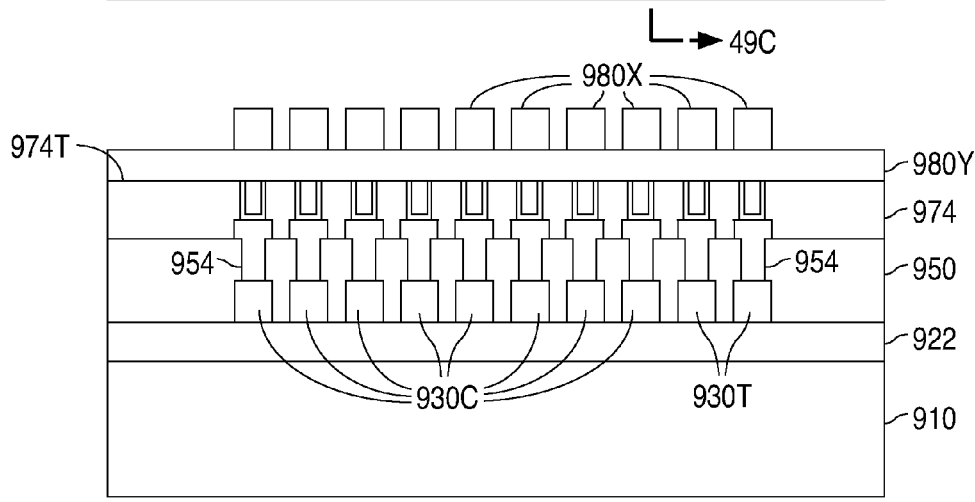
Figure 49C:
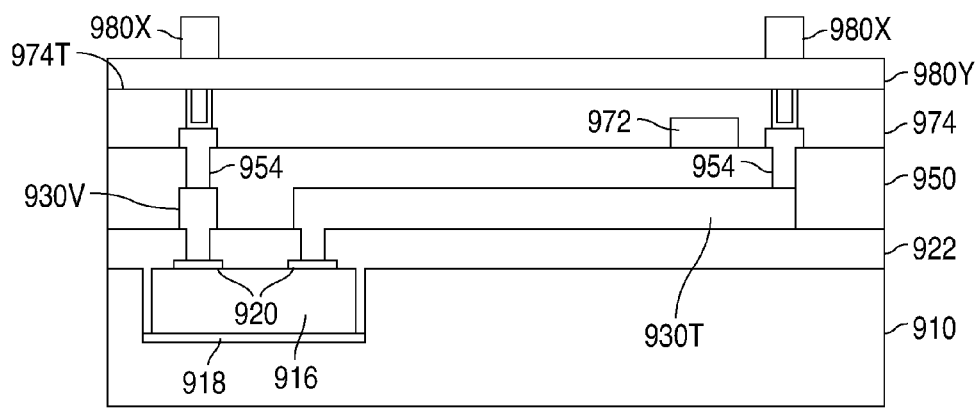

As shown in FIGS. 49A-49C, after the via plug structures 980P have been formed, a metal layer 980Y, such as aluminum, is sputter deposited onto the non-conductive top surface 974T of non-conductive structure 974 to a depth of approximately 5 µm. Alternately, metal layer 980Y can include multiple layers of metal such as, for example, a layer of titanium, a layer of titanium nitride, a layer of aluminum copper, a layer of titanium, and a layer of titanium nitride.

Once metal layer 980Y has been formed, a patterned photoresist layer 980X approximately 1.0 µm thick is formed on the top surface of metal layer 980Y in a conventional manner. Following the formation of patterned photoresist layer 980X, metal layer 980Y is etched to remove the exposed regions of metal layer 980Y and form the upper via structures 980V and the upper coil structures 980C.

Metal layer 980Y can be etched using a dry etch such as reactive ion etching, or a timed wet etch. For example, aluminum can be wet etched in a 10:1 hydrogen fluoride solution for the necessary period of time. After the etch, the resulting structure is rinsed, and patterned photoresist layer 980X is then removed in a conventional manner, such as with acetone. Once patterned photoresist layer 980X has been removed, the resulting structure is conventionally cleaned to remove organics, such as with a Piranha etch.

Figure 50A:
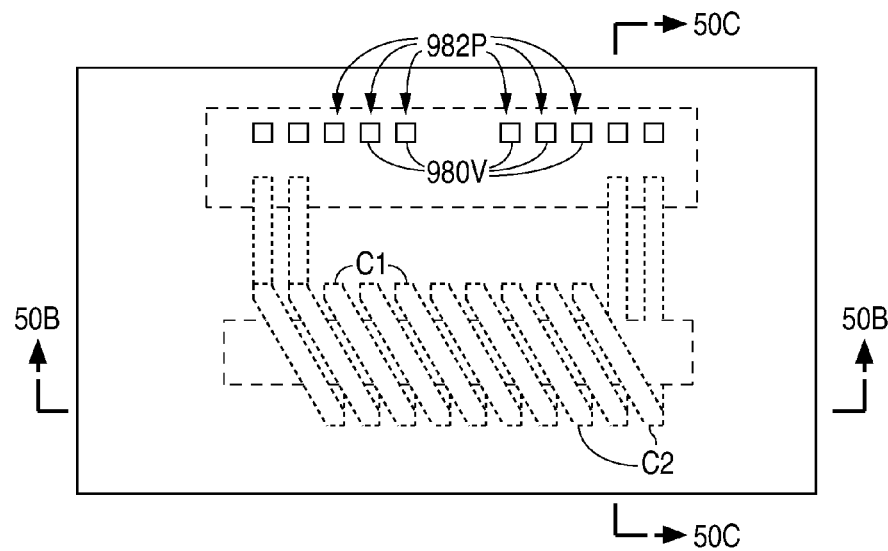
Figure 50B:
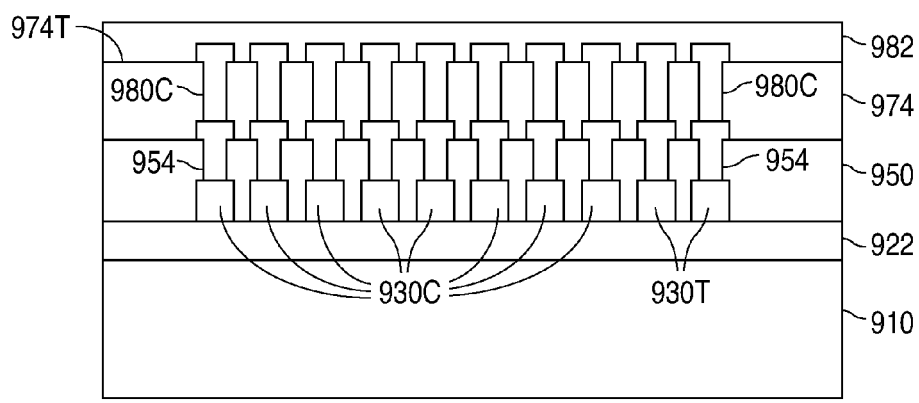
Figure 50C:
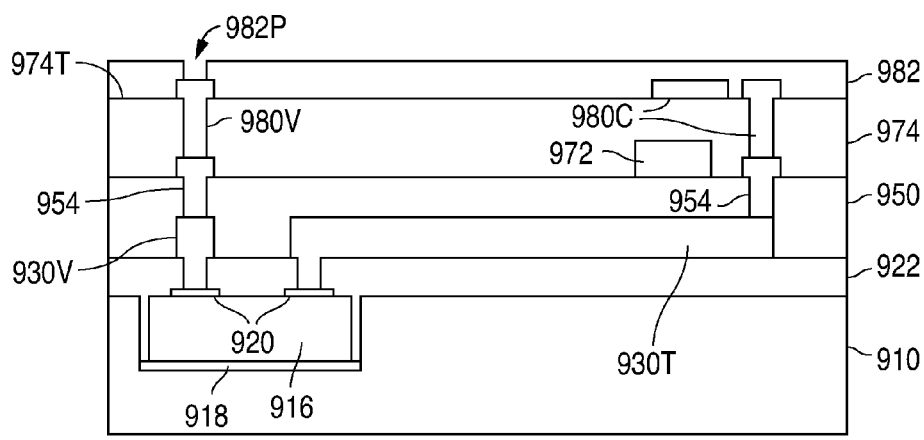

As shown in FIGS. 50A-50C, after the upper via structures 980V and the upper coil structures 980C have been formed, a passivation layer 982 is formed on the top surface 974T of non-conductive structure 974 and the metal upper structures 980. As further shown in FIGS. 50A-50C, passivation layer 982 is formed to have a number of pad openings 982P. The pad openings 982P expose portions of the top surfaces of the upper via structures 980V.

Figure 51A:
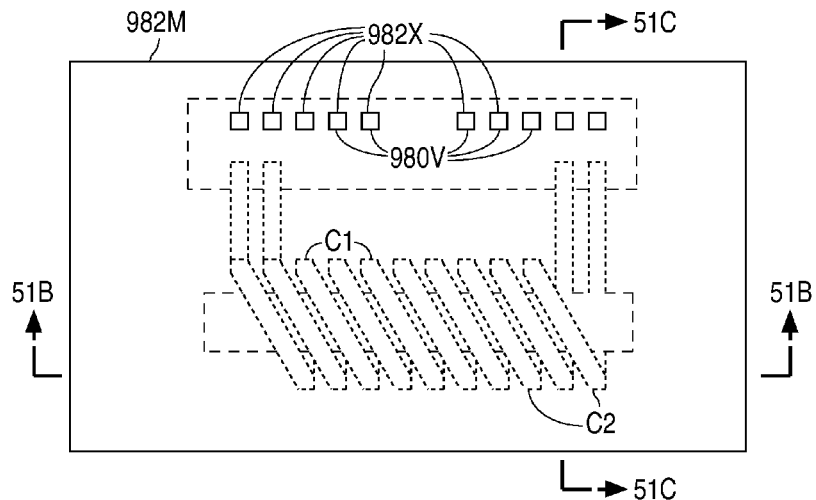
Figure 51B:
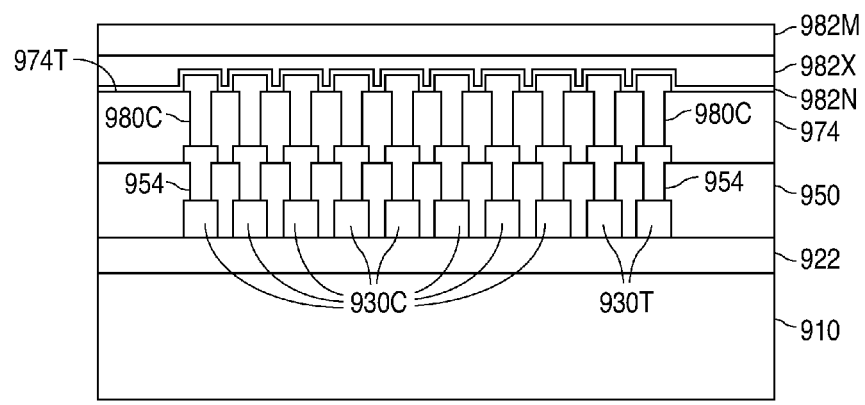
Figure 51C:
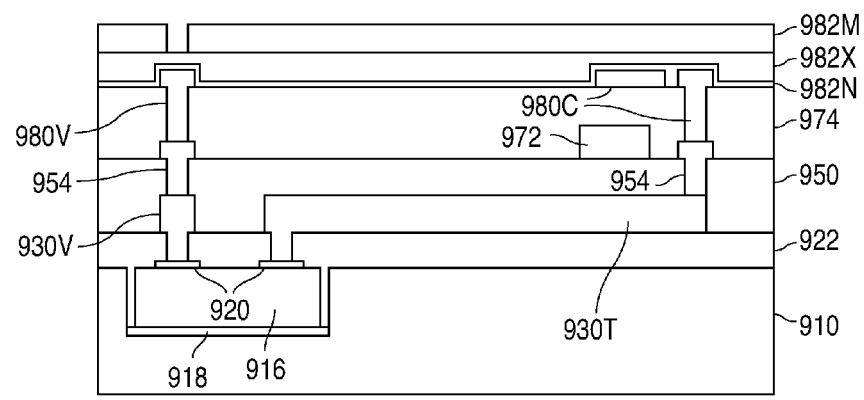

Passivation layer 982 can be formed in a number of different ways. As shown in FIGS. 51A-51C, in a first embodiment, passivation layer 982 can be formed by depositing a layer of silicon nitride 982N approximately 0.6 µm thick on the top surface 974T of non-conductive structure 974. Following this, a layer of silicon dioxide 982X approximately 10-20 µm thick is deposited on nitride layer 982N. Oxide layer 982X and silicon nitride layer 982N can be deposited in a conventional manner, and oxide layer 982X can optionally be omitted in cases where lateral isolation will be provided by a molding compound. Once oxide layer 982X has been formed, a patterned photoresist layer 982M approximately 1.0 µm thick is formed on the top surface of oxide layer 982X in a conventional manner.

Figure 52A:
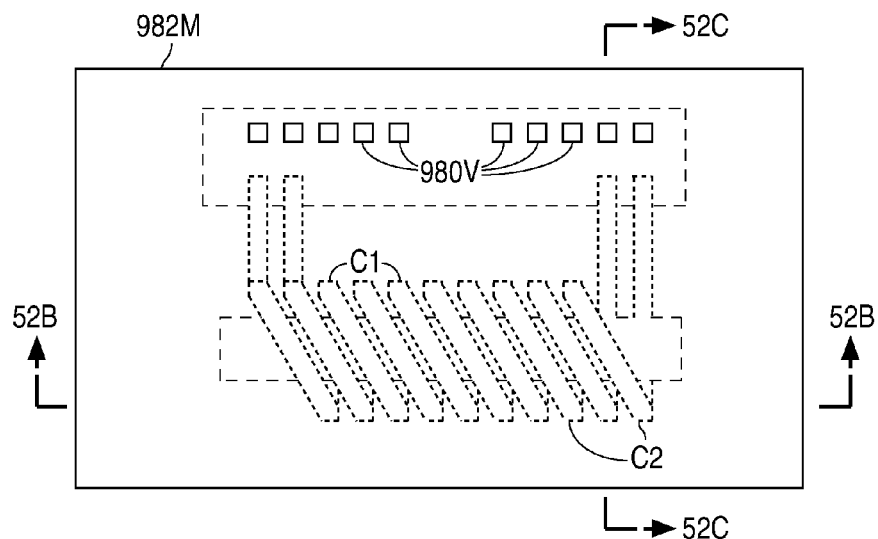
Figure 52B:
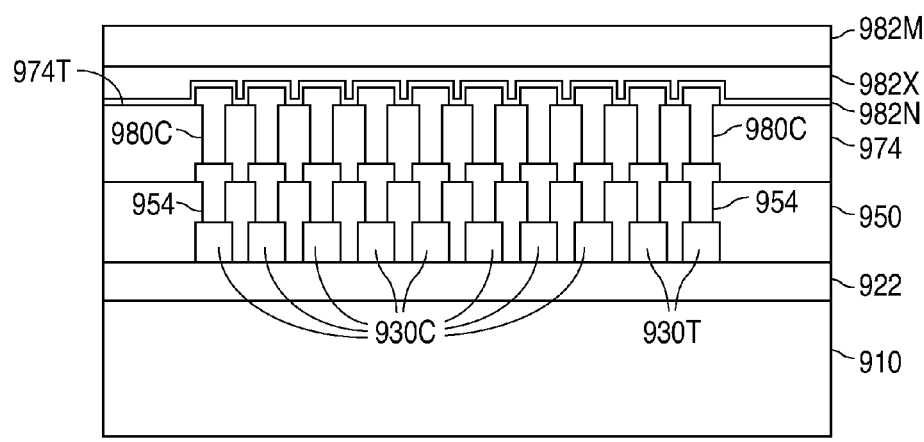
Figure 52C:
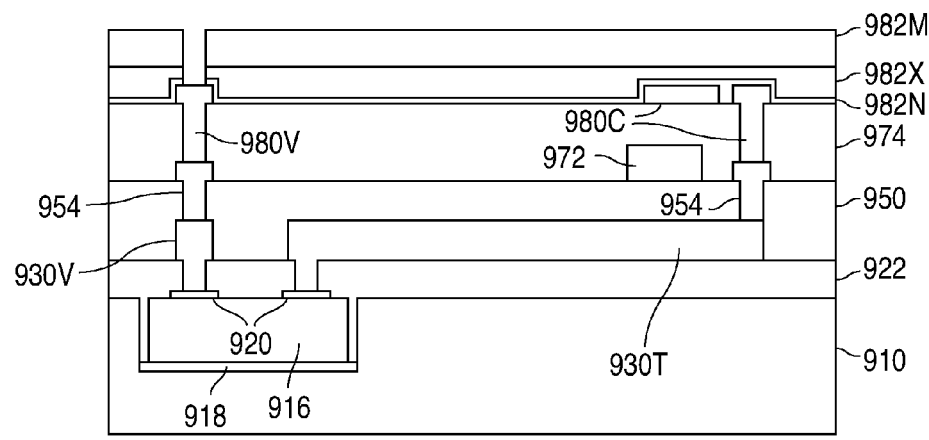
Figure 53A:
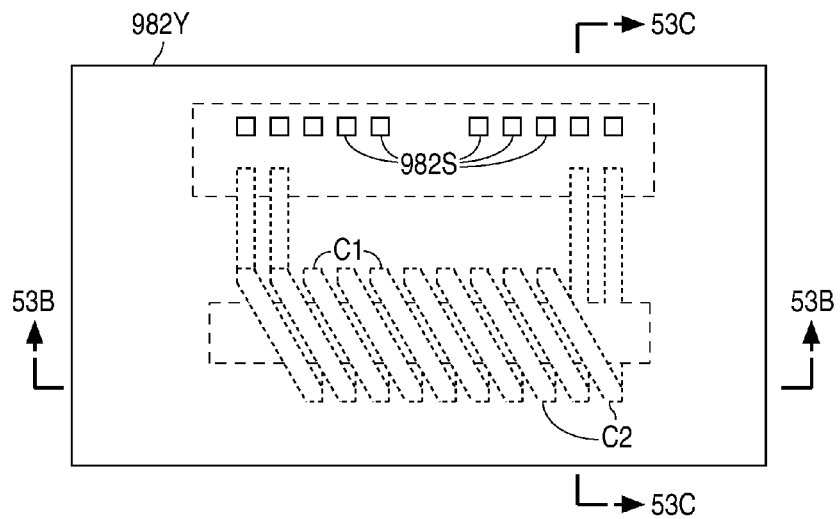
Figure 53B:
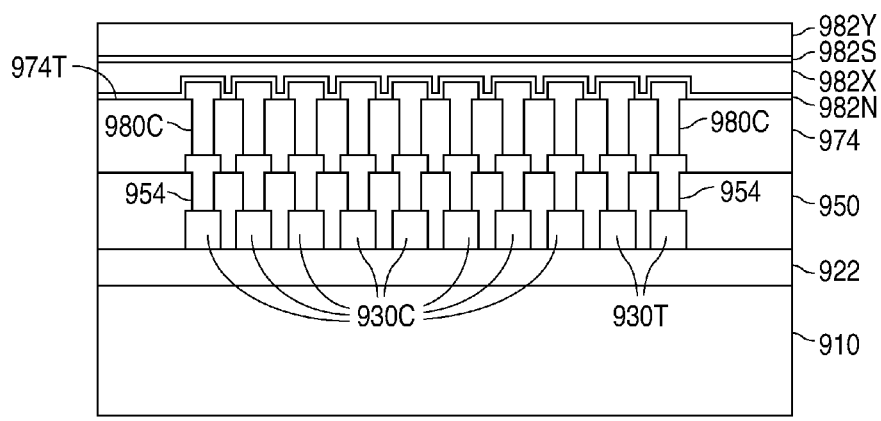
Figure 53C:
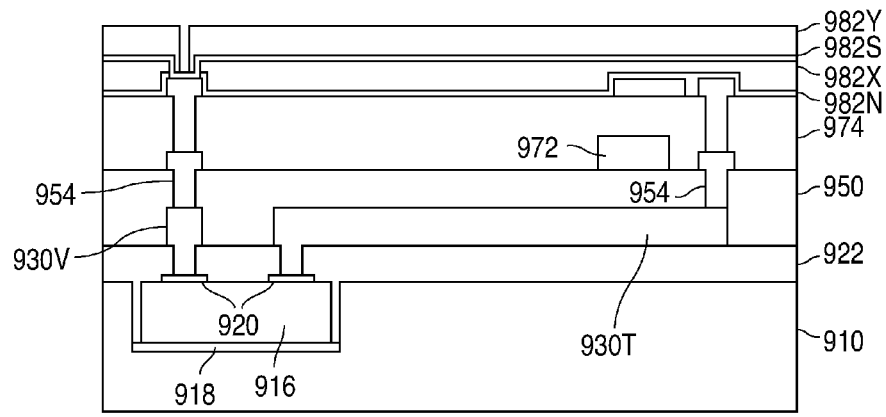

As shown in FIGS. 52A-52C, following the formation of patterned photoresist layer 982M, the exposed regions of oxide layer 982X and nitride layer 982N are etched to expose the upper via structures 980V. Patterned photoresist layer 982M is then removed in a conventional manner, followed by a conventional cleaning. Next, as shown in FIGS. 53A-53C, a layer of silicon nitride 982S approximately 0.6 µm thick is deposited on the top surface of oxide layer 982X and the exposed regions of the upper via structures 980V.

Following this, a patterned photoresist layer 982Y approximately 1.0 µm thick is formed on the top surface of nitride layer 982S in a conventional manner. The openings in patterned photoresist layer 982Y are made slightly smaller that the openings in patterned photoresist layer 982M to ensure that oxide layer 982X is completely sealed against moisture absorption. After patterned photoresist layer 982Y has been formed, the exposed regions of nitride layer 982S are etched to form passivation layer 982 with the pad openings 982P. Patterned photoresist layer 982Y is then removed in a conventional manner, followed by a conventional cleaning.

Figure 54A:
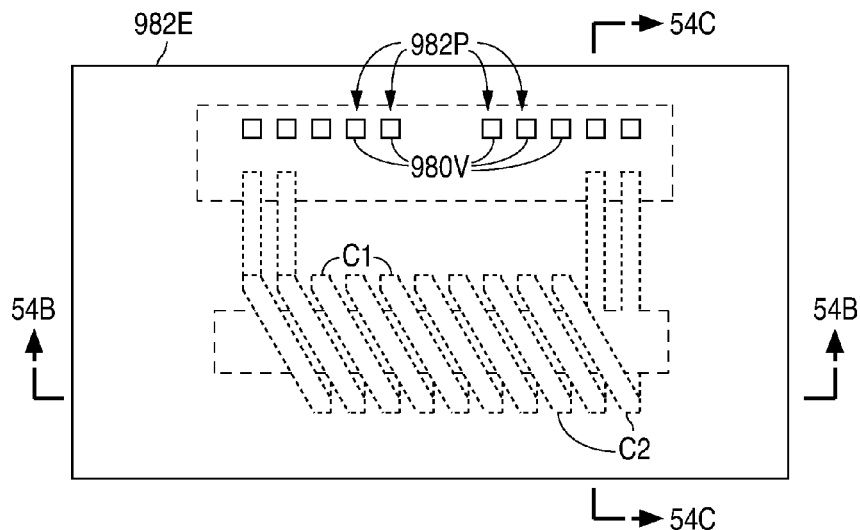
Figure 54B:
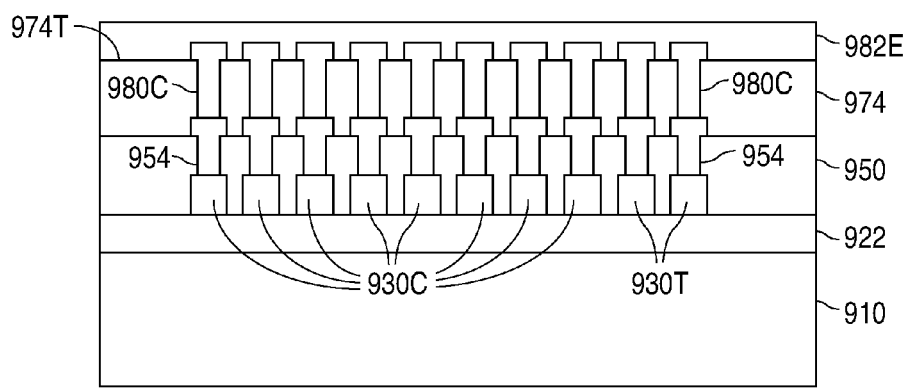
Figure 54C:
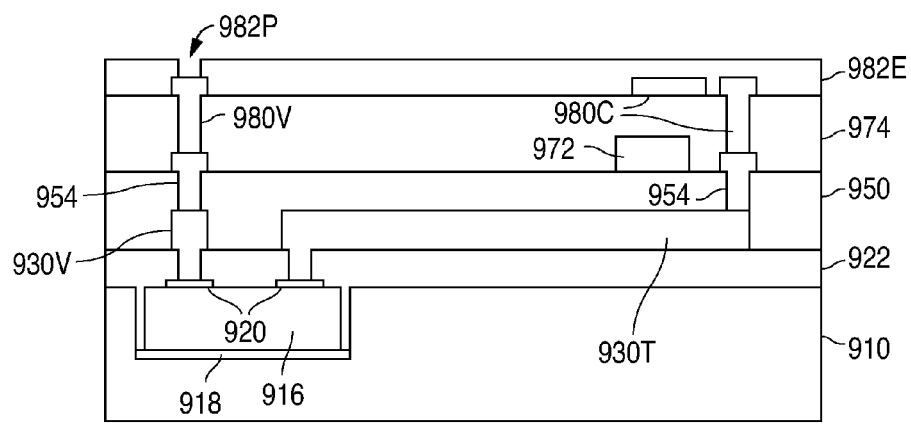

Alternately, in a second embodiment, as shown in FIGS. 54A-54C, passivation layer 982 can be formed by depositing a layer of photoimageable epoxy or polymer 982E on non-conductive structure 974 and the metal upper structures 980. The photoimageable epoxy or polymer layer 982E can be implemented with, for example, SU-8, benzocyclobutene (BCB), or polybenzoxazole (PBO), which are substantially self planarizing.

Once photoimageable epoxy or polymer layer 982E has been deposited, the openings 982P are formed in photoimageable epoxy or polymer layer 982E by projecting a light through a mask to form a patterned image on layer 982E that softens the regions of layer 982E that are exposed by the light, and then removing the softened regions of layer 982E.

As shown in FIGS. 55A-55C, after passivation layer 982 has been formed, metal pads 984, such as aluminum pads, are next formed in the pad openings 982P to touch the upper via structures 980V and complete the formation of a fluxgate magnetometer wafer 986. The metal pads 984 make electrical connections with the upper via structures 980V.

Figure 56A:
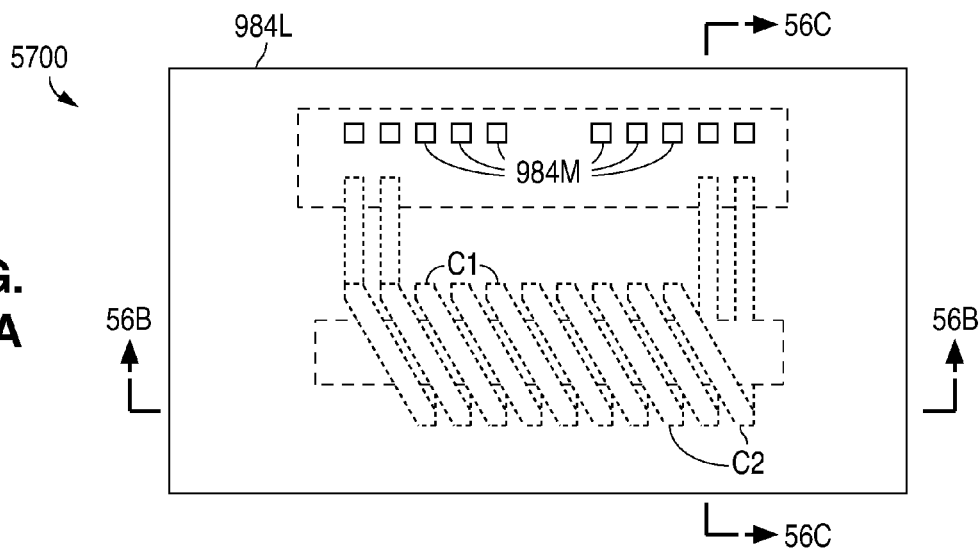
Figure 56B:
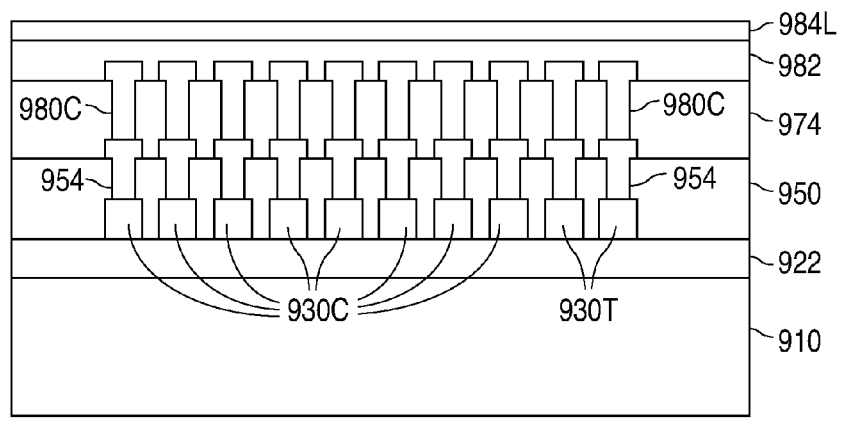
Figure 56C:
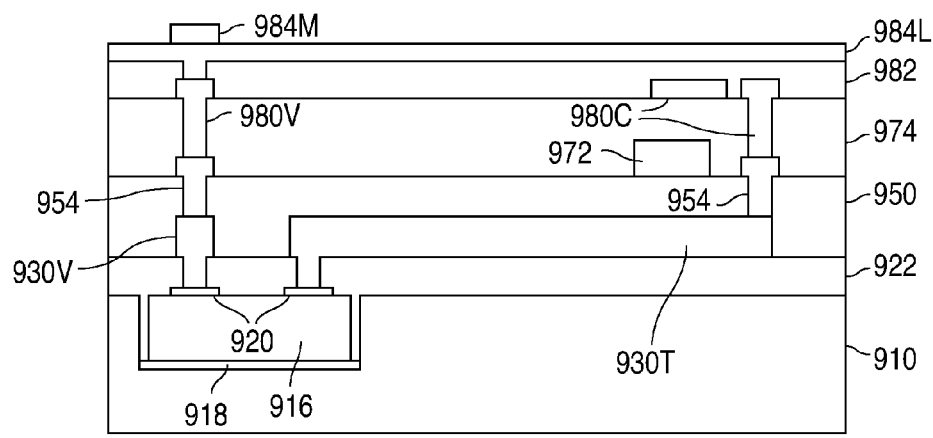

The metal pads 984 can be formed, as shown in FIGS. 56A-56C, by sputter depositing a metal layer 984L, such as aluminum, approximately 1000 Å thick, followed by the deposition of a patterned photoresist layer 984M. Once patterned photoresist layer 984M has been formed, the exposed regions of metal layer 984L are etched to form the metal pads 984. Patterned photoresist layer 984 is then removed in a conventional manner, followed by a conventional cleaning.

After fluxgate magnetometer wafer 986 has been formed (following the formation of the metal pads 984), the back side of fluxgate magnetometer wafer 986 can be ground down as necessary so that the completed assembly can fit into a package. Following this, fluxgate magnetometer wafer 986 is diced to form a large number of fluxgate magnetometer dice.

Thus, a semiconductor fluxgate magnetometer and a method of forming a semiconductor fluxgate magnetometer have been described. One of the advantages of the present invention is that the fluxgate magnetometer of the present invention is formed in a semiconductor process which, in turn, substantially reduces the size and cost of fluxgate magnetometers.

FIGS. 57A-57C show views that illustrate an example of a semiconductor fluxgate magnetometer 5700 in accordance with an alternate embodiment of the present invention. FIG. 57A shows a plan view, while FIG. 57B shows a cross-sectional view taken along line 57B-57B in FIG. 57A, and FIG. 57C shows a cross-sectional view taken along line 57C-57C in FIG. 57A. Semiconductor fluxgate magnetometer 5700 is similar to semiconductor fluxgate magnetometer 800 and, as a result, utilizes the same reference numerals to designate the structures which are common to both magnetometers.

As shown in FIGS. 57A-57C, semiconductor fluxgate magnetometer 5700 differs from semiconductor fluxgate magnetometer 800 in that semiconductor fluxgate magnetometer 5700 utilizes a die 5710 in lieu of die 816. Die 5710, which has a side wall surface 5710S and a bottom surface 5710B, differs from die 816 in that die 5710 further includes a cancellation circuit.

As additionally shown in FIGS. 57A-57C, semiconductor fluxgate magnetometer 5700 also differs from semiconductor fluxgate magnetometer 800 in that semiconductor fluxgate magnetometer 5700 further includes a third conductor 5720 that touches non-conductive structure 890.

Third conductor 5720 includes a number of the lower coil structures 930C, a number of the upper coil structures 880C, and a number of the via structures 954, which are connected together in the same manner as the drive and sense coils C1 and C2 to form a cancellation coil C3. Thus, third conductor 5720, which is electrically isolated from magnetic core structure 872, first conductor 892, and second conductor 894 by non-conductive structure 890, is wound around magnetic core structure 872 in a spiral to form cancellation coil C3. Third conductor 5720 further includes a pair of via trace structures 830T that are electrically connected to die 5710 and cancellation coil C3.

Semiconductor fluxgate magnetometer 5700 operates the same as semiconductor fluxgate magnetometer 800, except that the cancellation circuit in semiconductor fluxgate magnetometer 5700 outputs an alternating current to the cancellation coil C3. The alternating current in the cancellation coil C3 sets up an alternating magnetic induction field that is equal and opposite to the alternating magnetic induction field which is generated by the alternating current in drive coil C1.

The cancellation circuit also adjusts the magnitude of the alternating current that is output to the cancellation coil C3 until the output voltage from the sense circuit appears to indicate that no external magnetic field is present, and then determines the magnitude of the external magnetic field based on the magnitude of the alternating current output to the cancellation coil C3.

Semiconductor fluxgate magnetometer 5700 is formed in the same manner that semiconductor fluxgate magnetometer 986 is formed, except that the method is modified to add a pair of via traces structures 930T, a number of the lower coil structures 930C, a number of the upper coil structures 980C, and a number of the via structures 954, which are connected together to form third conductor 5720 in the same manner that the first and second conductors 892 and 894 are formed.

Figure 58A:
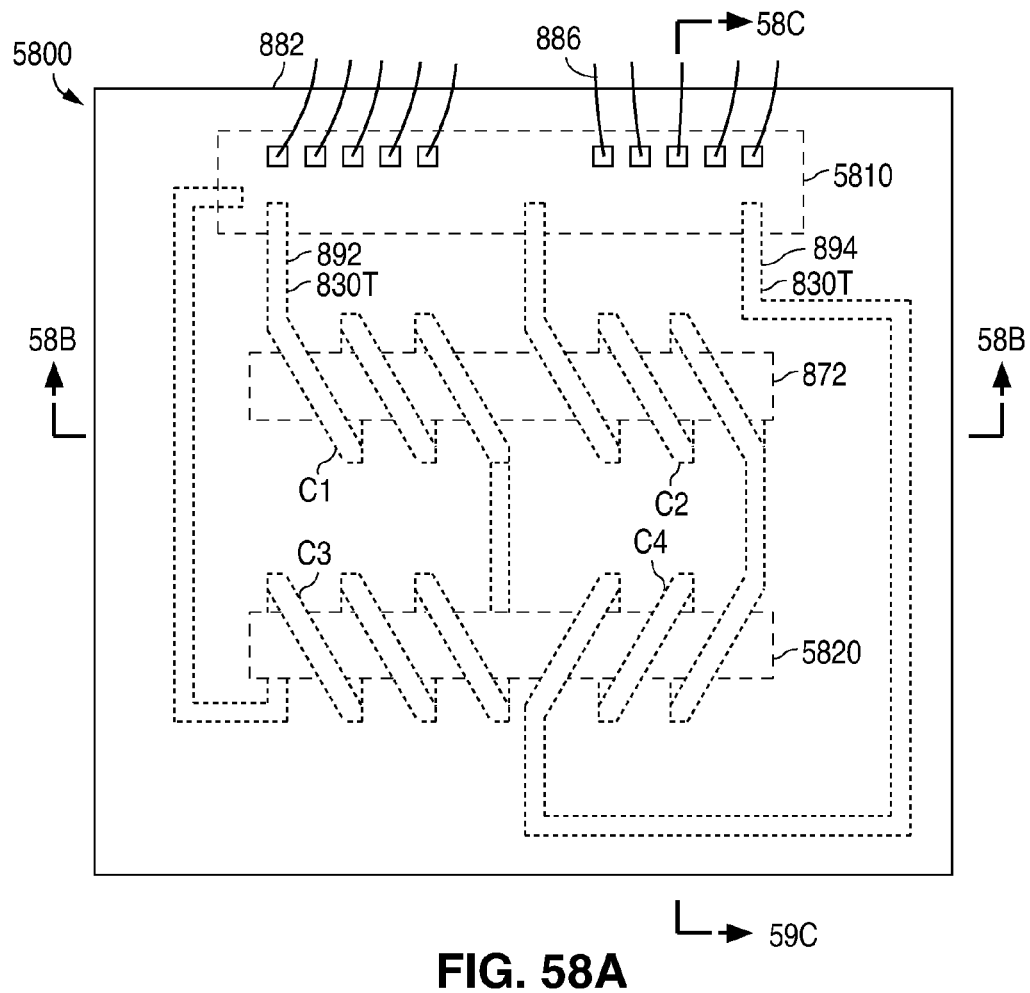
FIGS. 58A-58C are views illustrating an example of a semiconductor fluxgate magnetometer 5800 in accordance with an alternate embodiment of the present invention.
Figure 58B:
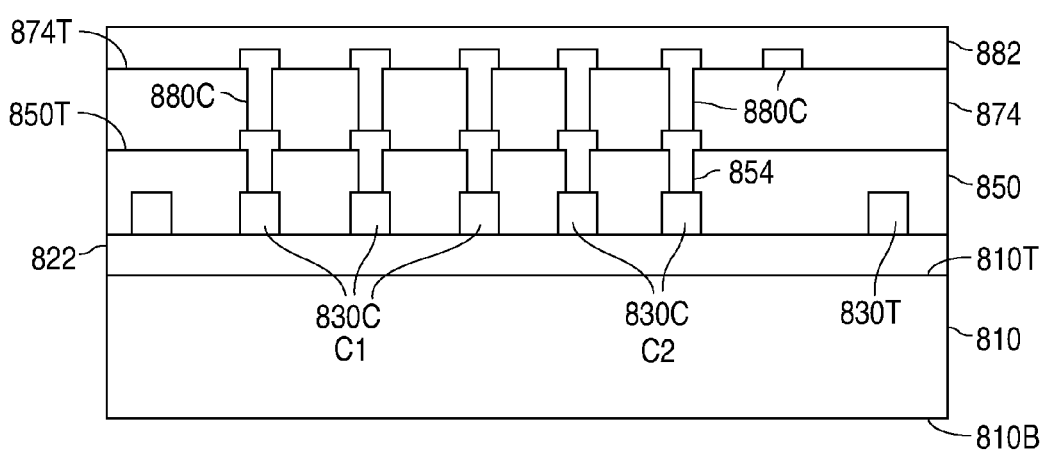
Figure 58C:
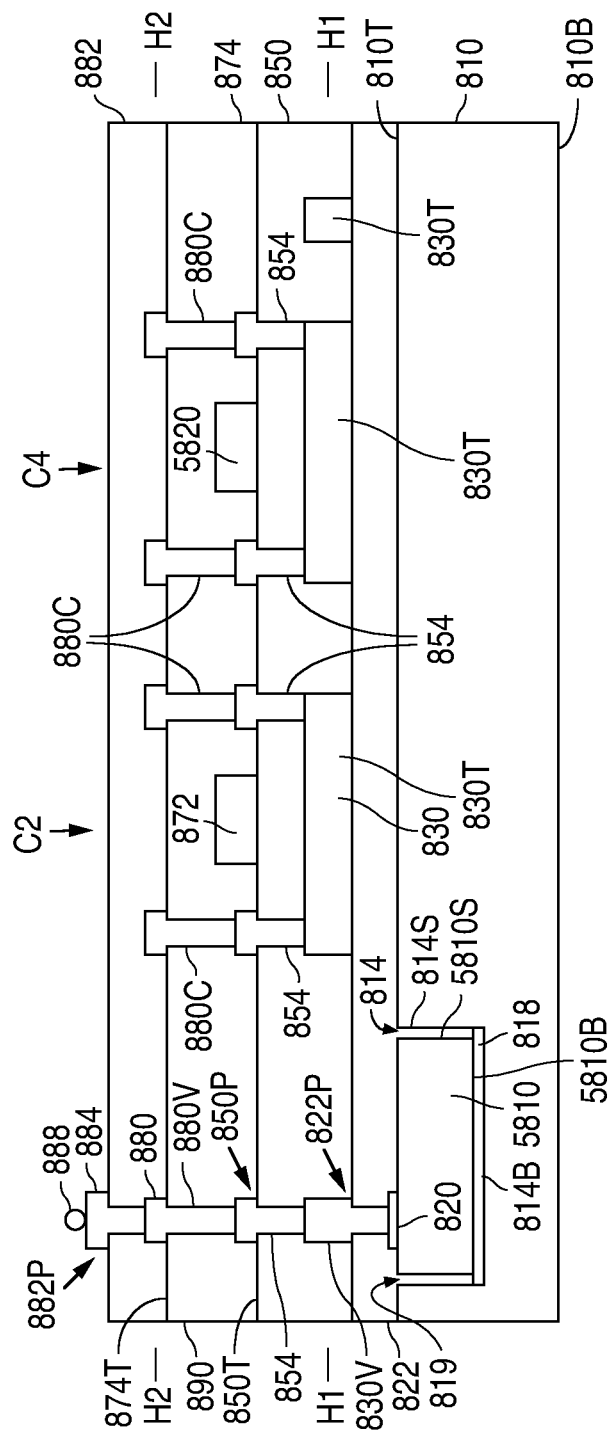

FIGS. 58A-58C show views that illustrate an example of a semiconductor fluxgate magnetometer 5800 in accordance with an alternate embodiment of the present invention. FIG. 58A shows a plan view, while FIG. 58B shows a cross-sectional view taken along line 58B-58B in FIG. 58A, and FIG. 58C shows a cross-sectional view taken along line 58C-58C in FIG. 58A. Semiconductor fluxgate magnetometer 5800 is similar to semiconductor fluxgate magnetometer 800 and, as a result, utilizes the same reference numerals to designate the structures which are common to both magnetometers.

As shown in FIGS. 58A-58C, semiconductor fluxgate magnetometer 5800 differs from semiconductor fluxgate magnetometer 800 in that semiconductor fluxgate magnetometer 5800 utilizes a die 5810 in lieu of die 816. Die 5810, which has a side wall surface 5810S and a bottom surface 5810B, differs from die 816 in that die 5810 utilizes simplified drive and sense circuits in lieu of the drive and sense circuits utilized in die 816.

As additionally shown in FIGS. 58A-58C, semiconductor fluxgate magnetometer 5800 also differs from semiconductor fluxgate magnetometer 800 in that semiconductor fluxgate magnetometer 5800 further includes a magnetic core member 5820 that lies spaced apart from magnetic core member 872.

Further, in addition to being wound around magnetic core structure 872 as a spiral to form drive coil C1, first conductor 892 is also wound around magnetic core structure 5820 as a spiral to form a drive coil C3. Also, in addition to being wound around magnetic core structure 872 as a spiral to form sense coil C2, second conductor 894 is further wound around magnetic core structure 5820 as a spiral to form a sense coil C4.

In operation, first conductor 892 is wrapped around the magnetic core structures 872 and 5820 so as to generate equal and opposing alternating magnetic induction fields when the drive circuit in die 5810 outputs an alternating current to drive coils C1 and C3. Thus, when no external magnetic field is present, no voltage is induced in the sense coils C2 and C4 because no alternating magnetic induction field is present.

When an external magnetic field is present, the presence of the external magnetic field induces an alternating voltage in the sense coils C2 and C4. The sense circuit in die 5810 detects the alternating voltage in the sense coils C2 and C4 and generates in response a sensed output voltage, which has an amplitude that is proportional to the magnitude of the external magnetic field. The sense circuit in die 5810 does not detect or utilize the second harmonic of the fundamental frequency of the alternating current that is output to the drive coils C1 and C3.

Semiconductor fluxgate magnetometer 5800 is formed in the same manner that semiconductor fluxgate magnetometer 986 is formed. Magnetic core structure 5820 is formed at the same time that magnetic core structure 872 is formed, and the sections of drive coil C3 and sense coil C4 are formed at the same time that the corresponding sections of drive coil C1 and sense coil C2 are formed.

Figure 59A:
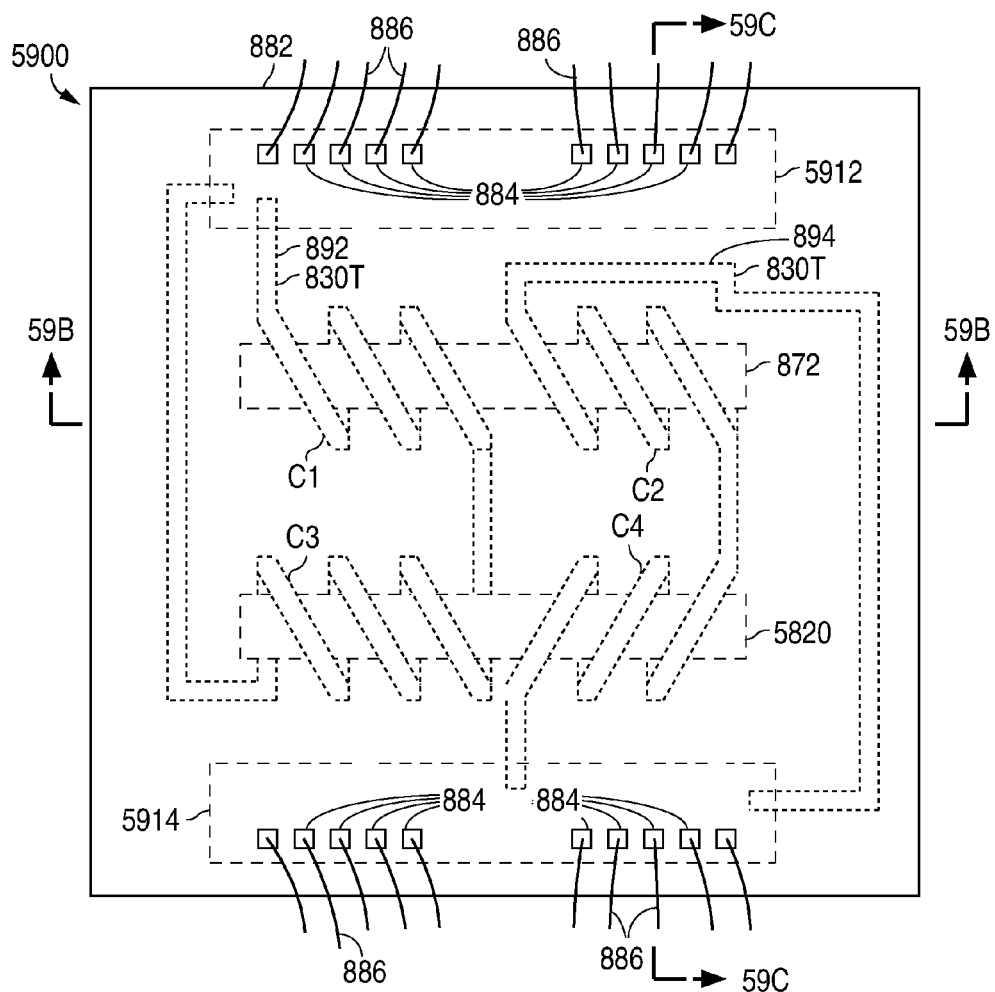
FIGS. 59A-59C are views illustrating an example of a semiconductor fluxgate magnetometer 5900 in accordance with an alternate embodiment of the present invention.
Figure 59B:
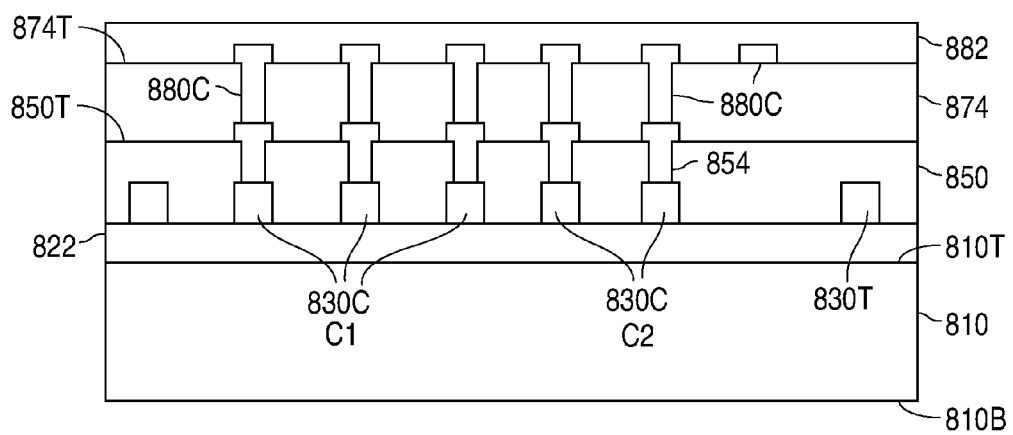
Figure 59C:
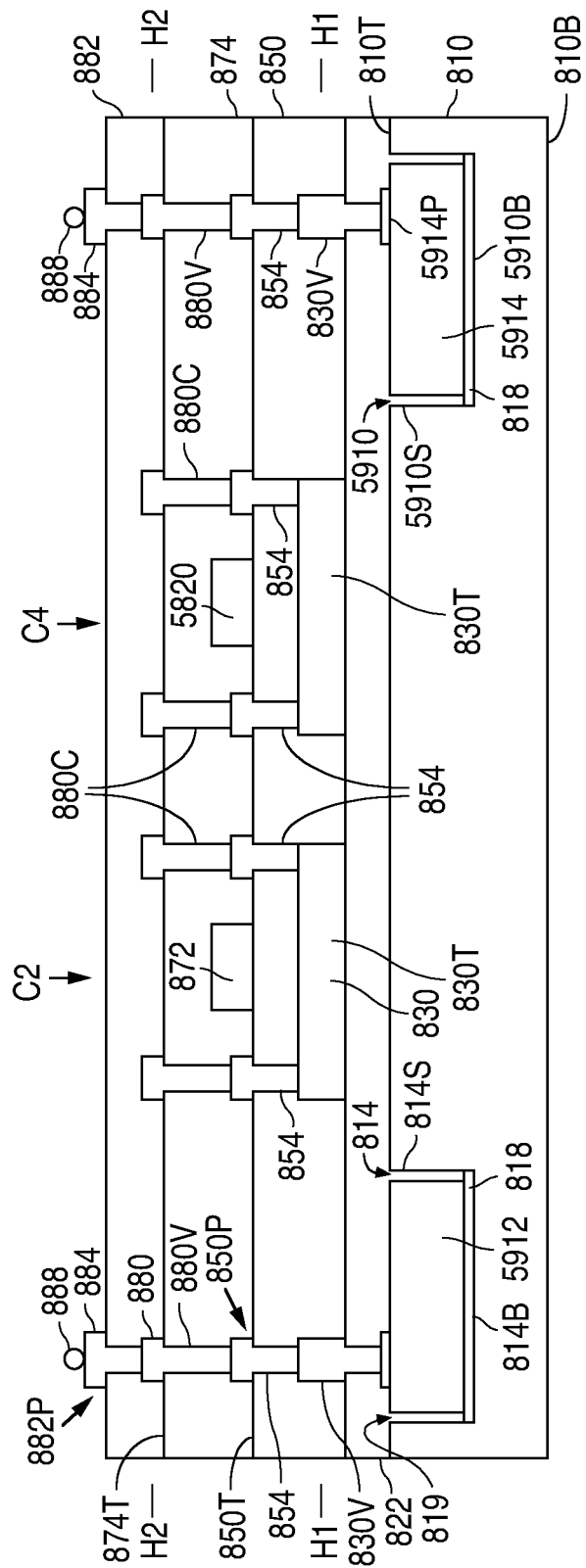

FIGS. 59A-59C show views that illustrate an example of a semiconductor fluxgate magnetometer 5900 in accordance with an alternate embodiment of the present invention. FIG. 59A shows a plan view, while FIG. 59B shows a cross-sectional view taken along line 59B-59B in FIG. 59A, and FIG. 59C shows a cross-sectional view taken along line 59C-59C in FIG. 59A. Semiconductor fluxgate magnetometer 5900 is similar to semiconductor fluxgate magnetometer 5800 and, as a result, utilizes the same reference numerals to designate the structures which are common to both magnetometers.

As shown in FIGS. 59A-59C, semiconductor fluxgate magnetometer 5900 differs from semiconductor fluxgate magnetometer 5800 in that semiconductor structure 810 of semiconductor fluxgate magnetometer 5900 has two cavities: cavity 814 and cavity 5910 which is formed at the same time and in the same manner that cavity 814 is formed.

Cavity 5910, in turn, has a side wall surface 5910S and a bottom surface 5910B that lies above and is vertically spaced apart from the bottom surface 810B of semiconductor structure 810. In addition, the bottom surface 5910B of cavity 5910 can be either conductive or non-conductive.

As further shown in FIGS. 59A-59C, semiconductor fluxgate magnetometer 5900 also differs from semiconductor fluxgate magnetometer 5800 in that semiconductor fluxgate magnetometer 5900 utilizes a drive die 5912 and a sense die 5914 in lieu of die 816. In the present example, drive die 5912, which has a number of conductive pads 5912P that provide external electrical connection points for die 5912, includes all of the electrical components that are required to output an alternating current to the drive coils C1 and C3.

Sense die 5914, which has a number of conductive pads 5914P that provide external electrical connection points for die 5914, includes all of the electrical components that are required to detect an alternating voltage that has been induced in the sense coils C2 and C4, and generate an output voltage from the alternating voltage in the sense coils C2 and C4 that has a magnitude which is proportional to an external magnetic field.

Drive die 5912 and sense die 5914 are attached to semiconductor structure 810 by way of adhesive 818 at the same time and in the manner that die 816 is attached to semiconductor structure 810. In the present example, sense die 5914 does not detect or utilize the second harmonic of the fundamental frequency of the alternating current that is output to the drive coils C1 and C3.

Semiconductor fluxgate magnetometer 5900 further differs from semiconductor fluxgate magnetometer 5800 in that semiconductor fluxgate magnetometer 5900 includes additional via structures 830V that touch the pads 5914P, additional via structures 854, additional upper via structures 880V, and additional pads 884 as required to provide power and input/output connections to die 5914.

One of the advantages of semiconductor fluxgate magnetometer 5900 is that semiconductor fluxgate magnetometer 5900 provides galvanic isolation between the drive and sense dice 5912 and 5914 and, therefore, provides galvanic isolation between the drive and sense circuits. As a result, the drive and sense dice 5912 and 5914 can utilize different voltages, such as 0V and 200V, for ground.

FIGS. 60A-60C show views that illustrate an example of a semiconductor fluxgate magnetometer 6000 in accordance with an alternate embodiment of the present invention. FIG. 60A shows a plan view, while FIG. 60B shows a cross-sectional view taken along line 60B-60B in FIG. 60A, and FIG. 60C shows a cross-sectional view taken along line 60C-60C in FIG. 60A.

Semiconductor fluxgate magnetometer 6000 is similar to semiconductor fluxgate magnetometer 800 and, as a result, utilizes the same reference numerals to designate the structures which are common to both magnetometers. As shown in FIGS. 60A-60C, semiconductor fluxgate magnetometer 6000 differs from semiconductor fluxgate magnetometer 800 in that semiconductor fluxgate magnetometer 6000 utilizes a magnetic core structure 6010 in lieu of magnetic core structure 872.

Magnetic core structure 6010, which is a single unified structure, differs from magnetic core structure 872 in that magnetic core structure 6010 has a body region 6012 with a rectangular shape, and a pair of flared end regions 6014 that extend away from opposing ends of body region 6012 so that the maximum width of a flared end region 6014 is greater than a maximum width of body region 6012.

Semiconductor fluxgate magnetometer 6000 operates the same as semiconductor fluxgate magnetometer 800. In addition, semiconductor fluxgate magnetometer 6000 is formed in the same manner as semiconductor fluxgate magnetometer 800, except that the mold or mask used to form magnetic core structure 872 is modified to form the magnetic core structure with flared ends.

Figure 61A:
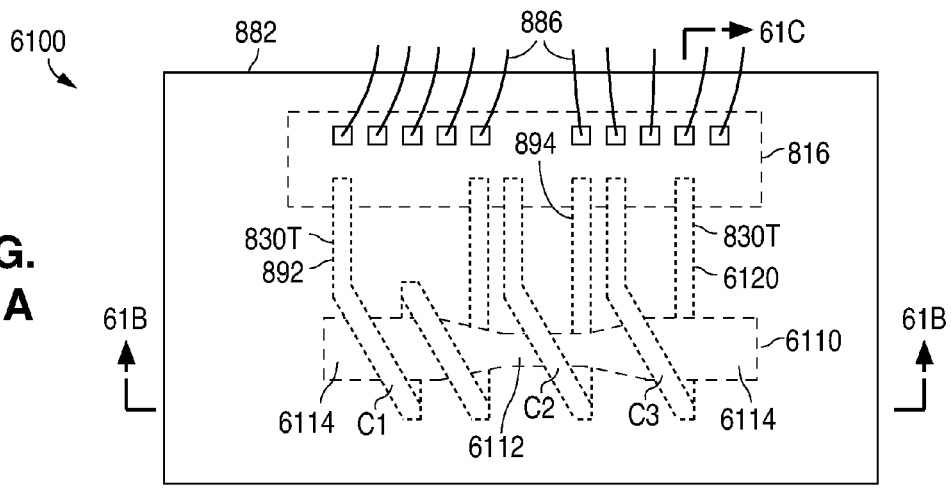
FIGS. 61A-61C are views illustrating an example of a semiconductor fluxgate magnetometer 6100 in accordance with an alternate embodiment of the present invention.
Figure 61B:
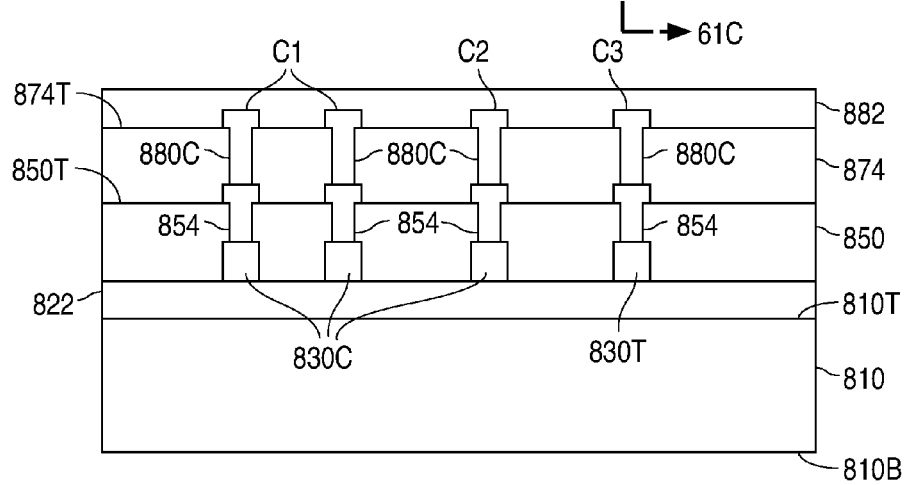
Figure 61C:
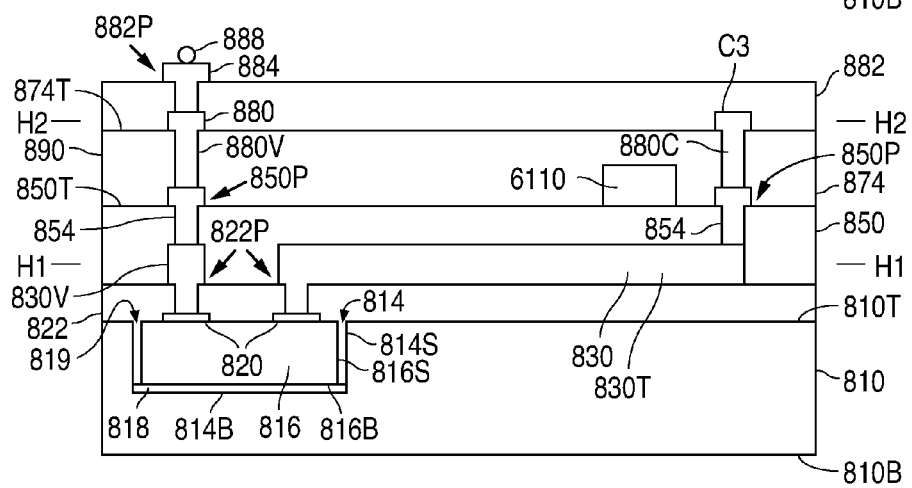

FIGS. 61A-61C show views that illustrate an example of a semiconductor fluxgate magnetometer 6100 in accordance with an alternate embodiment of the present invention. FIG. 61A shows a plan view, while FIG. 61B shows a cross-sectional view taken along line 61B-61B in FIG. 61A, and FIG. 61C shows a cross-sectional view taken along line 61C-61C in FIG. 61A.

Semiconductor fluxgate magnetometer 6100 is similar to semiconductor fluxgate magnetometer 800 and, as a result, utilizes the same reference numerals to designate the structures which are common to both magnetometers. As shown in FIGS. 61A-61C, semiconductor fluxgate magnetometer 6100 differs from semiconductor fluxgate magnetometer 800 in that semiconductor fluxgate magnetometer 6100 utilizes a magnetic core structure 6110 in lieu of magnetic core structure 872.

Magnetic core structure 6110, which is a single unified structure, differs from magnetic core structure 872 in that magnetic core structure 6110 has a center region 6112 that has a first width, and a pair of end regions 6114 that are connected to opposite sides of center region 6112. In addition, each end region 6114 has a second width that is greater than the first width of center region 6112.

As additionally shown in FIGS. 61A-61C, semiconductor fluxgate magnetometer 6100 also differs from semiconductor fluxgate magnetometer 800 in that sense coil C2 is only wound around the center region 6112 of magnetic core structure 6110. Further, in the present example, semiconductor fluxgate magnetometer 6100 also includes a third conductor 6120 that touches non-conductive structure 890.

Third conductor 6120 includes a number of the lower coil structures 930C, a number of the upper coil structures 880C, and a number of the via structures 954, which are connected together in the same manner as the drive and sense coils C1 and C2 to form a supplemental drive coil C3. Thus, third conductor 6120, which is electrically isolated from magnetic core structure 6110, first conductor 892, and second conductor 894 by non-conductive structure 890, is wound around magnetic core structure 6110 in a spiral to form supplemental drive coil C3. Third conductor 6120 further includes a pair of via trace structures 830T that are electrically connected to die 816 and supplemental drive coil C3.

Semiconductor fluxgate magnetometer 6100 operates the same as semiconductor fluxgate magnetometer 800, except that the alternating current output to drive coil C1 is also output to supplemental drive coil C3. In addition, semiconductor fluxgate magnetometer 6100 is formed in the same manner as semiconductor fluxgate magnetometer 800, except that the mold or mask used to form magnetic core structure 872 is modified to form the magnetic core structure with a narrower center region. (The coils C1, C2, and C3 are illustrated with one or two loops for simplicity, and can have any number of loops.)

In an alternate embodiment of the present invention, the sense circuit in die 816 is replaced with all of the electrical components that are required to measure the inductance of drive coil C1 and sense coil C2 in a conventional manner, and then compare the drive coil inductance to the sense coil inductance in a conventional manner to determine a difference in inductance. The difference in inductance is proportional to the magnitude of the external magnetic field, and the alternate sense circuit in die 816 determines the magnitude of the external magnetic field based on the difference in inductance.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor magnetometer comprising:
   a semiconductor structure having a bottom surface, a top surface, and a cavity that extends from the top surface down into the semiconductor structure, the cavity having a side wall surface and a bottom surface, the bottom surface of the cavity lying above and being vertically spaced apart from the bottom surface of the semiconductor structure;
   a die adhesively attached to the bottom surface of the cavity, the die having a plurality of external electrical connection points;
   a non-conductive structure that touches the die and the top surface of the semiconductor structure;
   a magnetic core structure that touches the non-conductive structure;
   a first conductor that touches the non-conductive structure, the first conductor being electrically connected to the die, and wound around the magnetic core structure in a spiral to form a first coil; and
   a second conductor that touches the non-conductive structure, the second conductor being electrically isolated from the first conductor, and wound around the magnetic core structure in a spiral to form a second coil.

2. The semiconductor magnetometer of claim 1 wherein the first conductor has a plurality of first lower coil members that touch the non-conductive structure, and lie in a horizontal plane that lies below and vertically spaced apart from the magnetic core structure.

3. The semiconductor magnetometer of claim 2 wherein the first conductor has a plurality of first upper coil members that touch the non-conductive structure, and lie in a horizontal plane that lies above and vertically spaced apart from the magnetic core structure.

4. The semiconductor magnetometer of claim 3 wherein the second conductor has a plurality of second lower coil members that touch the non-conductive structure, and lie in the horizontal plane that lies below and vertically spaced apart from the magnetic core structure.

5. The semiconductor magnetometer of claim 4 wherein the second conductor has a plurality of second upper coil members that touch the non-conductive structure, and lie in the horizontal plane that lies above and vertically spaced apart from the magnetic core structure.

6. The semiconductor magnetometer of claim 5 wherein the die includes a drive circuit connected to the first conductor that inputs an alternating current to the first coil.

7. The semiconductor magnetometer of claim 6 wherein the magnetic core structure has a rectangular shape with opposing ends.

8. The semiconductor magnetometer of claim 6 wherein the magnetic core structure includes a rectangular shape with opposing ends that each flare outward.

9. The semiconductor magnetometer of claim 6 wherein the magnetic core structure includes a center section with a first width and a pair of end sections connected to opposite sides of the center section, each end section having a second width that is greater than the first width.

10. The semiconductor magnetometer of claim 9 wherein the second coil is only wound around the center section of the magnetic core structure.

11. The semiconductor magnetometer of claim 6 and further comprising a third conductor that touches the non-conductive structure, the third conductor being electrically isolated from the first and second conductors, and wound around the magnetic core structure in a spiral to form a third coil.

12. The semiconductor magnetometer of claim 11 wherein the die further includes a feedback circuit connected to the third conductor that inputs an alternating current to the third coil.

13. The semiconductor magnetometer of claim 6 wherein a side wall space lies between the side wall of the cavity and the side wall of the die, and the first non-conductive structure fills up the side wall space.

14. The semiconductor magnetometer of claim 6 wherein the die includes a sense circuit connected to the second conductor that detects an alternating current induced in the second coil.

15. The semiconductor magnetometer of claim 6 and further comprising a magnetic core member that touches the non-conductive structure, the magnetic core member being spaced apart from the magnetic core structure, the first conductor being wound around the magnetic core member in a spiral to form a third coil, the second conductor being wound around the magnetic core member in a spiral to form a fourth coil.

16. A semiconductor magnetometer comprising:
    a semiconductor structure having a bottom surface, a top surface, a first cavity, and a second cavity, the first and second cavities being spaced apart, and each extending from the top surface down into the semiconductor structure, the first and second cavities each having a side wall surface and a bottom surface, the bottom surface of each cavity lying above and being vertically spaced apart from the bottom surface of the semiconductor structure;
    a first die adhesively attached to the bottom surface of the first cavity, the first die having a plurality of external electrical connection points;
    a second die adhesively attached to the bottom surface of the second cavity, the second die having a plurality of external electrical connection points;
    a non-conductive structure that touches the first die, the second die, and the top surface of the semiconductor structure;
    a magnetic core structure that touches the non-conductive structure;
    a first conductor that touches the non-conductive structure, the first conductor being electrically connected to the first die, and wound around the magnetic core structure in a spiral to form a first coil; and
    a second conductor that touches the non-conductive structure, the second conductor being electrically connected to the second die, electrically isolated from the first conductor, and wound around the magnetic core structure in a spiral to form a second coil.

17. The semiconductor magnetometer of claim 16 wherein the first conductor has a plurality of first lower coil members that touch the non-conductive structure, and lie in a horizontal plane that lies below and vertically spaced apart from the magnetic core structure.

18. The semiconductor magnetometer of claim 17 wherein the first conductor has a plurality of first upper coil members that touch the non-conductive structure, and lie in a horizontal plane that lies above and vertically spaced apart from the magnetic core structure.

19. The semiconductor magnetometer of claim 18 wherein the second conductor has:
    a plurality of second lower coil members that touch the non-conductive structure, and lie in the horizontal plane that lies below and vertically spaced apart from the magnetic core structure; and a plurality of second upper coil members that touch the non-conductive structure, and lie in the horizontal plane that lies above and vertically spaced apart from the magnetic core structure.

20. A method of forming a semiconductor fluxgate magnetometer comprising:

forming a semiconductor structure having a bottom surface, a top surface, and a cavity that extends from the top surface down into the semiconductor structure, the cavity having a side wall surface and a bottom surface, the bottom surface of the cavity lying above and being vertically spaced apart from the bottom surface of the semiconductor structure;

attaching a die to the bottom surface of the cavity, the die having a plurality of external electrical connection points;

forming a non-conductive structure that touches the die and the top surface of the semiconductor structure;

forming a magnetic core structure that touches the non-conductive structure;

forming a first conductor that touches the non-conductive structure, the first conductor being electrically connected to the die, and wound around the magnetic core structure in a spiral to form a first coil; and forming a second conductor that touches the non-conductive structure, the second conductor being electrically isolated from the first conductor, and wound around the magnetic core structure in a spiral to form a second coil.

\* \* \* \* \*